(12) United States Patent
Tarsa et al.

(10) Patent No.: US 10,804,448 B2
(45) Date of Patent: Oct. 13, 2020

(54) HYBRID LENS FOR CONTROLLED LIGHT DISTRIBUTION

(71) Applicant: IDEAL Industries Lighting LLC, Sycamore, IL (US)

(72) Inventors: Eric Tarsa, Goleta, CA (US); Kurt Wilcox, Libertyville, IL (US); Bin Hou, Schaumburg, IL (US); Ted Lowes, Lompoc, CA (US)

(73) Assignee: IDEAL INDUSTRIES LIGHTING LLC, Durham, NC (US)

( * ) Notice: Subject to any disclaimer, the term of this patent is extended or adjusted under 35 U.S.C. 154(b) by 0 days.

(21) Appl. No.: 16/587,771

(22) Filed: Sep. 30, 2019

(65) Prior Publication Data

US 2020/0028042 A1   Jan. 23, 2020

Related U.S. Application Data

(63) Continuation of application No. 15/483,096, filed on Apr. 10, 2017, now Pat. No. 10,468,566.

(51) Int. Cl.
| | |
|---|---|
| *H01L 33/58* | (2010.01) |
| *F21V 7/00* | (2006.01) |
| *F21V 5/04* | (2006.01) |
| *F21V 5/00* | (2018.01) |
| *G02B 19/00* | (2006.01) |

(Continued)

(52) U.S. Cl.
CPC .............. *H01L 33/58* (2013.01); *F21V 5/007* (2013.01); *F21V 5/045* (2013.01); *F21V 7/0091* (2013.01);

(Continued)

(58) Field of Classification Search
CPC ........ F21V 5/007; F21V 5/045; F21V 7/0091; F21Y 2115/10; G02B 19/0028;
(Continued)

(56) References Cited

U.S. PATENT DOCUMENTS

| 7,329,029 B2 * | 2/2008 | Chaves | G02B 3/06 |
| | | | 257/E33.071 |
| 7,922,369 B2 * | 4/2011 | Condon | B60Q 1/32 |
| | | | 313/512 |

(Continued)

FOREIGN PATENT DOCUMENTS

| CN | 203273700 U | 11/2013 |
| CN | 104302973 A | 1/2015 |

(Continued)

*Primary Examiner* — Tsion Tumebo
(74) *Attorney, Agent, or Firm* — Coats & Bennett, PLLC

(57) ABSTRACT

A lens for distribution of light from a light emitter having an emitter axis. The lens comprising an inner surface and an output surface with faceted and smooth outer regions. At least one of the faceted outer regions is formed by a plurality of pairs of transverse outer regions extending in direction of a plane of bilateral symmetry of the lens. The inner surface defines an inner cavity about the emitter axis and has inner-surface stepwise discontinuities formed by a plurality of pairs of transverse inner regions with intersection regions therebetween. The lens may also have at least two secondary surface portions spaced apart and extending along two sides of the inner surface, the secondary surface portions being configured for total internal reflection (TIR) of light received from the inner surface.

20 Claims, 70 Drawing Sheets

(51) Int. Cl.
*H01L 25/075* (2006.01)
*F21Y 115/10* (2016.01)

(52) U.S. Cl.
CPC ..... *G02B 19/0028* (2013.01); *G02B 19/0061* (2013.01); *G02B 19/0066* (2013.01); *G02B 19/0071* (2013.01); *F21Y 2115/10* (2016.08); *H01L 25/0753* (2013.01)

(58) Field of Classification Search
CPC ............ G02B 19/0061; G02B 19/0066; G02B 19/0071; H01L 25/0753; H01L 33/58
See application file for complete search history.

(56) References Cited

U.S. PATENT DOCUMENTS

| | | | |
|---|---|---|---|
| 9,689,554 B1* | 6/2017 | Householder | G02B 17/00 |
| 2006/0007692 A1* | 1/2006 | Hsien | F21V 5/00 |
| | | | 362/382 |
| 2008/0130309 A1* | 6/2008 | Condon | B60Q 1/34 |
| | | | 362/520 |
| 2009/0067179 A1* | 3/2009 | Chaves | F21K 9/61 |
| | | | 362/329 |
| 2009/0086498 A1* | 4/2009 | Condon | B60Q 1/32 |
| | | | 362/477 |
| 2012/0287649 A1* | 11/2012 | Kelley | F21V 5/002 |
| | | | 362/335 |
| 2015/0078011 A1* | 3/2015 | Sy | F21V 13/04 |
| | | | 362/327 |
| 2015/0131281 A1* | 5/2015 | Romeu | F21V 5/007 |
| | | | 362/237 |

FOREIGN PATENT DOCUMENTS

| | | |
|---|---|---|
| CN | 204901663 U | 12/2015 |
| DE | 19728354 A1 | 1/1999 |
| WO | 2013169643 A1 | 11/2013 |

* cited by examiner

FIG. 19

HYBRID LENS FOR CONTROLLED LIGHT DISTRIBUTION

RELATED APPLICATION

This application is a continuation of patent application Ser. No. 15/483,096, filed Apr. 10, 2017, the entire contents of which are incorporated herein by reference.

FIELD OF THE INVENTION

This invention relates to lighting fixtures and, more particularly, to LED lighting fixtures for various common illumination purposes. Still more specifically, this invention relates to the field of lensing for desired LED light distribution in LED lighting fixtures.

BACKGROUND OF THE INVENTION

In recent years, the use of light-emitting diodes (LEDs) for various common lighting purposes has increased, and this trend has accelerated as advances have been made in LEDs and in LED-array bearing devices, referred to as "LED modules." Indeed, lighting needs which have primarily been served by fixtures using high-intensity discharge (HID) lamps, halogen lamps, compact florescent light and other light sources are now increasingly beginning to be served by LEDs. Creative work continues in the field of LED development, and also in the field of effectively utilizing as much of the light emitted from LEDs as possible.

As is known, LED "packages," which typically consist of an LED component (or a cluster of LEDs) on a base with or without a "primary lens," each have a lens thereover to direct light from the LED package as intended. (Such lens is sometimes referred to as a "secondary" lens when the package with which it is used includes a primary lens.) Development efforts have been made in the field of such lenses, with the intention being to redirect some of the LED-emitted light in a manner forming illumination patterns desired for particular applications. However, such lenses have tended to fall short of the most desirable performance in that some LED-emitted light is lost or produces illuminance distributions which lack desired characteristics such as color and/or intensity uniformity.

Typically, some of the light from LEDs is emitted at angles that cause LED-lighting fixtures to provide less than desirable and less than fully efficient illumination patterns. Some prior lenses have been configured to prevent undesirable light from exiting the lens and others to block such light immediately upon its exiting the lens. Even though these configurations were deemed necessary to achieve desired illumination patterns and to prevent so-called lighting "trespass," they tended to result in lost light and decreased efficiency of LED illuminators. It would be highly desirable to improve efficiency in the use of light emitted by LEDs in lighting fixtures.

A typical LED emits light over a wide range of angles such that light from the LED reaches a particular area of the output surface of the lens at somewhat different angles. This has made it very difficult to control direction of such light. It would be desirable to provide improved control of the direction of light exiting such lenses.

Trespass lighting can be evaluated by more than just the amount of light emitted in an undesired direction; also to be considered is how far from the desired direction such light is directed. It would be highly beneficial to provide a lighting apparatus which produces a desired illumination pattern with a maximum amount of light emitted toward the space intended to be illuminated, in typical commercial applications.

Lighting fixtures, such as sidewalk, roadway and/or parking lot fixtures, often provide high angle lighting distributions for meeting various areal lighting requirements. Lighting fixtures, for example, can provide a Type II distribution suitable for walkways, highway on-ramps and off-ramps as well as other long and narrow corridors. In other embodiments, lighting fixtures can provide a Type III distribution generally employed for roadway lighting and parking lots where a larger area of lighting is required. Alternatively, a Type V lighting distribution can be provided. Type V lighting distribution can be circular or square, having isotropic intensity over all lateral angles.

Achieving high angle lighting distributions with acceptable uniformity and limited glare can be difficult. High angle lighting distributions often contain severe bright spots that only exacerbate visual discomfort resulting from fixture glare. Moreover, point sources of high intensity, such as light emitting diodes (LEDs), can provide multiple bright spots over the light emitting face of a fixture. Various optics have been employed to improve luminous uniformity and glare reduction. However, such optics struggle with effectively mixing and spreading light from intense point sources over high distribution angles.

SUMMARY OF THE INVENTION

This invention is a lens with improved efficiency of distribution of light from a light emitter having an emitter axis and defining an emitter plane. Such improved efficiency of light output from the light emitter is achieved with the inventive lens which is specifically designed for refraction, reflection and useful output of light emitted in directions of the desired illumination. In certain embodiments, the inventive lens directs the great majority of light from the emitter in a preferential-side direction, including light emitted at angles which previously resulted in the loss of such light. Such efficiency of light use is provided only by configuration of the lens.

In certain embodiments, the lens has a faceted output region, a smooth output surface and at least one reflective surface which reflects light through total-internal-reflection (TIR) toward the faceted output region. The faceted output region is formed by pairs of transverse surfaces, each surface of which redirects the received light to provide a composite illuminance pattern.

The lens may further have faceted input surfaces at least partially defining a light-input cavity about the emitter axis. The faceted input region is formed by pairs of transverse surfaces, each surface of which redirects the received light. The faceted input surfaces may include surface portions reflecting light through total-internal-reflection (TIR).

In some embodiments, the at least one reflective surface at least partially bounds a reflection cavity offset from the light-input cavity.

The faceted output surfaces may include major and minor surfaces. The minor surfaces may be formed by transverse surface portions with cross-sectional dimensions smaller than cross-sectional dimensions of transverse surface portions of the major surfaces.

The transverse surface portions of the faceted output surfaces may extend to substantially straight intersection regions substantially parallel to each other. The transverse surface portions may extend to substantially curved intersection regions substantially parallel to each other.

The inventive lens includes inner and outer surfaces. The inner surface defines an inner cavity about the emitter axis. The inner surface may have the faceted input surfaces being a plurality of transverse inner regions forming inner stepwise discontinuities redirecting light received from the emitter. The outer surface receives redirected emitter light and has the faceted output region of a plurality of transverse outer regions forming outer stepwise surface discontinuities redirecting the received light.

In certain embodiments of the inventive lens at least one of the inner and outer surfaces comprises a combination of at least one smooth region and a plurality of transverse regions forming stepwise discontinuities for redirecting received light. In some of such embodiments, the outer surface includes the smooth outer region. The transverse regions forming stepwise discontinuities of the inner surface may be configured to redirect emitter light toward the smooth outer region.

At least some of the transverse regions forming stepwise discontinuities may be configured for refraction of the received light. At least some of the transverse regions forming stepwise discontinuities may also be configured for total internal reflection (TIR) of the received light.

Certain embodiments of the lens have a secondary surface offset from the inner surface. The secondary surface may be configured for total internal reflection (TIR) of light received from the inner surface. In some embodiments, the secondary surface at least partially bounds a secondary cavity offset from the inner cavity.

In certain alternative embodiments, the secondary surface may be part of an exterior surface at least partially surrounding the inner cavity. In some of such alternative embodiments the secondary surface is radially offset from the inner cavity and extends from near the emitter plane away in directions along the emitter axis and sometimes away from the emitter axis. In certain examples of these embodiments of the lens with a surrounding flange, the flange may extend from such exterior secondary surface.

The secondary surface may have a plurality of transverse reflecting regions forming reflecting stepwise discontinuities.

In each of the inner, outer and reflecting stepwise discontinuities, corresponding adjacent transverse regions may extend to intersection regions which are substantially parallel to adjacent intersection regions.

It should be noted that the term "reflective" is used for convenience in describing the transverse regions forming stepwise discontinuities of the secondary surface. In certain examples, some of such transverse regions may be refractive such that at least a portion of the secondary surface passes light through such regions.

In some embodiments, the transverse reflecting regions may be substantially planar surfaces or have convex/concave cross-sections. Adjacent transverse reflecting regions may extend to an intersection region which may be a curved line or cross-sectionally concave/convex surface portion. The intersection regions may be longitudinally straight or extend along a curve. Adjacent intersection regions may be substantially parallel to each other. In addition or alternatively, adjacent intersection regions may extend in a direction away from the emitter plane. In some examples, such adjacent intersection regions may also extend away from the emitter axis.

A longitudinal direction of at least some of the transverse reflecting regions may be parallel to a plane of bilateral symmetry of the lens.

It should be appreciated that lenses according to the present invention may have symmetries other than bilateral such as a rotation symmetry, a quad-lateral or other symmetries that achieve desired illumination pattern. Depending on the intended illumination pattern, the inventive lens may be shaped without symmetry and have asymmetrical surfaces.

In certain embodiments, at least some of the outer stepwise discontinuities are optically aligned over the secondary surface such that light reflected by the secondary surface is received and further redirected by the outer stepwise discontinuities.

In at least one of the inner and outer stepwise discontinuities, corresponding adjacent transverse regions extend to intersection regions therebetween. The intersection regions of the inner stepwise discontinuities may be curved regions each adjoining a pair of the transverse inner regions adjacent to each other. The curved merger region can be convex or concave. The transverse regions of the inner and/or outer surfaces may be substantially planar surfaces or have convex/concave cross-sections. Adjacent intersection regions may be substantially parallel to each other. The intersection regions may be straight or curved lines or have convex or concave cross-sections and be longitudinally straight or extend along a curve. The intersection regions may be in planes substantially orthogonal or parallel to the emitter axis. Additionally or alternatively, longitudinal directions of the intersection regions may be substantially orthogonal or parallel to a plane of bilateral symmetry of the lens.

Some of the transverse outer regions may slope at different angles. In a pair of adjacent transverse outer regions, at least one of the pair refracts the received light.

At least some of the transverse inner regions may be configured for total internal reflection (TIR) of the light received from the emitter. In addition or alternatively, at least some of the transverse inner regions refract the light received from the emitter.

In certain embodiments, at least some of the transverse inner regions are non-planar. In some of such embodiments the transverse inner regions proximal to the emitter axis have substantially concave cross-sections in planes substantially orthogonal to the plane of bilateral symmetry of the lens.

Some of the transverse inner regions may longitudinally extend along an arc at least partially surrounding the emitter axis. Some or all of such transverse inner regions may have convex/concave cross-sections. Some of the adjacent transverse inner regions may extend to an intersection region that may have a concave/convex cross-section.

The inner surface may have a smooth inner region adjacent the inner stepwise discontinuities.

In certain embodiments, the transverse inner regions proximal the emitter axis have smaller cross-sectional dimensions than the transverse inner regions distal from the light emitter.

The inner surface may have at least two sets of transverse inner regions which form a corresponding number of distinct sets of the inner stepwise discontinuities.

The outer surface may include a smooth outer region. In some of such embodiments which also have the inner surface with a plurality of distinct sets of the inner stepwise discontinuities, at least one of the distinct sets of the inner stepwise discontinuities redirects emitter light toward the smooth outer region.

Some embodiments of the inventive lens include at least two secondary surface portions each outwardly offset from the inner surface. At least one of such secondary surface portions may be configured for total internal reflection (TIR) of light received from the inner surface.

In certain embodiments, the secondary surface portions are separate surfaces substantially opposite each other. Additionally or alternatively, the secondary surface portions may be connected at corners. In some examples, the inventive lens may have three and more secondary surface portions. In some of such examples, the secondary surface portions are connected at corners and form polygonal shapes corresponding to the number of the secondary surface portions. In some alternative examples, at least some of the plurality of the secondary surface portions are separate from the adjacent secondary surface portions. In some other examples, there may be a combination of the separate and connected secondary surface portions. Yet in some alternative examples, the secondary surface portions may form a substantially annular secondary surface around the inner cavity. Additionally or alternatively, such substantially annular secondary surface may be continuous or have interruptions.

In some of such embodiments, the outer surface comprises outer stepwise discontinuities corresponding to each of the secondary surface portions for receiving and further redirecting light received from the corresponding secondary surface portion.

At least one of the secondary surface portions comprises a plurality of transverse reflecting regions forming reflecting stepwise discontinuities.

In certain embodiments, the outer surface comprises at least two sets of transverse outer regions forming a corresponding number of distinct outer stepwise discontinuities. At least one of such distinct outer stepwise discontinuities is outward of the other for receiving light reflected or otherwise redirected by corresponding regions of the corresponding secondary surface.

In some of such embodiments, at least two of the distinct outer stepwise discontinuities are optically aligned over each of the secondary surface portions.

The sets of outer stepwise discontinuities formed by transverse outer regions may be substantially planar surfaces and may also extend to intersection regions that may be straight or curved lines or be surface portions cross-sectionally planar or convex/concave. Some or all of the intersection regions may be substantially parallel to each other. Some or all of the intersection regions may be generally in planes substantially orthogonal or parallel to the emitter axis. Such general planes of the intersection regions of the outer stepwise discontinuities may be orthogonal or parallel to a plane of bilateral symmetry of the lens.

The outwardmost of the sets of the outer stepwise discontinuities may be formed by transverse outer regions with smaller cross-sectional dimensions in axially-parallel planes than cross-sectional dimensions of the transverse outer regions of the other set(s) of the outer stepwise discontinuities which is/are closer to the emitter axis than the outwardmost set of the outer stepwise discontinuities. In some embodiments, the outwardmost set(s) of the outer stepwise discontinuities may be formed by a greater number of transverse outer regions.

In another aspect of this invention, the lens(es) according to this invention is optically coupled to an LED light source of an LED arrangement supported by an LED light fixture. In certain examples, the LED light fixture has a heat-sink structure having a mounting surface supporting the LED arrangement. The LED arrangement may include a plurality of spaced apart LED light sources and a plurality of the lenses each optically coupled with a corresponding one of the light sources.

BRIEF DESCRIPTION OF THE DRAWINGS

Figure 19:
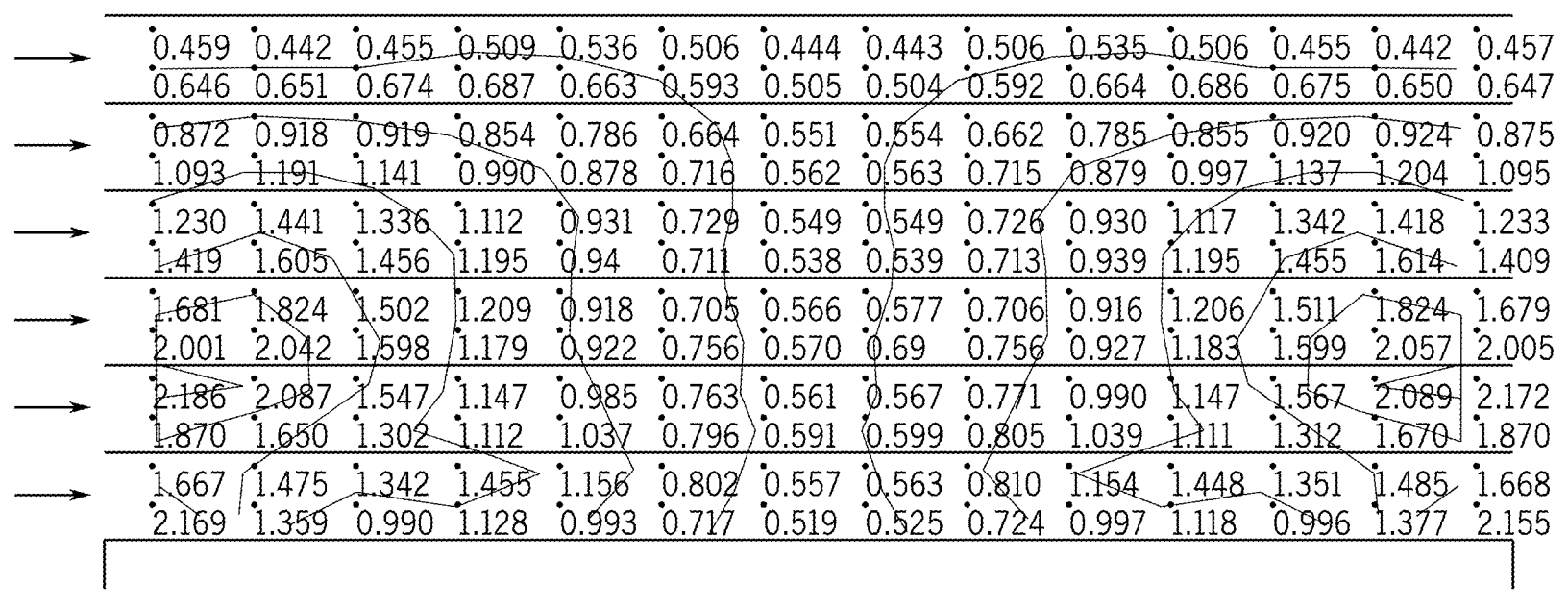

FIG. 19 is an exemplary representation of a simulated light distribution pattern achieved on an exemplary working plane with luminaries utilizing the lens of FIG. 1.

DETAILED DESCRIPTION OF PREFERRED EMBODIMENTS

Figure 1:
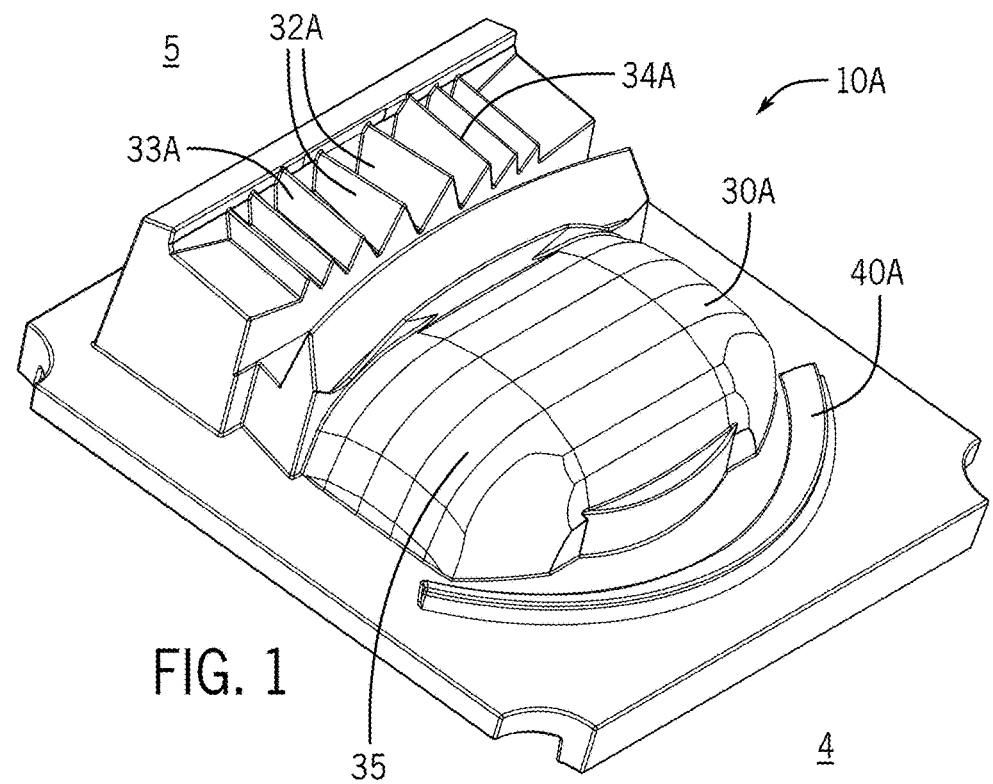
FIG. 1 is an enlarged opaque perspective view from a light-output side of one embodiment of the inventive lens.
Figure 2:
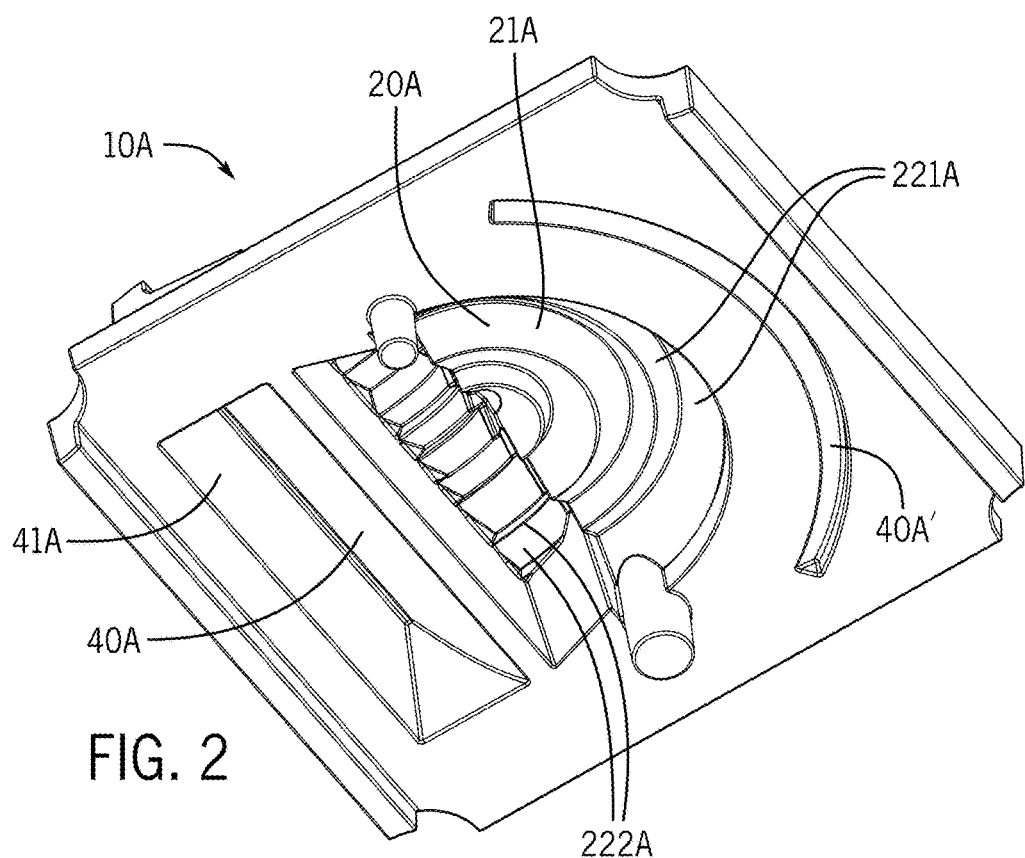
FIG. 2 is an enlarged opaque perspective view from a light-input side of the lens of FIG. 1.
Figure 3:
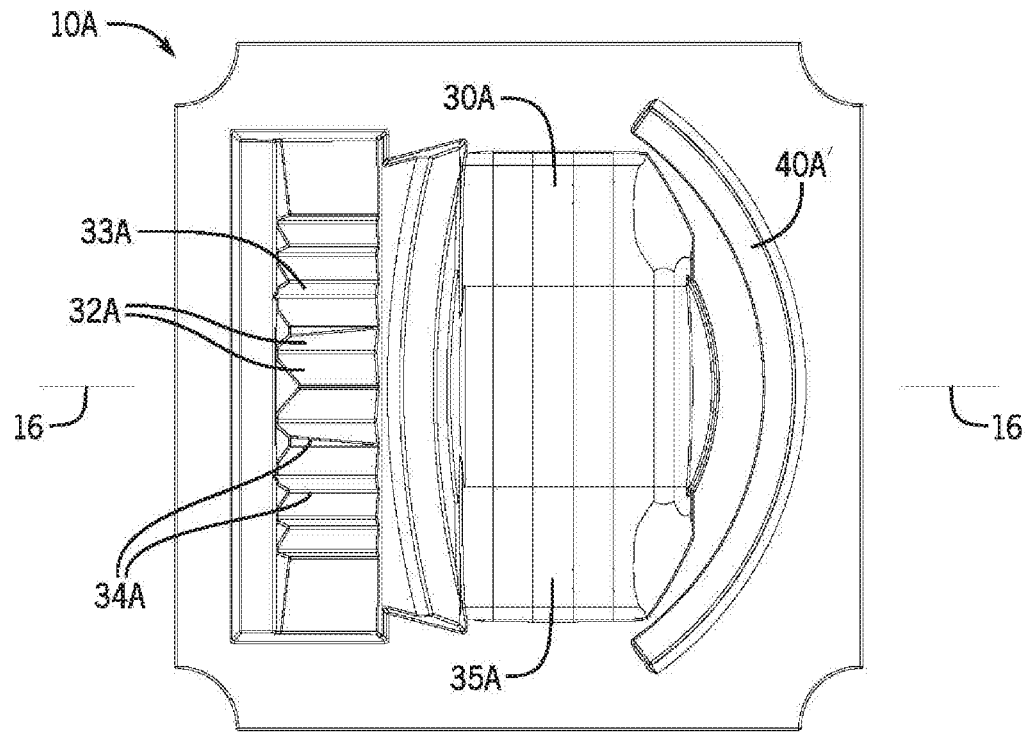
FIG. 3 is an enlarged opaque light-output plan view of the lens of FIG. 1.
Figure 4:
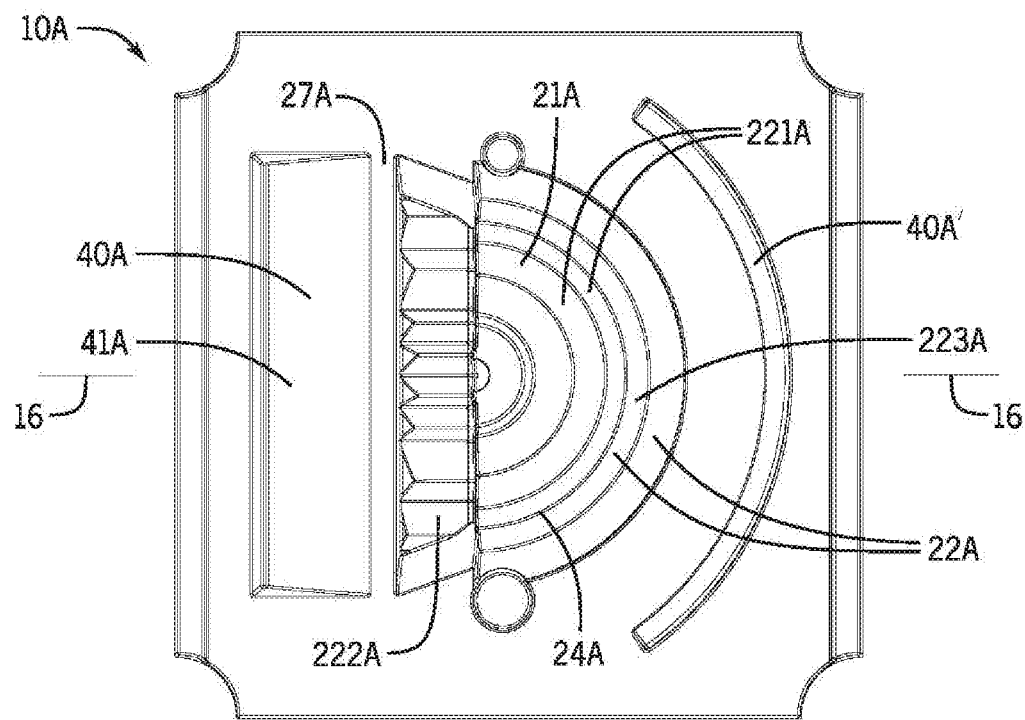
FIG. 4 is an enlarged opaque light-input plan view of the lens of FIG. 1.

FIGS. 1-23 and 42-97 illustrate embodiments of lens 10 according to the present invention. Lens 10 has an improved efficiency of distribution of light from a light emitter 12 having an emitter axis 14 and defining an emitter plane 15.

In embodiments shown in FIGS. 1-23 and 42-65, lenses 10A, 10B, 10C and 10D direct the great majority of light from emitter 12 in a preferential-side direction 4, including light emitted at angles which previously resulted in the loss of such light.

Lens 10 includes an inner surface 20 and an outer surface 30. Inner surface 20 extends from emitter plane 15 and defines an inner cavity 21 about emitter axis 14. Inner surface 20 has a plurality of transverse inner regions 22 forming inner stepwise discontinuities 23 redirecting light received from emitter 12.

Outer surface 30 receives redirected emitter light and has a plurality of transverse outer regions 32 forming outer stepwise discontinuities 33 redirecting the received light. In illustrated embodiments, lens 10 has a secondary surface 40 offset from inner surface 20. As best seen in FIGS. 12, 45, 73, 80, 83 and 85, secondary surface 40 is configured for total internal reflection (TIR) of light received from the inner surface 20.

Figure 5:
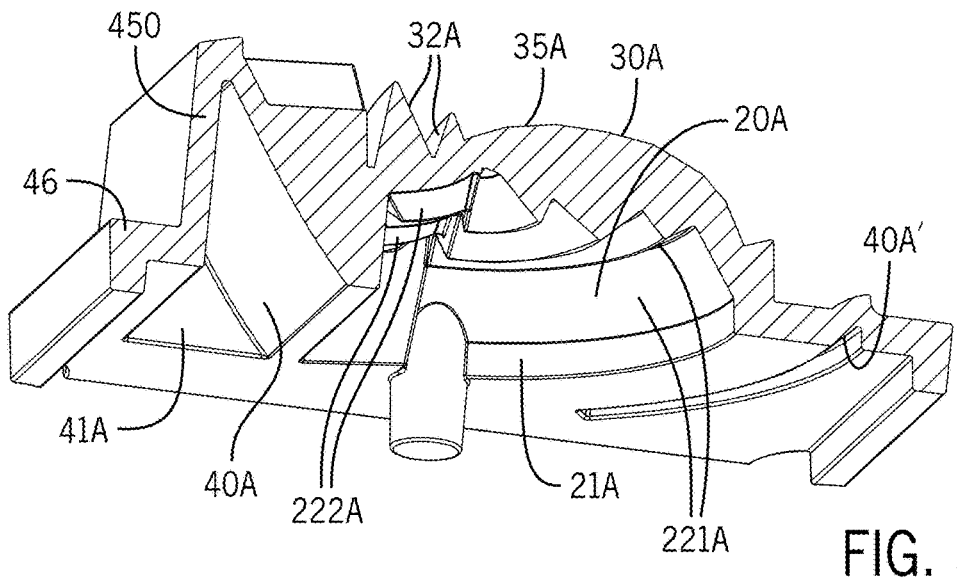
FIG. 5 is an enlarged opaque perspective cross-sectional view from a light-input side of the lens of FIG. 1, taken along a plane of bilateral symmetry of the lens.
Figure 6:
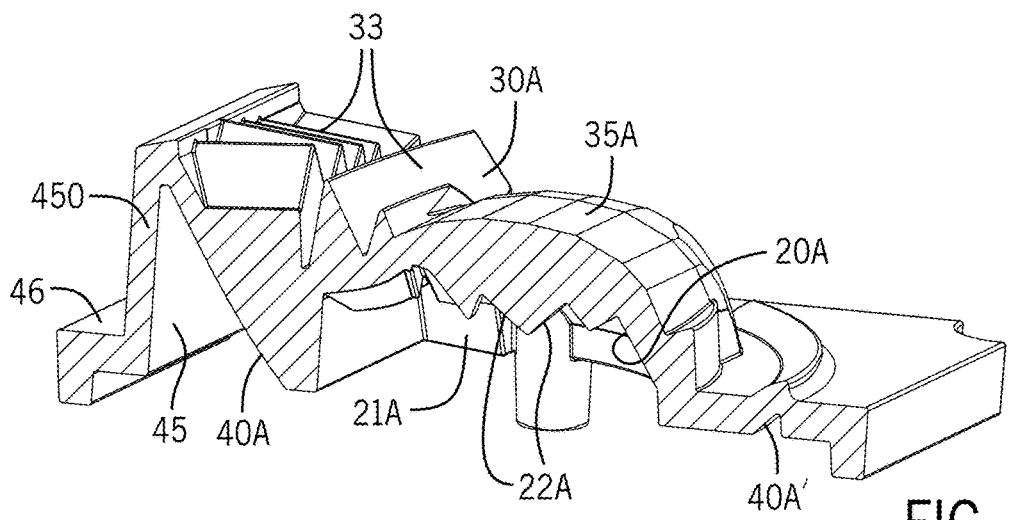
FIG. 6 is an enlarged opaque perspective cross-sectional view generally from a light-output side of the lens of FIG. 1, taken along a plane of bilateral symmetry of the lens.
Figure 7:
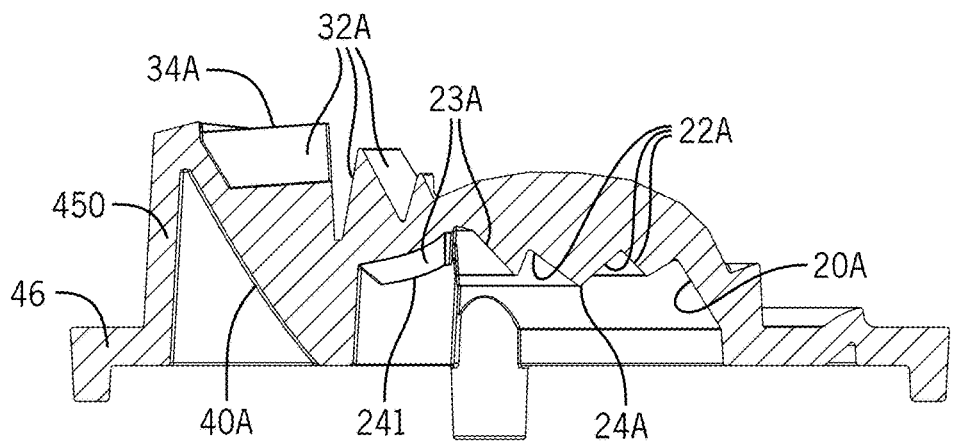
FIG. 7 is an enlarged opaque cross-sectional view of the lens of FIG. 1, shown in the plane of bilateral symmetry of the lens.
Figure 8:
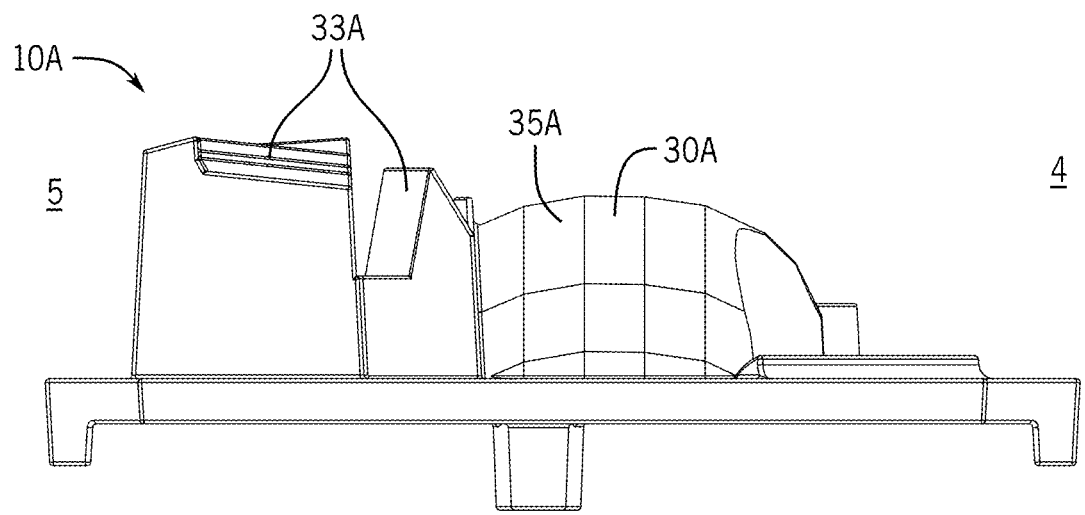
FIGS. 8 and 9 are enlarged opaque views of opposite lateral sides of the lens of FIG. 1.
Figure 9:
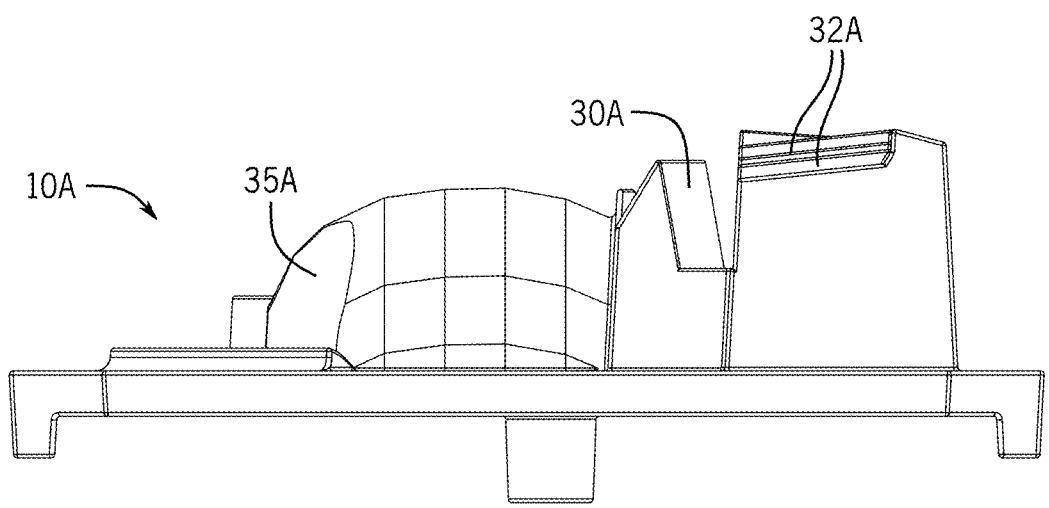
Figure 10:
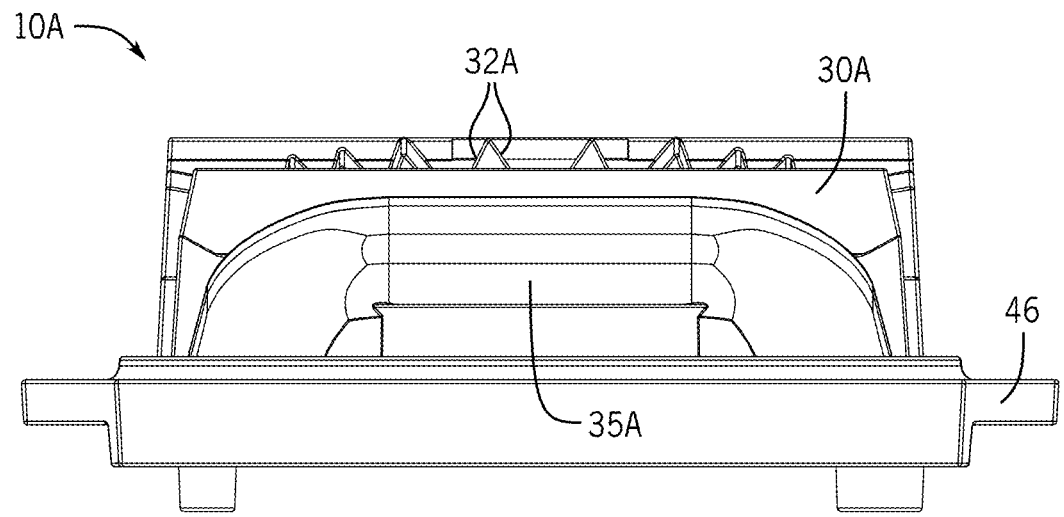
FIG. 10 is an enlarged opaque front (preferential side) view of the lens of FIG. 1.
Figure 11:
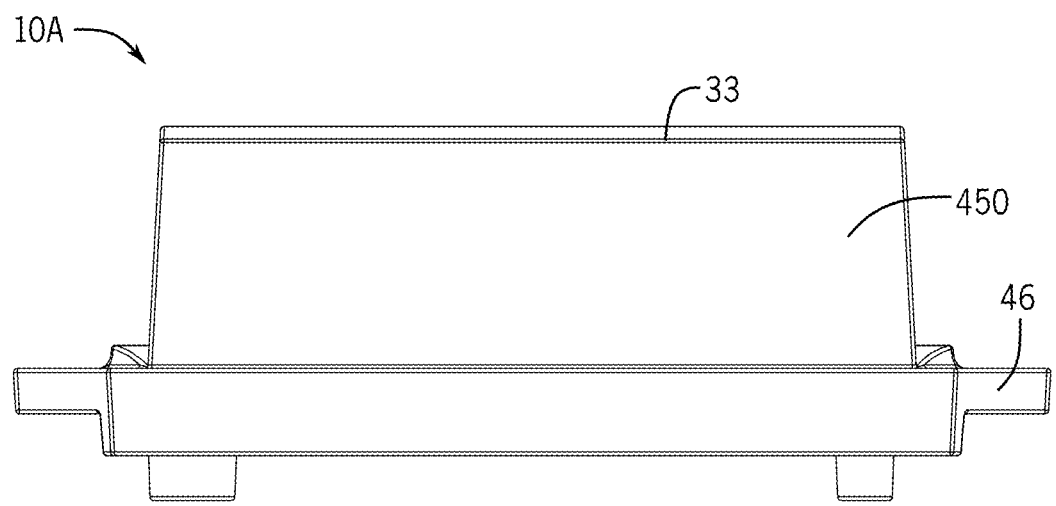
FIG. 11 is an enlarged opaque back (non-preferential side 5) view of the lens of FIG. 1.

In some of the illustrated embodiments of lens 10, secondary surface 40 at least partially bounds a secondary cavity 41 offset from inner cavity 21. FIGS. 5-7 illustrate secondary cavity 41A being further bound by a rear surface 45 of a rear wall 450 with a flange 46 extending outwardly therefrom for securing lens 10A with respect to light emitter 12.

In lens 10C illustrated in FIGS. 47-58, secondary surface 40C has a plurality of transverse reflecting regions 42 forming reflecting stepwise discontinuities 43. The primary purpose of such TIR features is to redirect high-angle light from the light source 12 to a more vertical direction (e.g., closer to parallel to the optic axis 14 or source surface-normal). This "upward" light may be redirected or spread into a lateral direction (e.g., parallel to the roadway) by adding facets to the adjacent surface such as outer stepwise discontinuities 33 above the TIR reflector, or by adding facets to the TIR surface itself (reflecting stepwise discontinuities 43), or any combination thereof.

"Faceted," "step-like" or "Fresnel-like" surfaces, as used herein, refer to surface regions formed by a plurality of planar or curved surface portions each extending along a plane or a curve, respectively, which intersects with a plane or a curve of an adjacent planar or curved surface portion. Some of the adjacent planes or curves intersect with unequal slopes. As described further in this section, certain embodiments include curved merger regions between adjacent planar or curved surface portions. Such curved merger regions serve to smooth intersections between adjacent surface portions.

Figure 48:
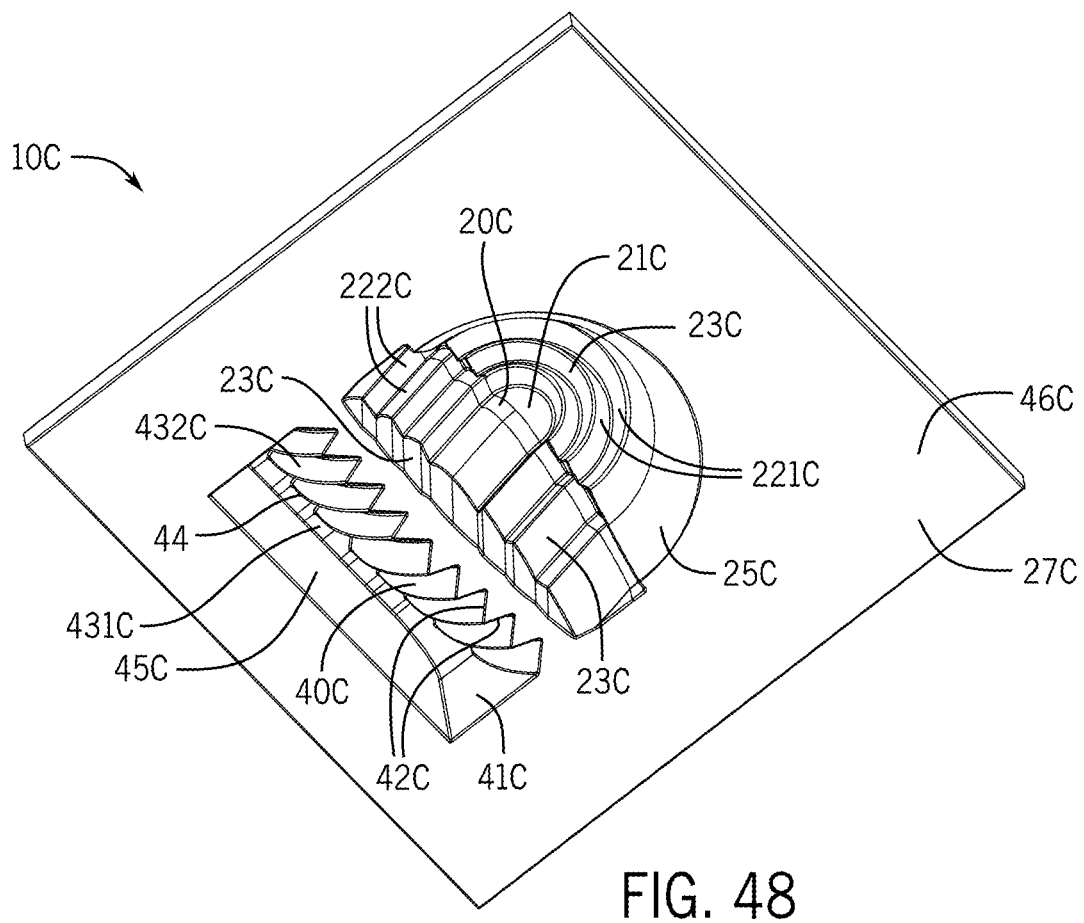
FIG. 48 is an enlarged opaque perspective view from a light-input side of the lens of FIG. 47.
Figure 49:
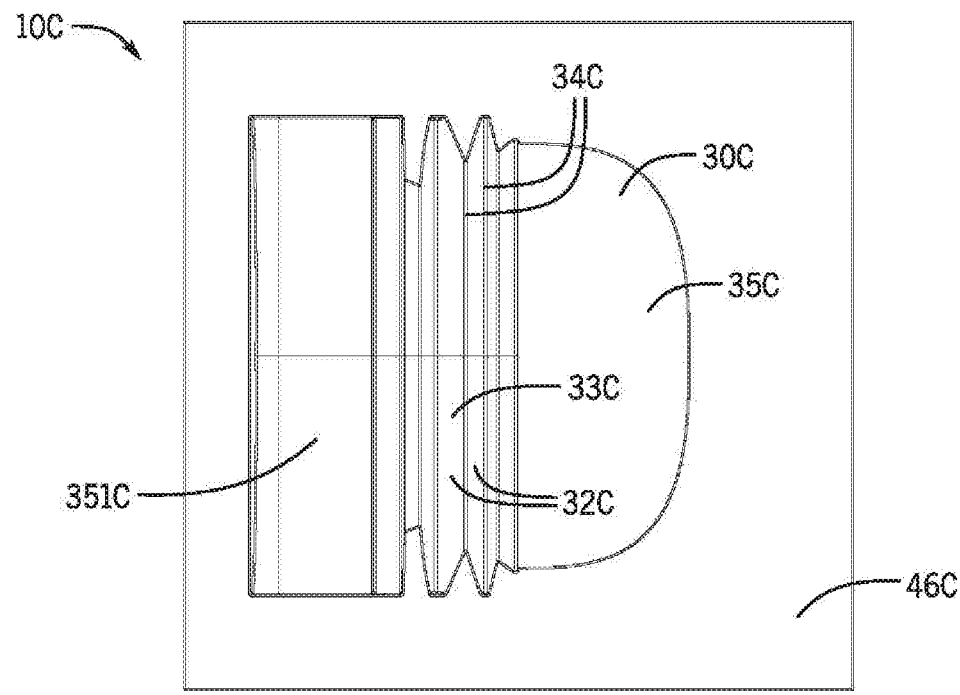
FIG. 49 is an enlarged opaque light-output plan view of the lens of FIG. 47.
Figure 50:
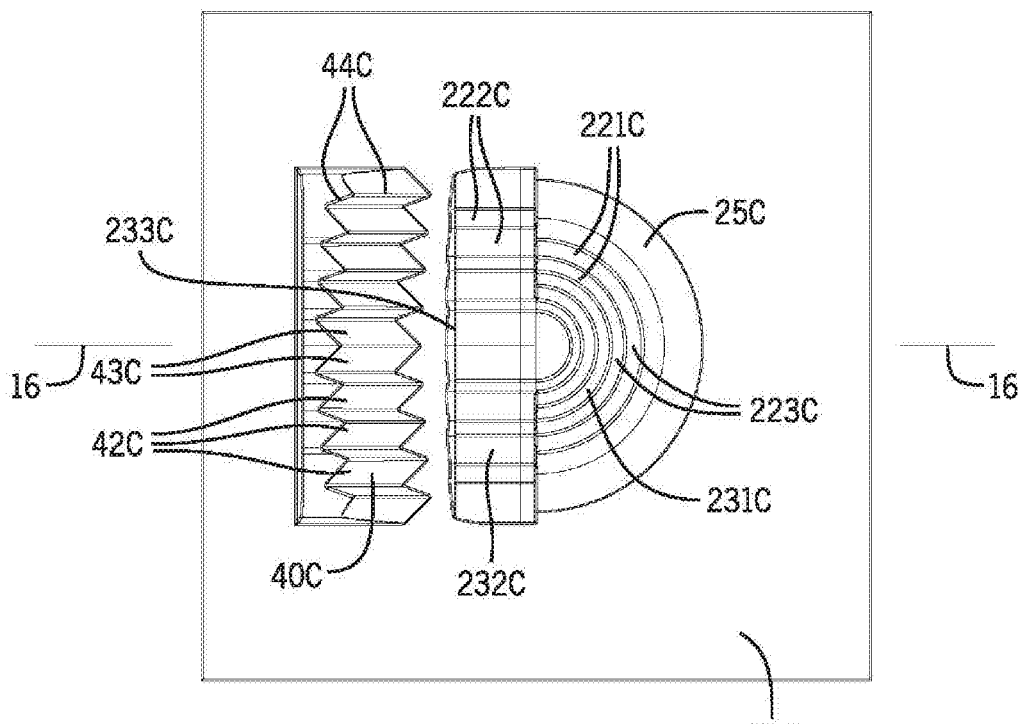
FIG. 50 is an enlarged opaque light-input plan view of the lens of FIG. 47.

FIGS. 48 and 50 show lens 10C having a third stepwise discontinuity 233C rearwardly bounding inner cavity 21C and extending from emitter-adjacent surface 27C away from emitter plane 15 toward transverse inner regions 222C.

FIGS. 3, 4, 42, 49, 50, 68 and 69 show that in inner stepwise discontinuities 23, in outer stepwise discontinuities 33 and in reflecting stepwise discontinuities 43 pairs of adjacent transverse regions extend to corresponding inner intersection regions 24, outer intersection regions 34 and reflective intersection regions 44 which are substantially parallel to adjacent intersection regions 24, 34, 44.

Figure 51:
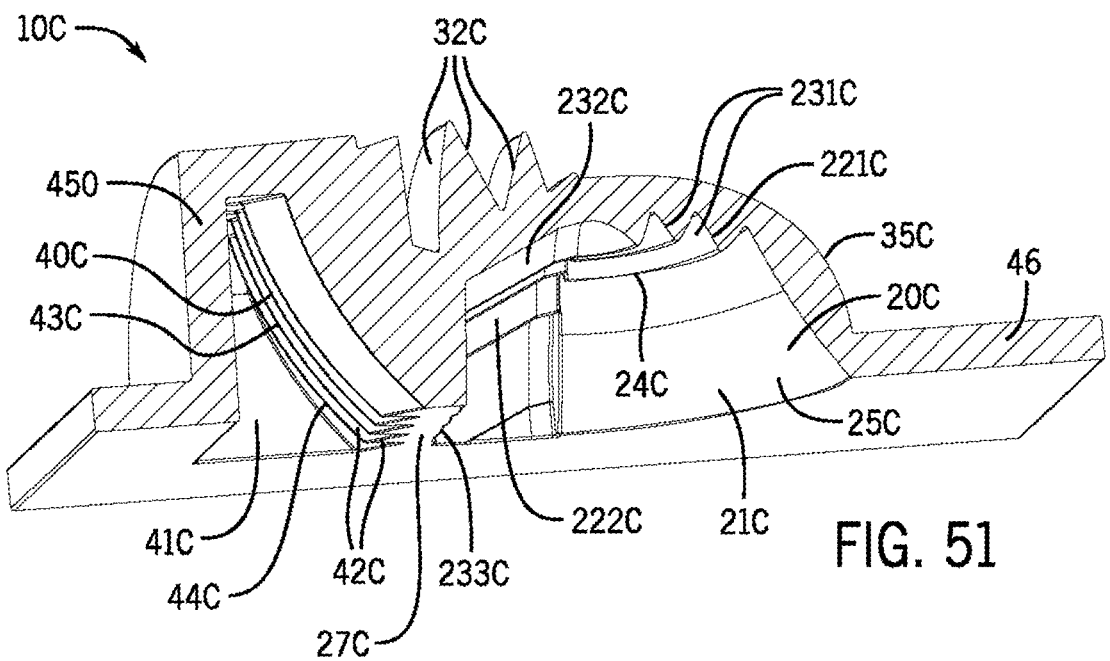
FIG. 51 is an enlarged opaque perspective cross-sectional view from a light-input side of the lens of FIG. 47, taken along a plane of bilateral symmetry of the lens.
Figure 52:
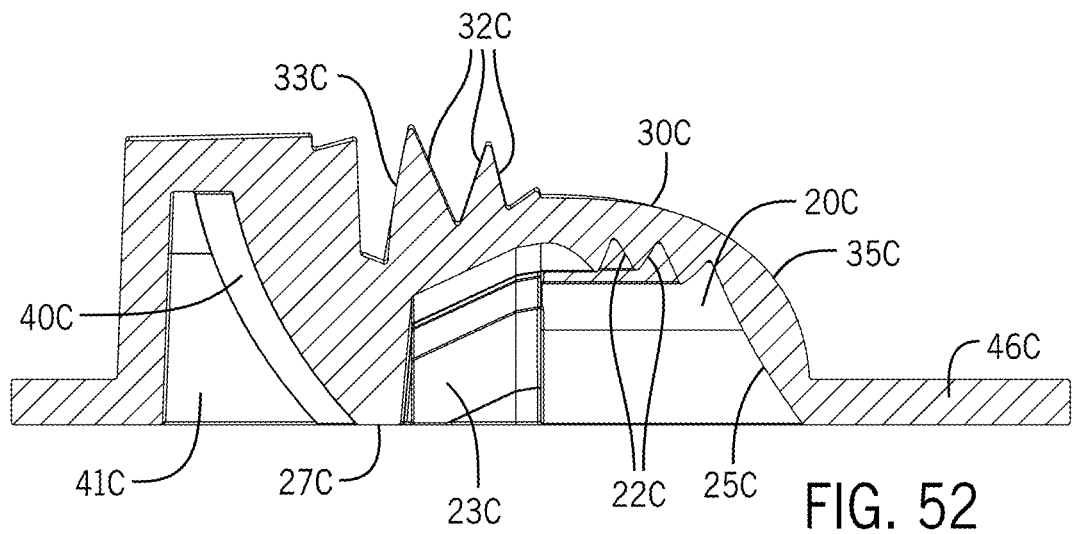
FIG. 52 is an enlarged opaque cross-sectional view of the lens of FIG. 47, shown in the plane of bilateral symmetry of the lens.
Figure 53:
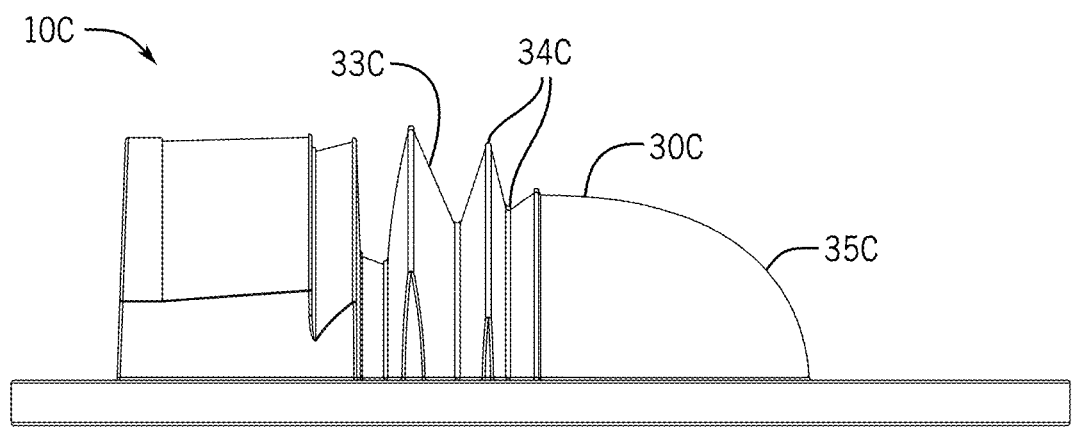
FIGS. 53 and 54 are enlarged opaque views of opposite lateral sides of the lens of FIG. 47.
Figure 54:
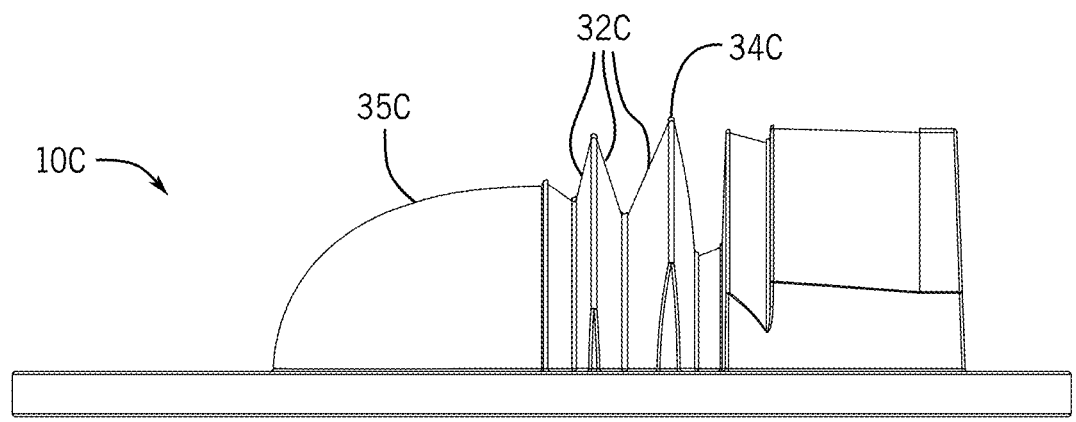
Figure 55:
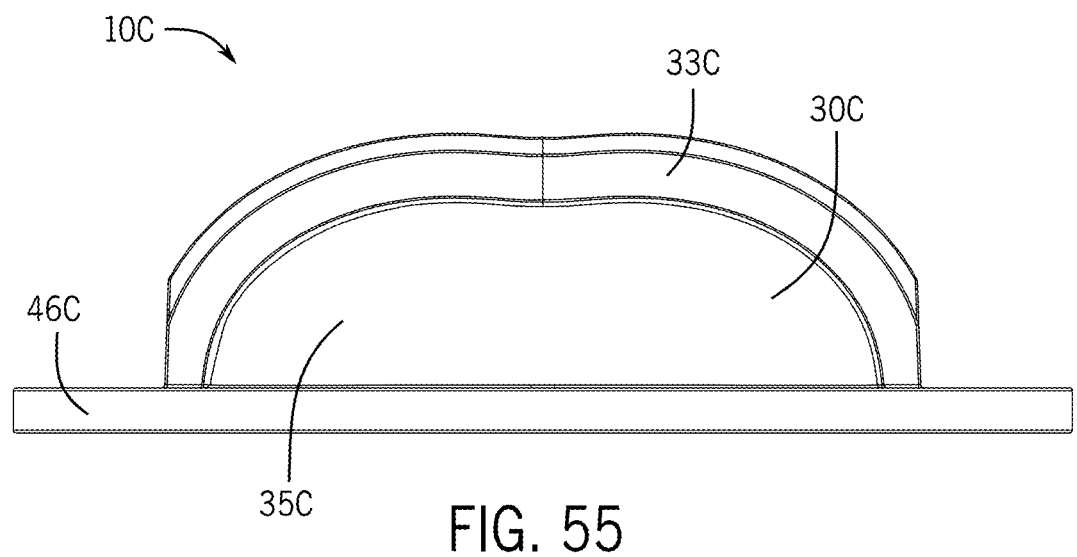
FIG. 55 is an enlarged opaque front (preferential side) view of the lens of FIG. 47.
Figure 56:
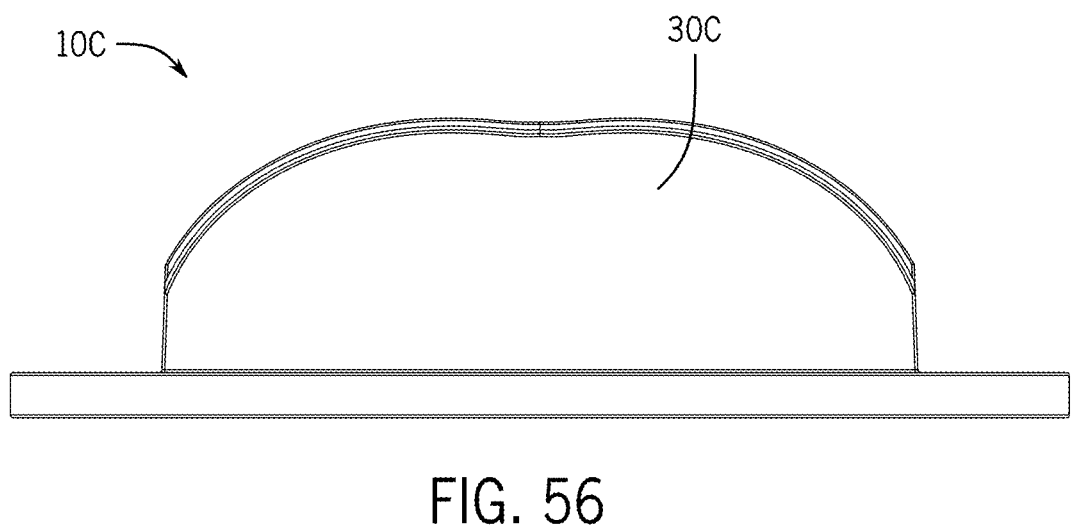
FIG. 56 is an enlarged opaque back (non-preferential side 5) view of the lens of FIG. 47.
Figure 57:
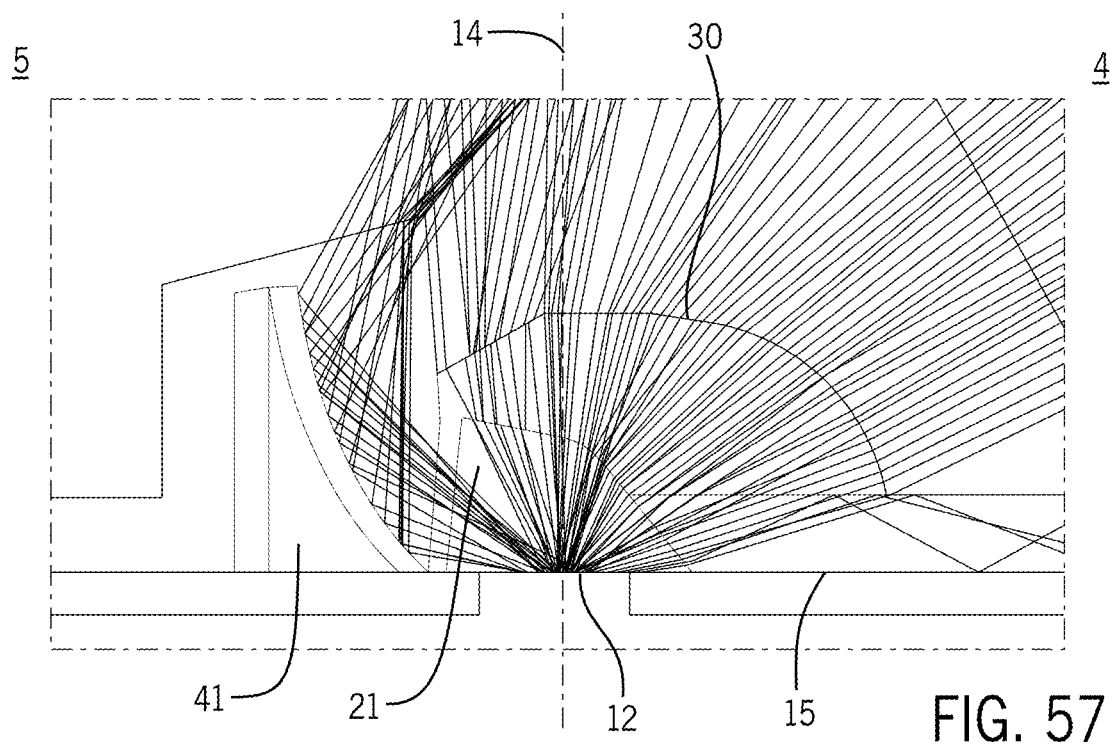
FIG. 57 is an enlarged simplified representation with ray-fan simulation showing light distribution achieved primarily in the plane of bilateral symmetry of the lens with a lens having some characteristics of input and output surfaces of the lens of FIG. 47.
Figure 58:
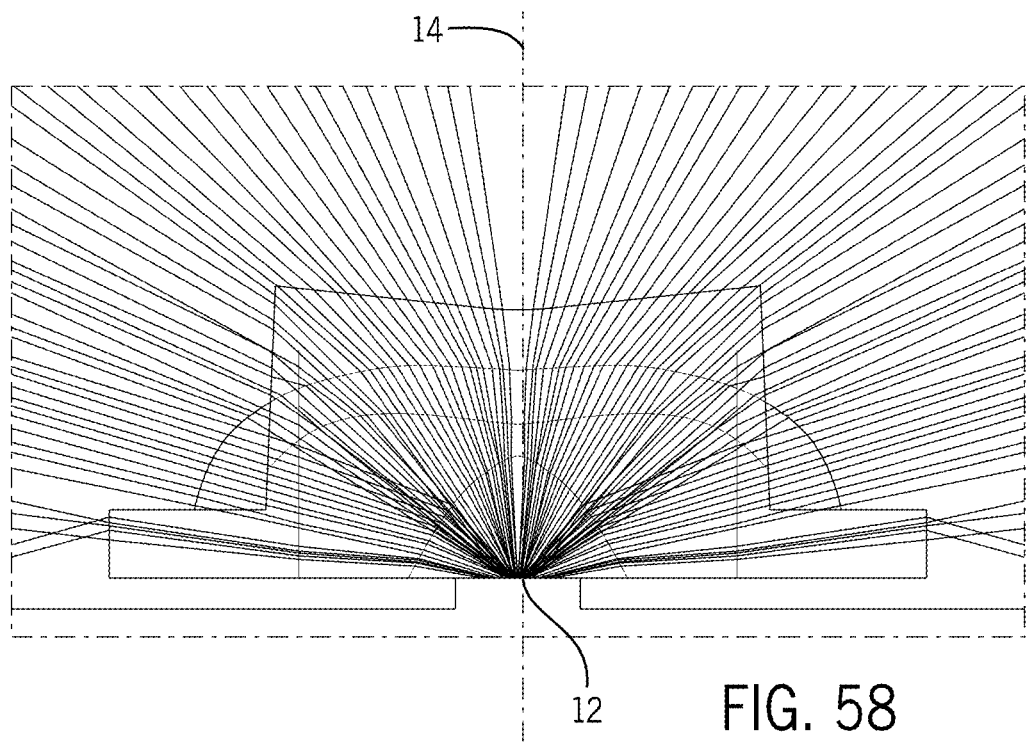
FIG. 58 is an enlarged simplified representation with ray-fan simulation showing light distribution achieved in planes orthogonal to the plane of bilateral symmetry of the lens with the lens of FIG. 57.
Figure 59:
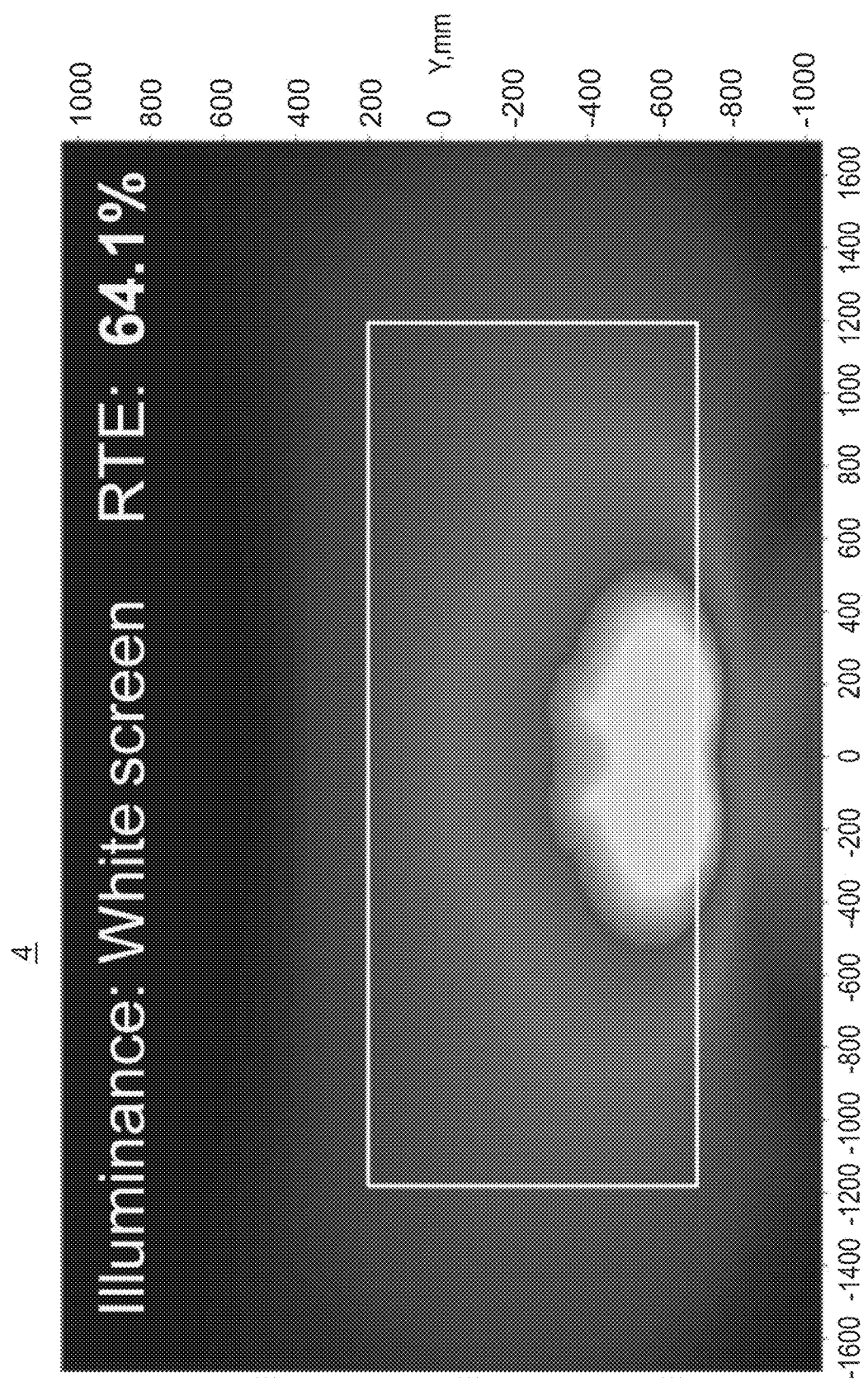
FIGS. 59-61 are exemplary representations of simulated illuminance achieved with the lens of FIG. 47.
Figure 60:
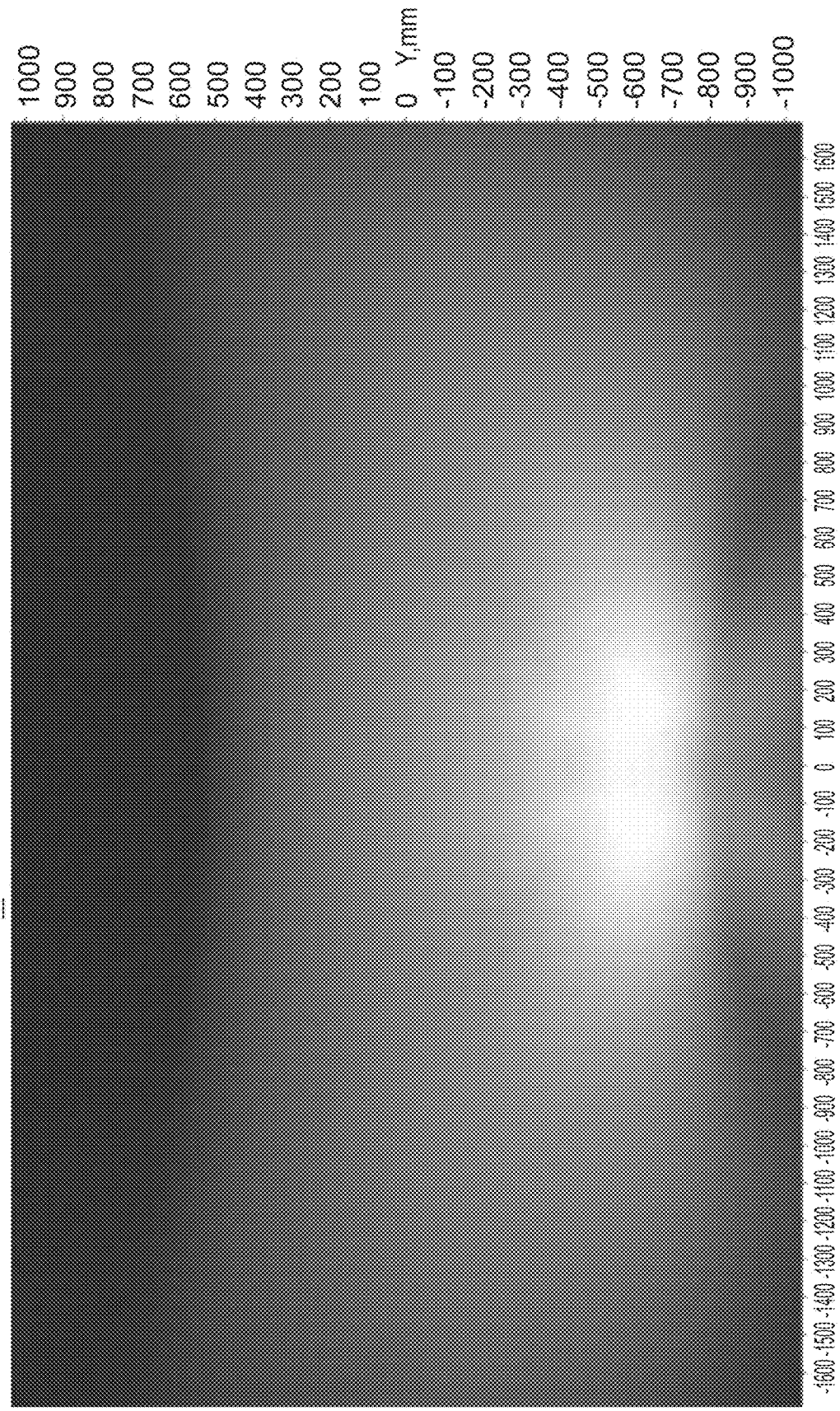
Figure 61:
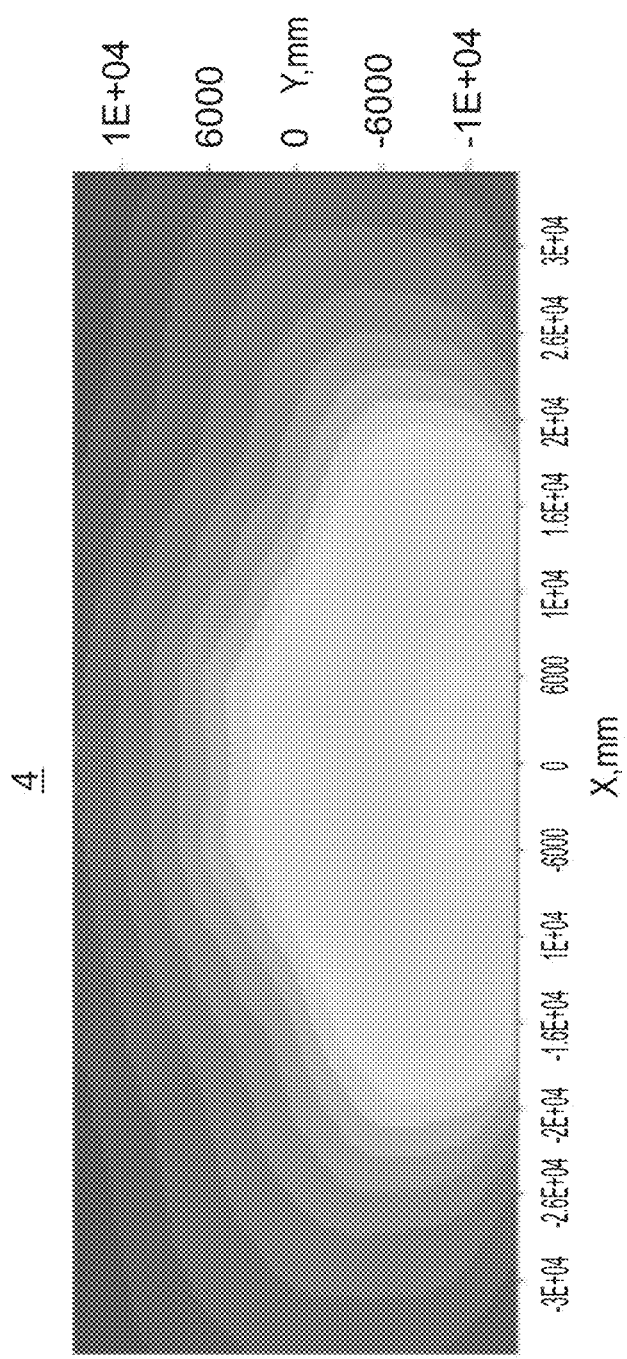
Figure 63:
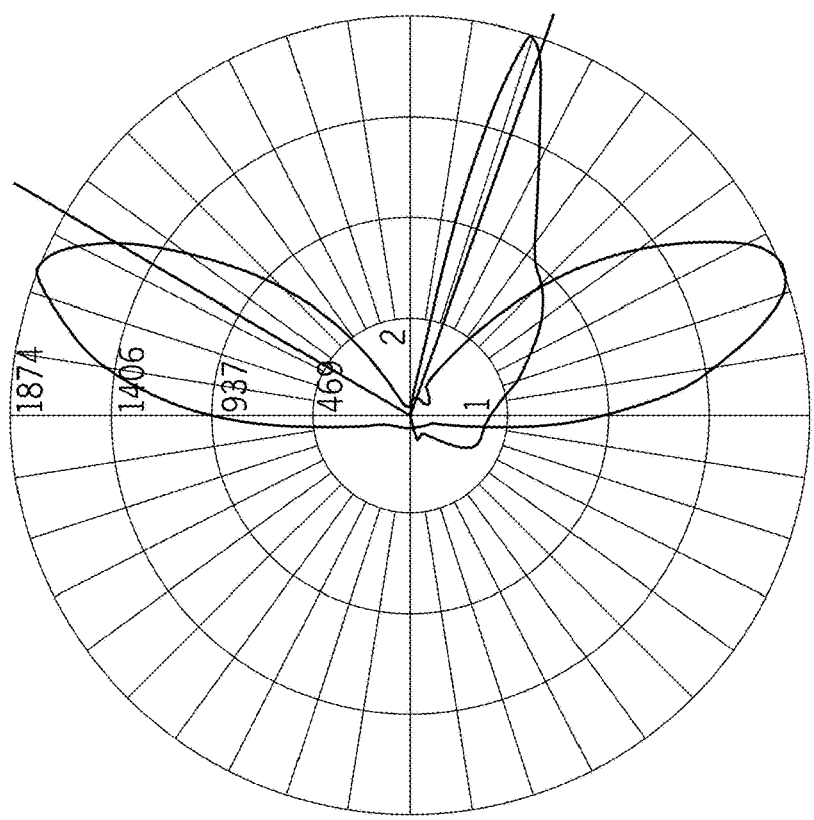
FIG. 63 is an exemplary representation of a simulated candela plot achieved with the lens of FIG. 47, graph 1 showing a vertical plane such as a plane including or substantially parallel to the emitter axis, graph 2 showing a horizontal cone.
Figure 62:
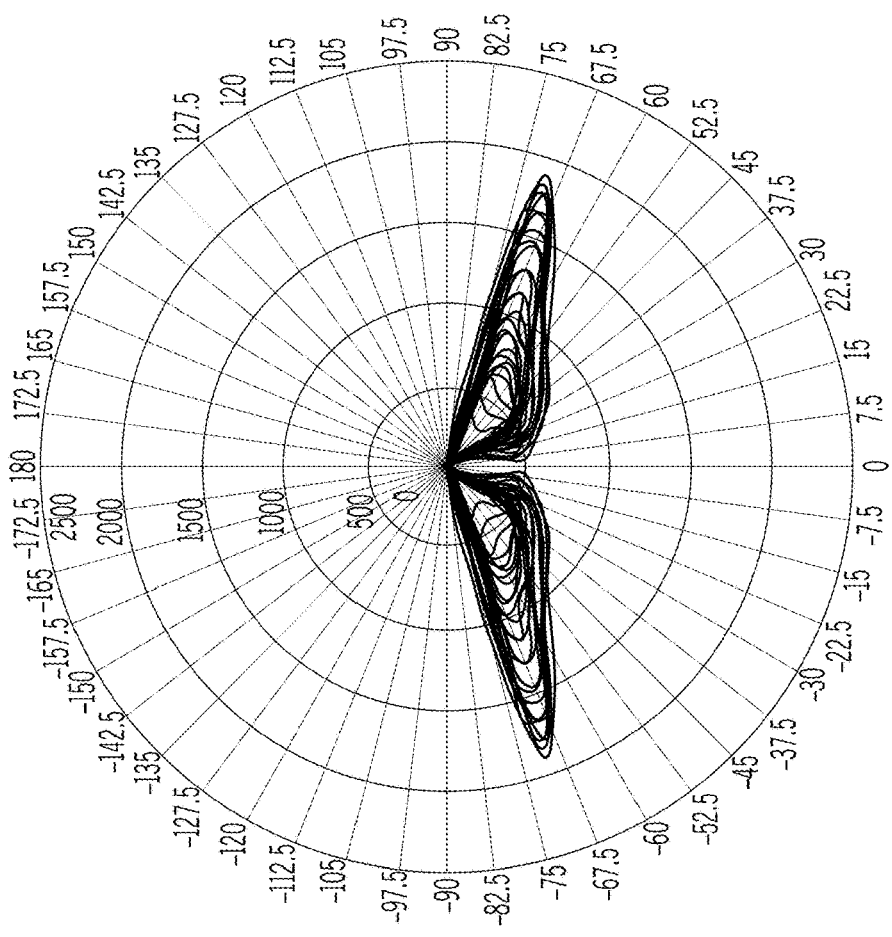
FIG. 62 is an exemplary representation of a simulated intensity distribution achieved with the lens of FIG. 47.
Figure 64:
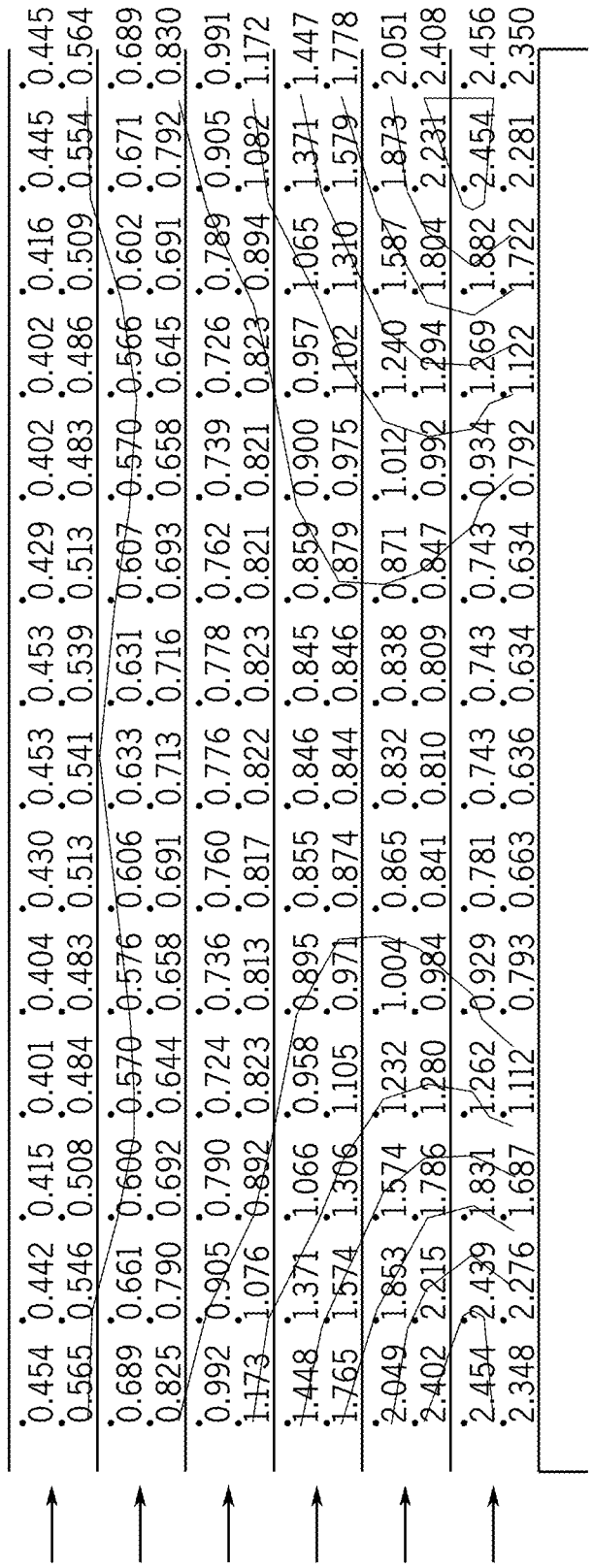
FIG. 64 is an exemplary representation of a simulated light distribution pattern achieved on an exemplary working plane with luminaries utilizing the lens of FIG. 47.
Figure 65:
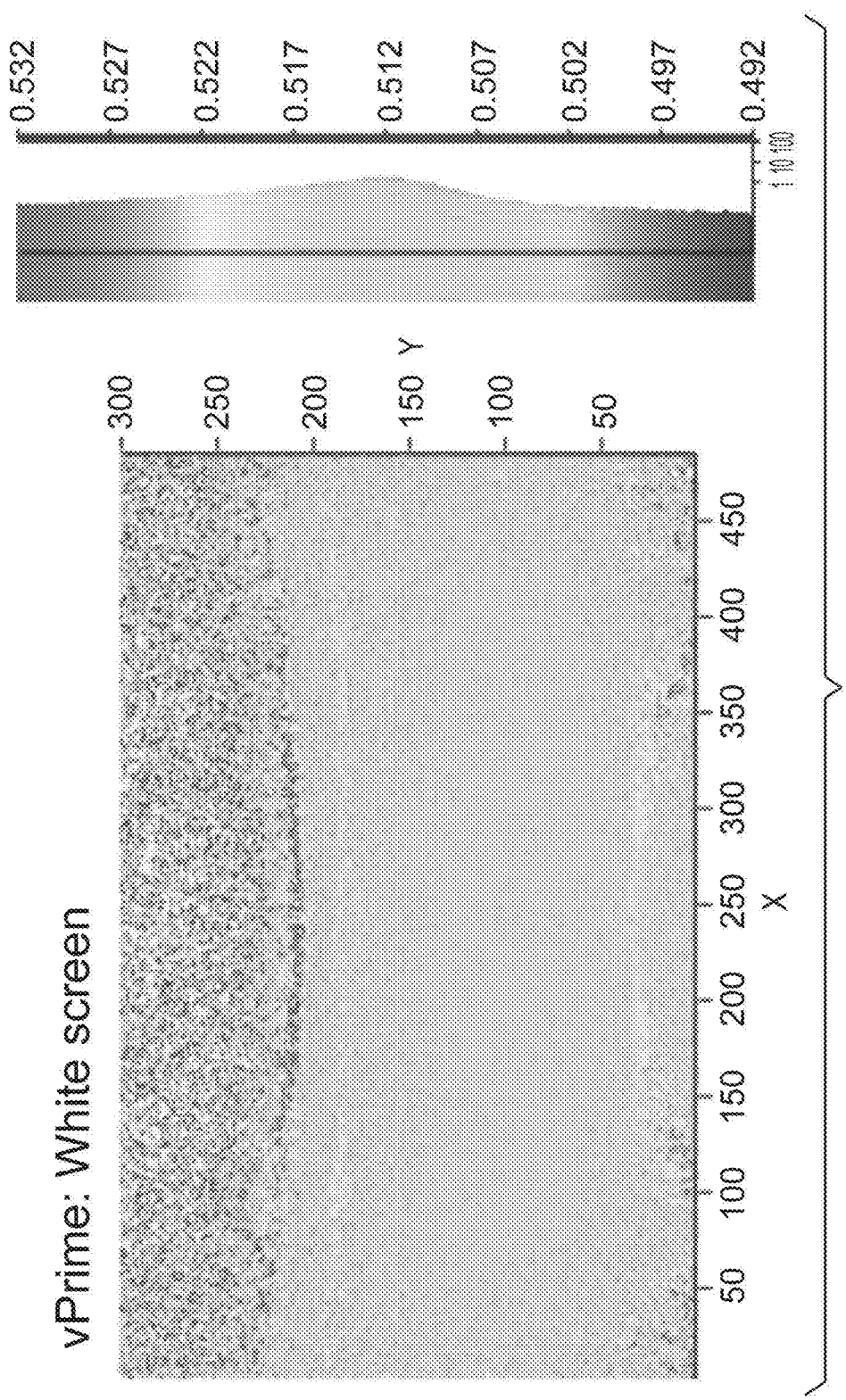
FIG. 65 is an exemplary representation of simulated chromaticity showing a color uniformity achieved with the lens of FIG. 47.

In illustrated lens embodiment 10C, transverse reflecting regions 42C have convex/concave cross-sections best seen in FIGS. 51 and 52. FIGS. 48, 50 and 51 show adjacent transverse reflecting regions 42C extending to an intersection region 44C which is a curved line. Adjacent intersection regions 44C are shown substantially parallel to each other and extend in a direction away from emitter plane 15 and away from emitter axis 14, as also seen in FIGS. 51 and 52. FIG. 50 further shows a longitudinal direction of transverse reflecting regions 42C being parallel to a plane 16 of bilateral symmetry of lens 10C.

In illustrated lens embodiments 10A and 10D, each of outer stepwise discontinuities 33A, 33D is optically aligned over corresponding secondary surface 40A, 40D such that light reflected by secondary surface 40A, 40D is received and further redirected by outer stepwise discontinuities 33A, 33D.

FIGS. 3-4, 49-50, and 68-69 show intersection regions 24 of inner stepwise discontinuities 23 as curved regions each adjoining a pair of transverse inner regions 22 adjacent to each other. FIGS. 2, 4, 5, 48, 50 and 51 show intersection regions 24A, 24C curved about emitter axis 14 in planes substantially orthogonal to emitter axis 14 and plane 16 of bilateral symmetry of lens 10A, 10C and substantially parallel to emitter plane 15. FIGS. 2, 4, 48 and 50 illustrate transverse inner regions 223A, 223C longitudinally arcing partially around emitter axis 14.

FIGS. 67, 68 and 70-72 show intersection regions 24D curved in planes substantially transverse emitter plane 15 and substantially parallel to plane 16 of bilateral symmetry of lens 10.

Figure 79:
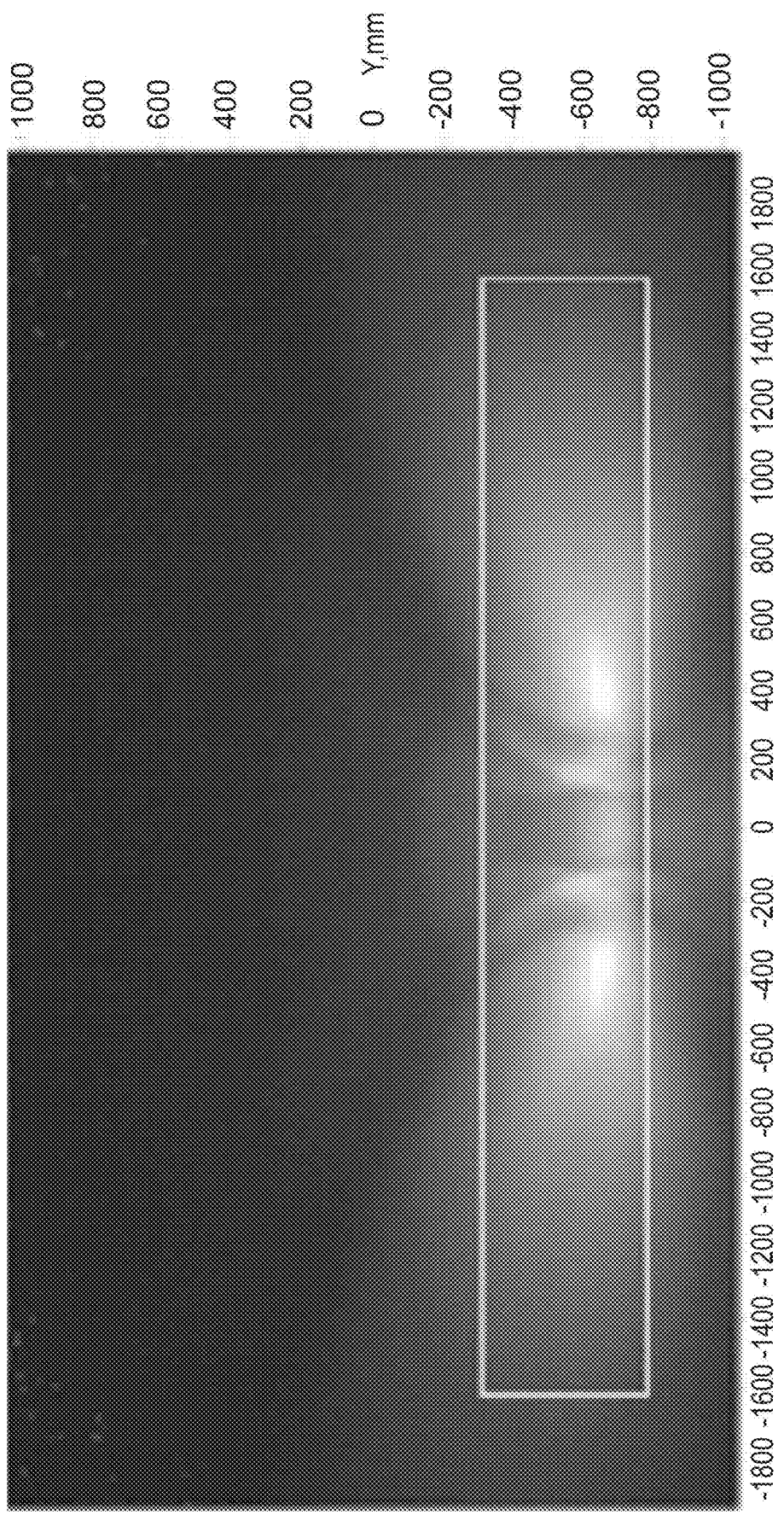
FIG. 79 is an exemplary representation of simulated illuminance achieved with the lens having the type of inner-surface configuration of the lens shown in FIGS. 77 and 78.
Figure 80:
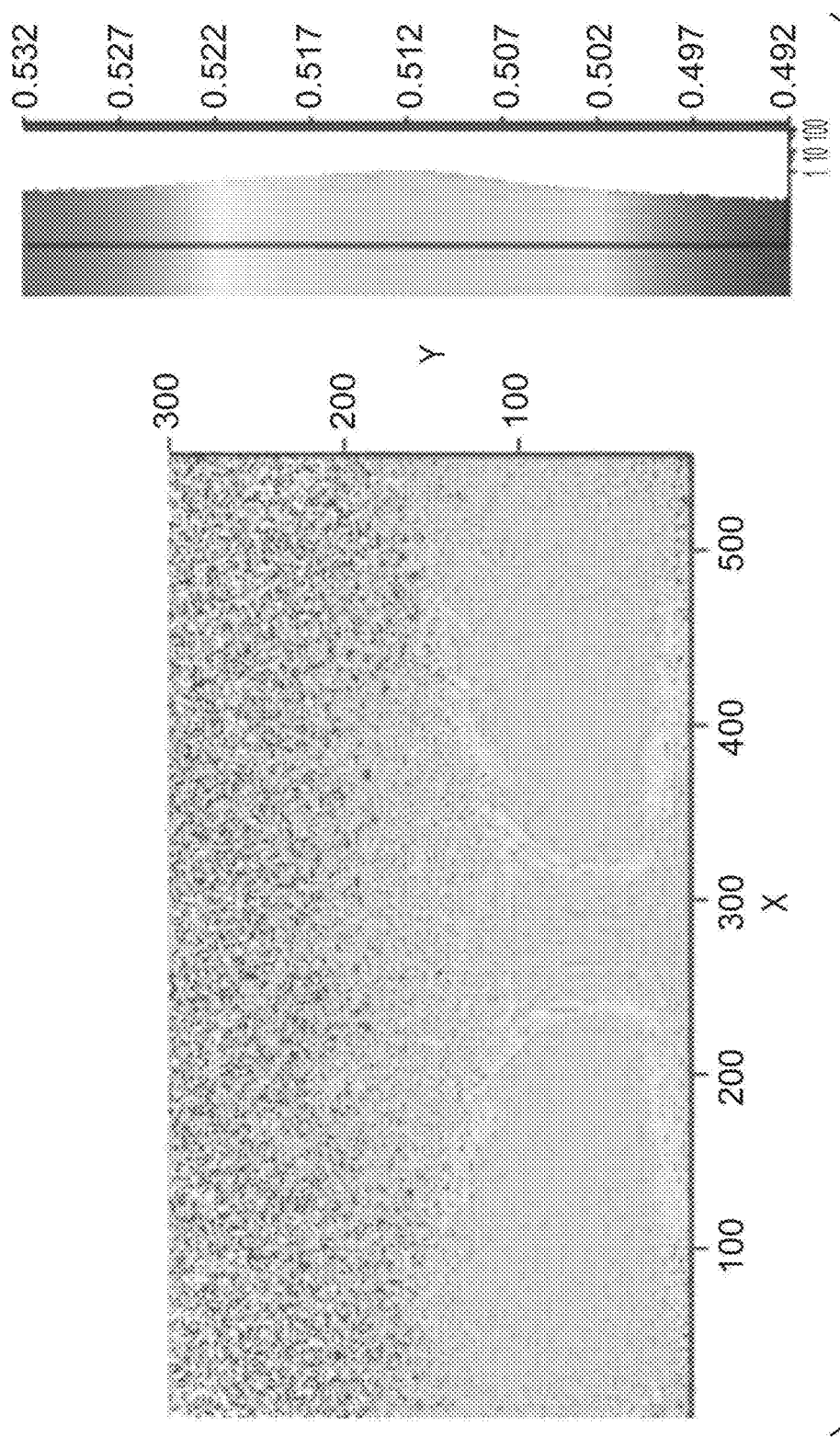
FIG. 80 is an exemplary representation of simulated chromaticity showing a color uniformity achieved with the lens of FIGS. 77 and 78.
Figure 81:
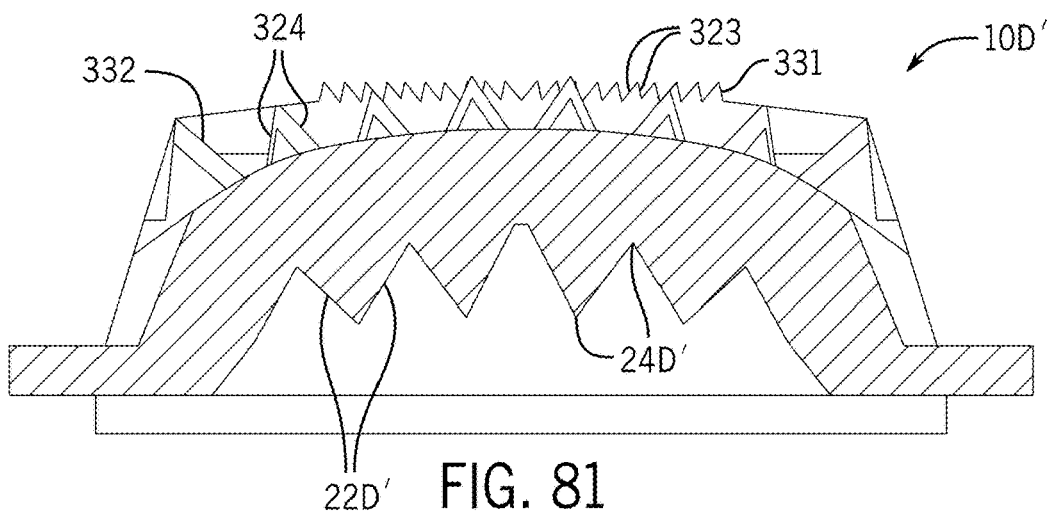
FIG. 81 is an enlarged opaque cross-sectional view of the lens of FIGS. 77 and 78, shown in the plane substantially orthogonal to the plane of bilateral symmetry of the lens.

The addition of faceted surfaces such as inner stepwise discontinuities may introduce sharp angles that can result in non-uniformities such as visible lines or striations in brightness and/or color in the resulting illuminance patterns seen in FIGS. 79 and 80. These non-uniformities can be compared to more smoothly varying analogue surfaces in conventional lenses, an example of which is illustrated in FIGS. 24-37.

Figure 82:
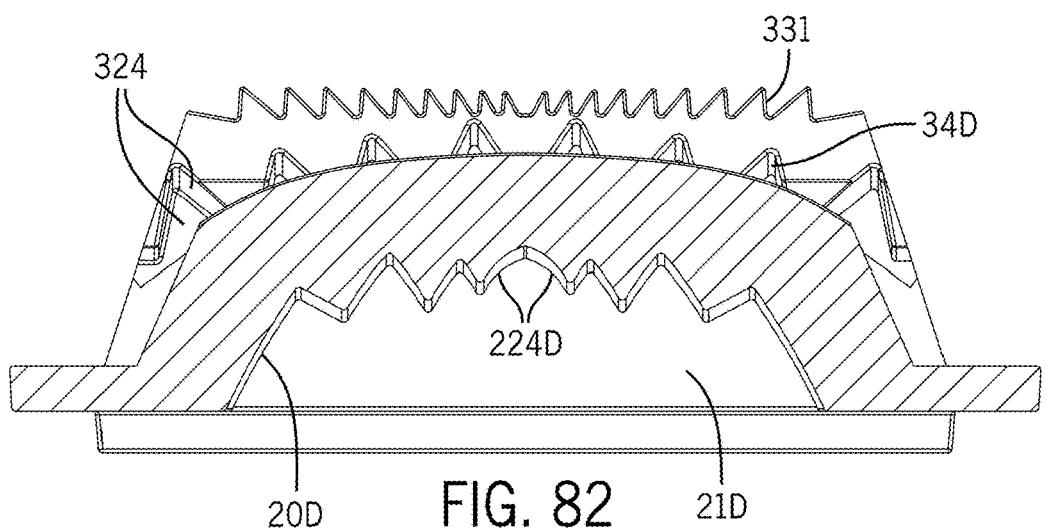
FIG. 82 is an enlarged opaque cross-sectional view of the lens of FIG. 66, shown substantially orthogonal to the plane of bilateral symmetry of the lens.
Figure 83:
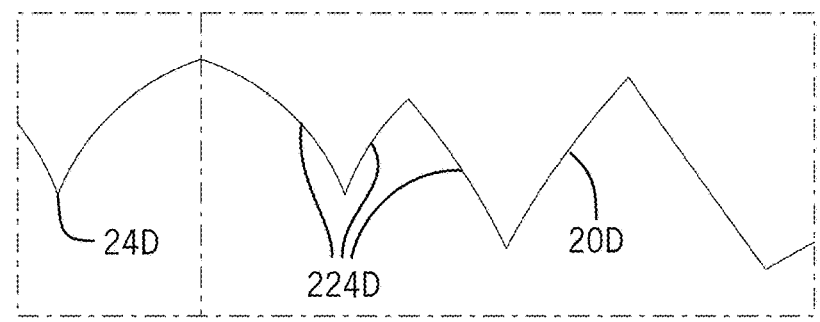
FIG. 83 is an enlarged axially-adjacent fragment of the opaque cross-sectional view of FIG. 82, showing axially-adjacent transverse inner regions having substantially concave cross-sections.
Figure 84:
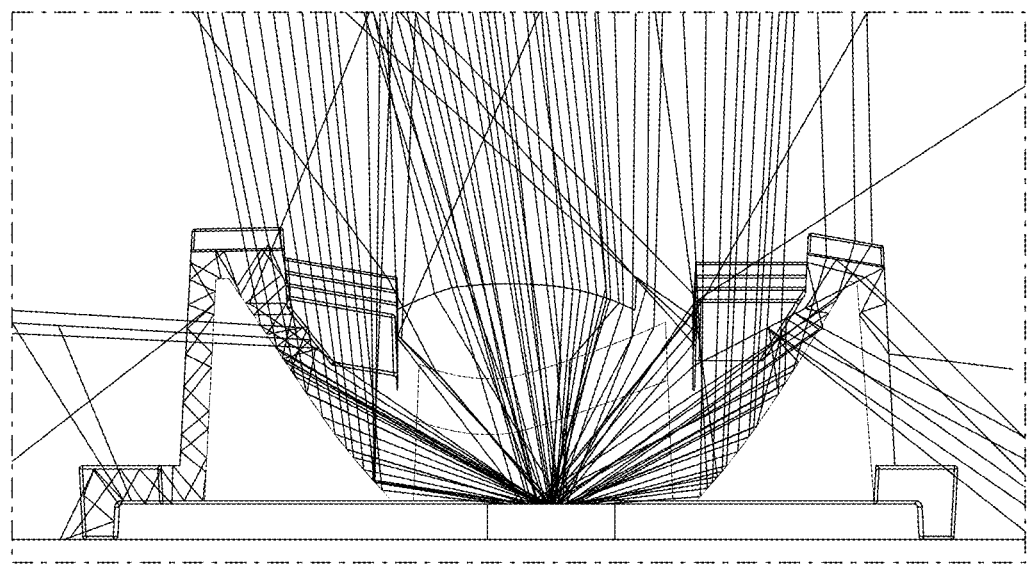
FIG. 84 is an enlarged simplified representation with ray-fan simulation showing light distribution achieved with the lens of FIG. 66 in planes substantially parallel to the plane of bilateral symmetry of the lens.

In order to reduce such non-uniformities, a slight curvature may be added to the facet surfaces to spread out the light. FIGS. 82 and 83 show substantially concave transverse inner regions 224D proximal emitter axis 14.

Other approaches for "smoothing out" intensity or color artifacts may include adding slight ripples to various surfaces, or adding slight roughness. Additionally, in order to reduce the impact of light incident on the surface from opposite edges of the source and to reduce visual artifacts, it is helpful to reduce the size and to modify the geometry of the transverse regions directly above light emitter 12 such as an LED component.

FIGS. 77-85 illustrate a comparison of an example of linear sharp intersections between transverse regions (FIG. 81) in a lens 10D' and lens 10D with facets providing improved illuminance and color uniformity (FIGS. 82 and 83) which have a slight curvature to the facets, rounded facet corners, and reduced size of the facets directly over light emitter 12.

Intersection regions 24, 34, 44 may be concave merger regions 71 or convex merger regions 72. In addition or alternatively, intersection regions 24, 34, 44 may be longitudinally straight or extend along a curve.

Figure 109:
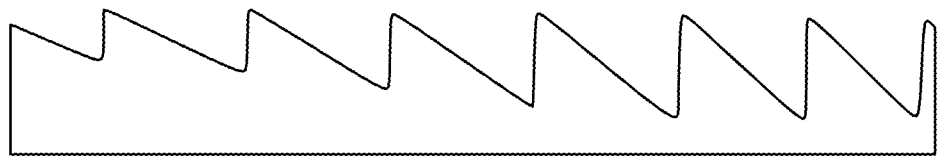
FIG. 109 is a greatly enlarged example of stepwise surface discontinuities with sharp intersection regions.
Figure 110:
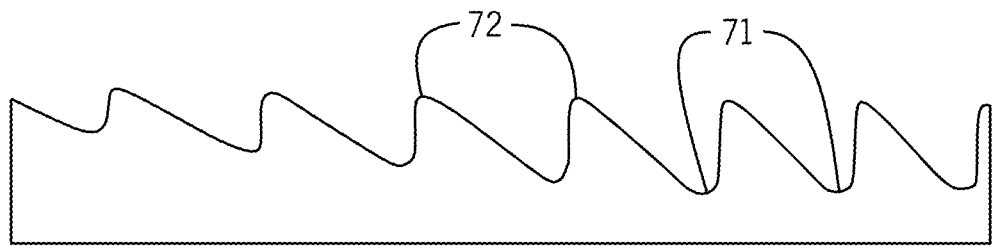
FIG. 110 is a greatly enlarged example of stepwise surface discontinuities with concave ("fillets") and convex ("rounding") intersection regions.
Figure 111:
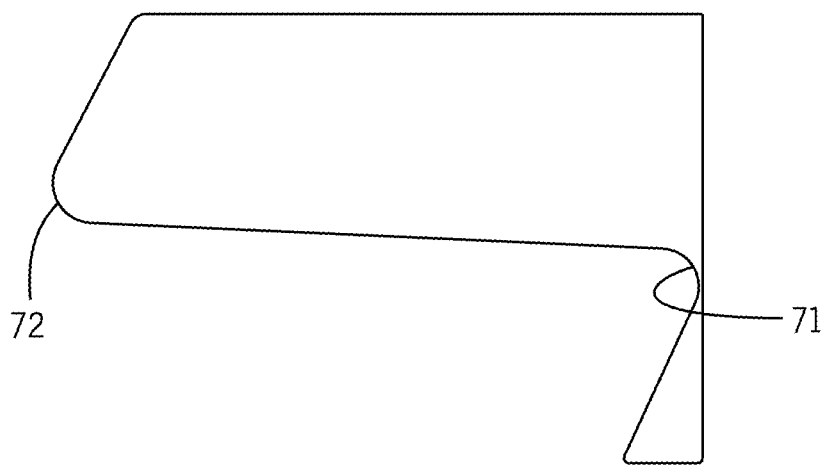
FIG. 111 is a much enlarged fragment of FIG. 110.

The addition of cross-sectional curvature, such as concave merger regions 71 may also be referred to as "fillets." And convex merger regions 72 may be described as a "rounding" of the sharp facet edges. The "fillets" and "rounding" of the sharp facet edges, as seen in FIGS. 109-111, may facilitate reducing far-field illuminance artifacts. In addition, such fillets and rounding of the sharp edges facilitates standard manufacturing processes such as injection molding due to machining constraints and the desire to minimize stress-concentration features. Intentionally increasing the radius of such fillets above what is required for manufacturing can allow further "smoothing" of illuminance patterns.

FIGS. 12, 13, 78 and 85 show transverse inner regions 22 refracting the light received from emitter 12.

FIGS. 48 and 50-52 illustrate inner surface 20C which has a smooth inner region 25C adjacent inner stepwise discontinuities 23C.

FIGS. 2, 4-7, 48 and 50-52 show lens embodiments 10A and 10C with inner surface 20A, 20C having two sets of transverse inner regions 221A, 222A and 221C, 222C which form a corresponding number of distinct sets of the inner stepwise discontinuities 231A, 232A and 231C, 232C, respectively.

Figure 78:
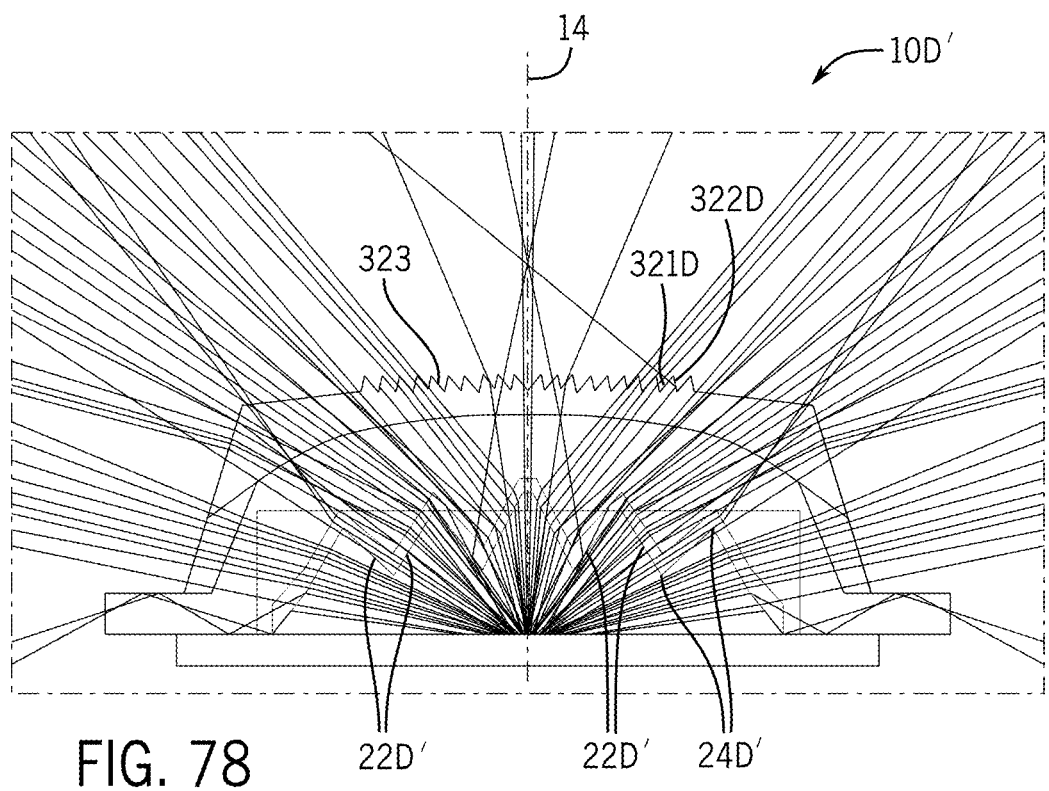
FIG. 78 is an enlarged simplified representation with ray-fan simulation showing light distribution achieved in planes orthogonal to the plane of bilateral symmetry with the lens of FIG. 77.
Figure 85:
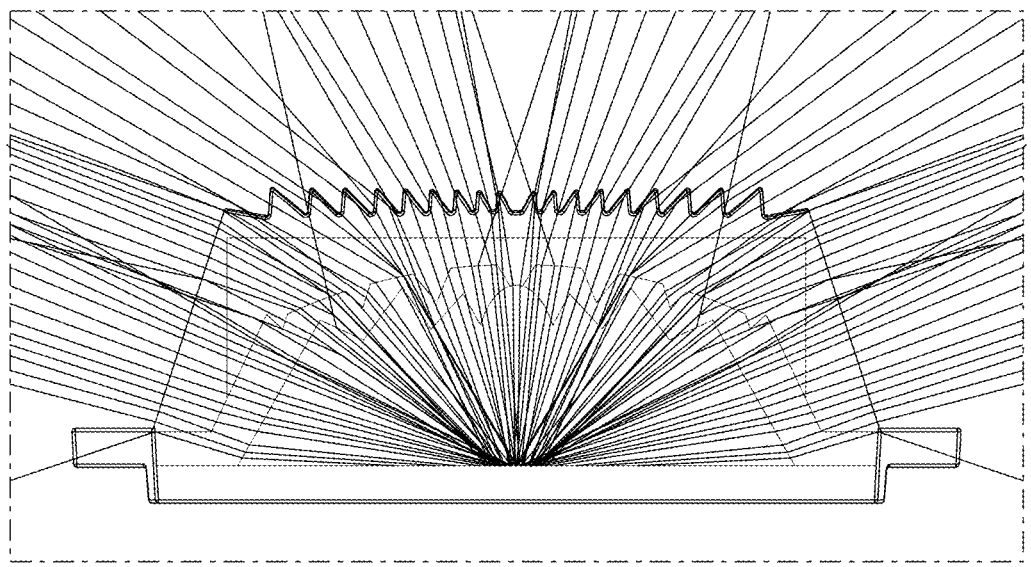
FIG. 85 is an enlarged simplified representation with ray-fan simulation showing light distribution achieved with the lens of FIGS. 66 and 82 in planes orthogonal to the plane of bilateral symmetry.
Figure 86:
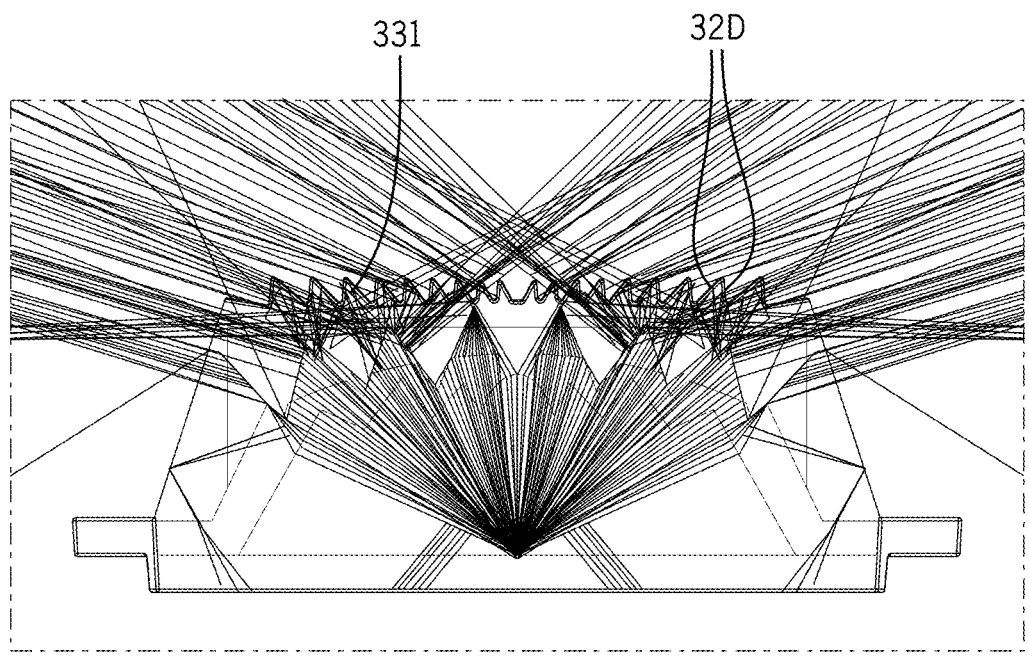
FIG. 86 is an enlarged simplified representation with ray-fan simulation showing light distribution achieved with the lens of FIGS. 66 and 82 in planes substantially orthogonal to the plane of bilateral symmetry, showing light output at major outer stepwise discontinuities of the outer surface.
Figure 87:
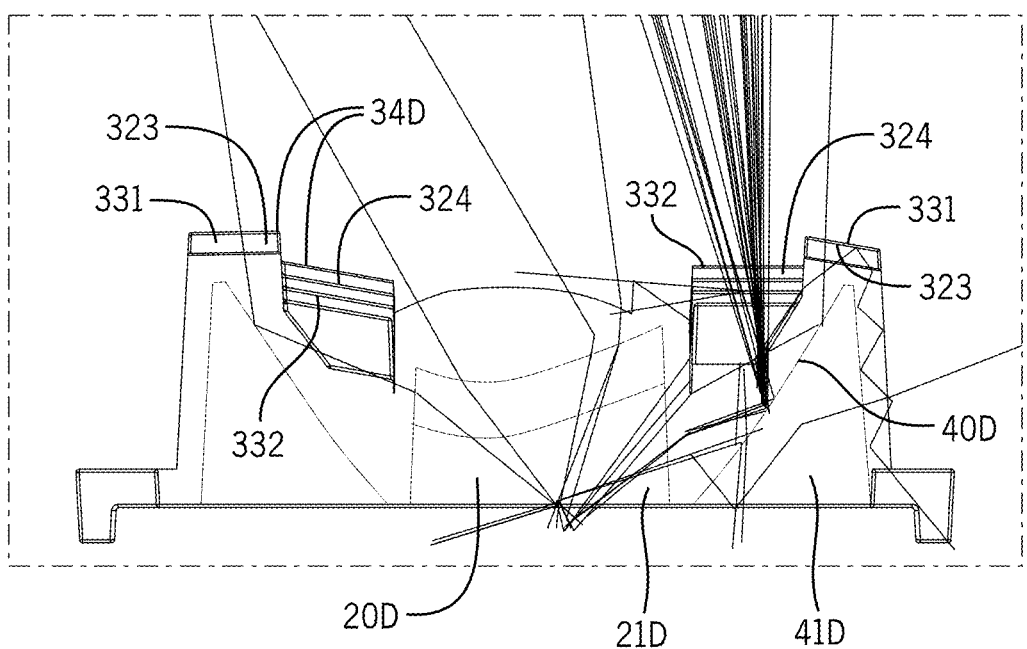
FIG. 87 is an enlarged simplified representation with ray-fan simulation showing light distribution achieved with the lens of FIGS. 66 and 82 in planes substantially parallel to the plane of bilateral symmetry, showing light output at major outer stepwise discontinuities of the outer surface.
Figure 88:
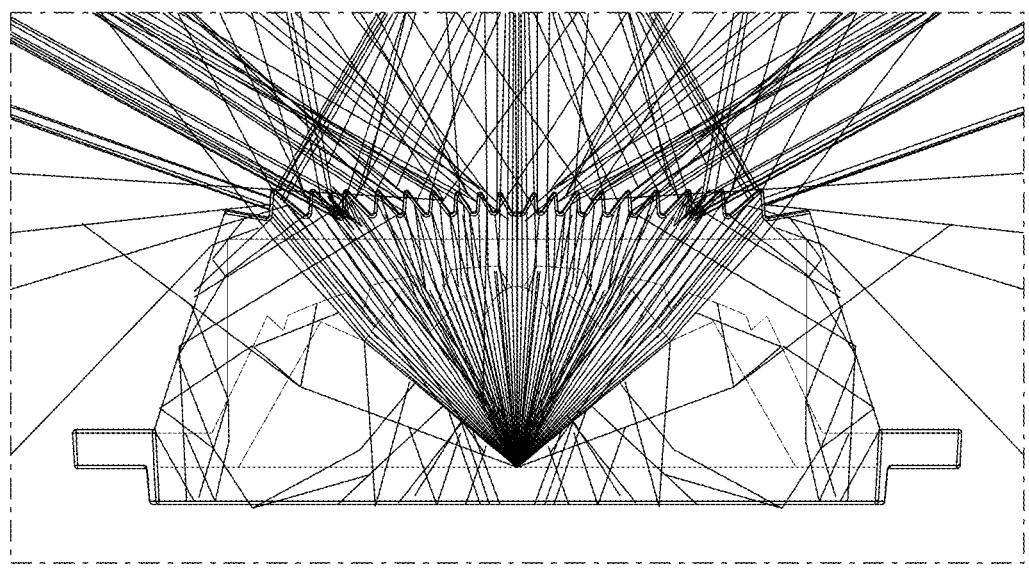
FIG. 88 is an enlarged simplified representation with ray-fan simulation showing light distribution achieved with the lens of FIGS. 66 and 82 in planes substantially orthogonal to the plane of bilateral symmetry, showing light output at minor outer stepwise discontinuities outward of the major outer stepwise discontinuities of the outer surface.
Figure 89:
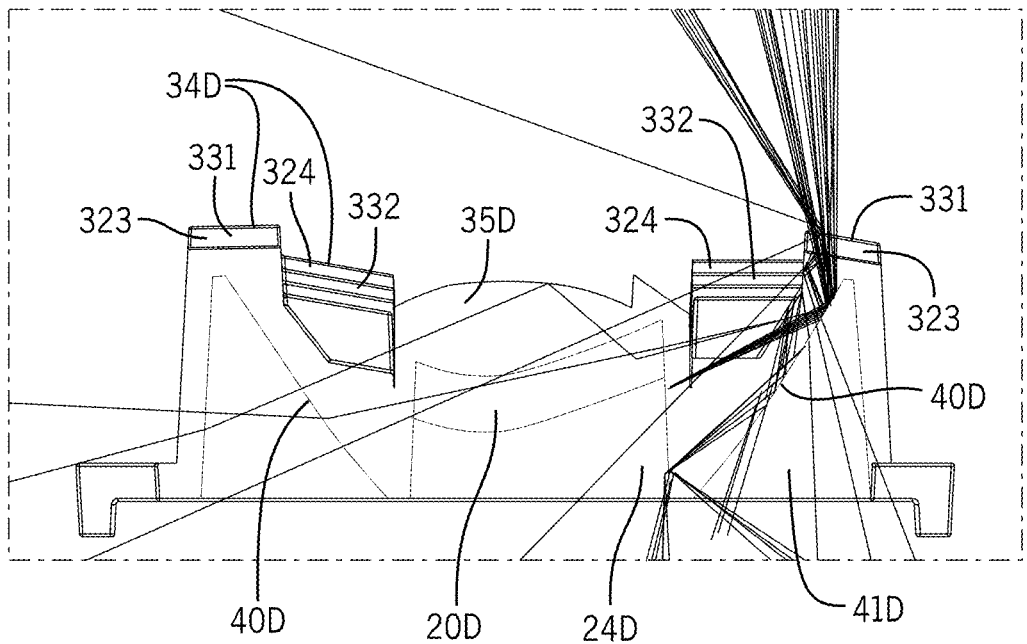
FIG. 89 is an enlarged simplified representation with ray-fan simulation showing light distribution achieved with the lens of FIGS. 66 and 82 in planes substantially parallel to the plane of bilateral symmetry, showing light output at minor outer stepwise discontinuities outward of the major outer stepwise discontinuities of the outer surface.

FIGS. 78 and 85 illustrate pairs of adjacent transverse outer regions 32D with one transverse outer region 321D of the pair refracting the received light and the other transverse outer region 322D of the pair reflecting the received light through TIR.

Figure 12:
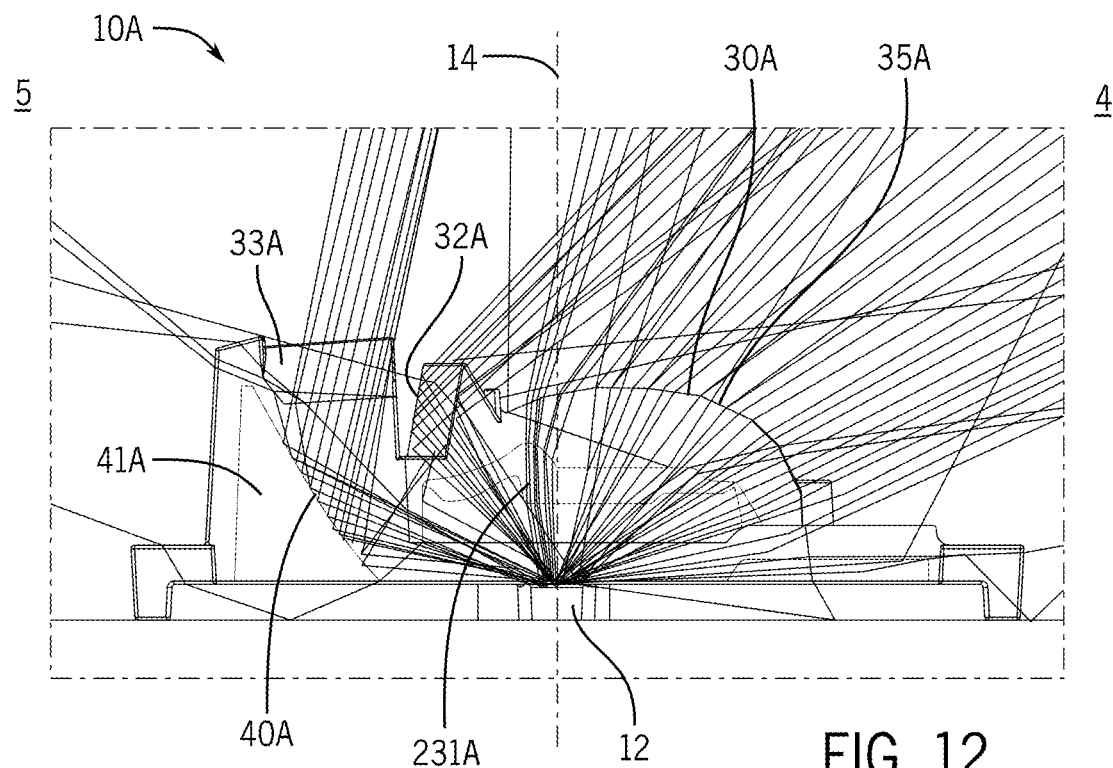
FIG. 12 is an enlarged simplified representation with ray-fan simulation showing light distribution achieved with the lens of FIG. 1 primarily in the plane of bilateral symmetry of the lens.
Figure 13:
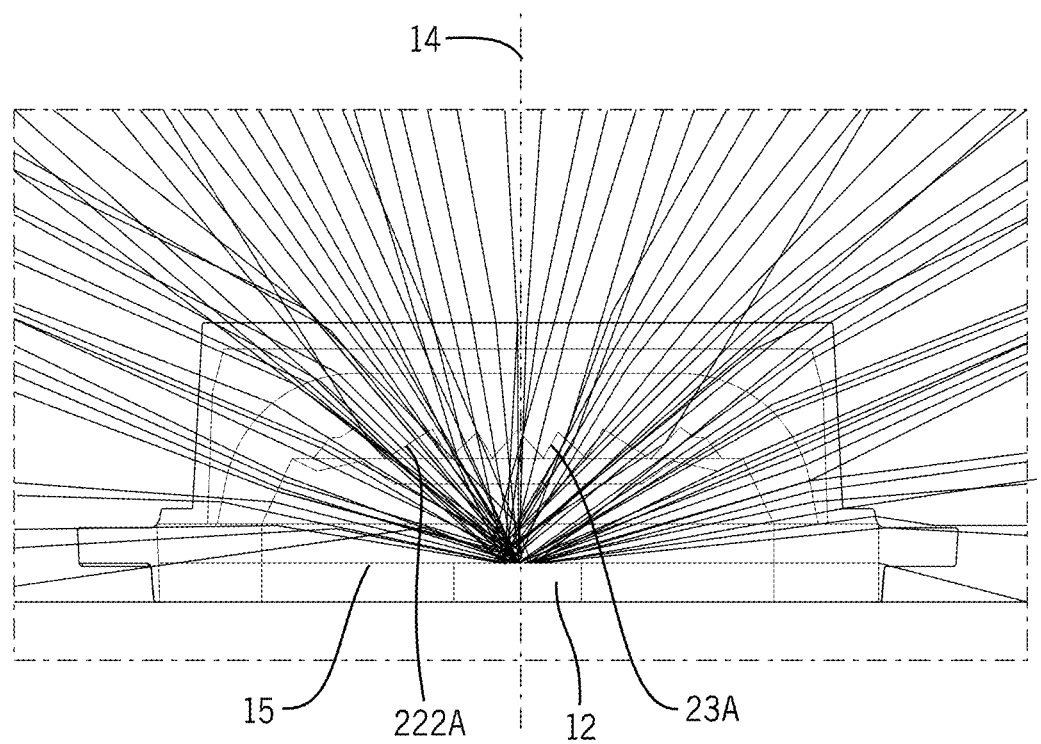
FIG. 13 is an enlarged simplified representation with ray-fan simulation showing light distribution achieved with the lens of FIG. 1 in planes orthogonal to the plane of bilateral symmetry of the lens.
Figure 14:
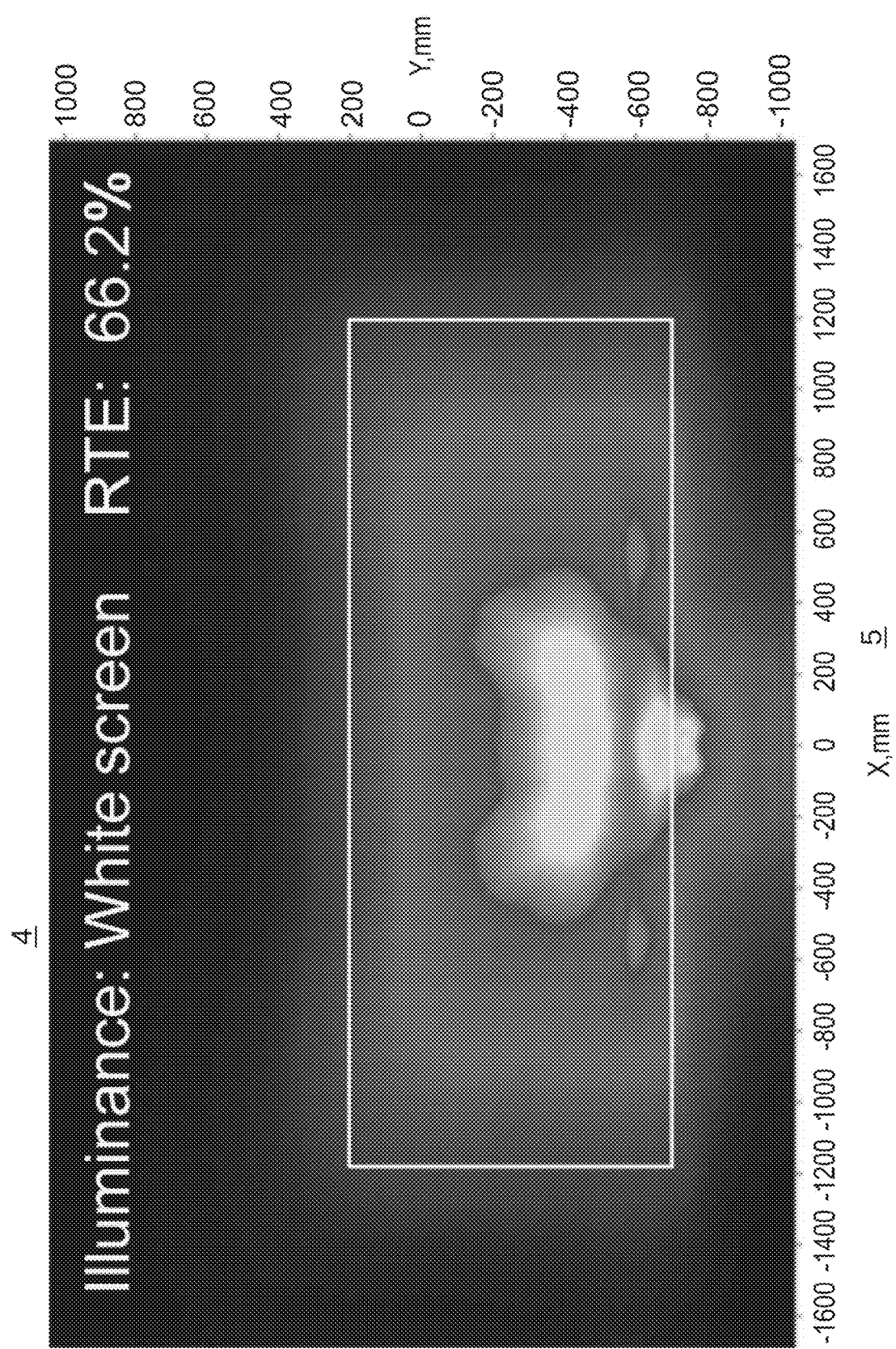
FIGS. 14-16 are exemplary representations of simulated illuminance achieved with the lens of FIG. 1.
Figure 15:
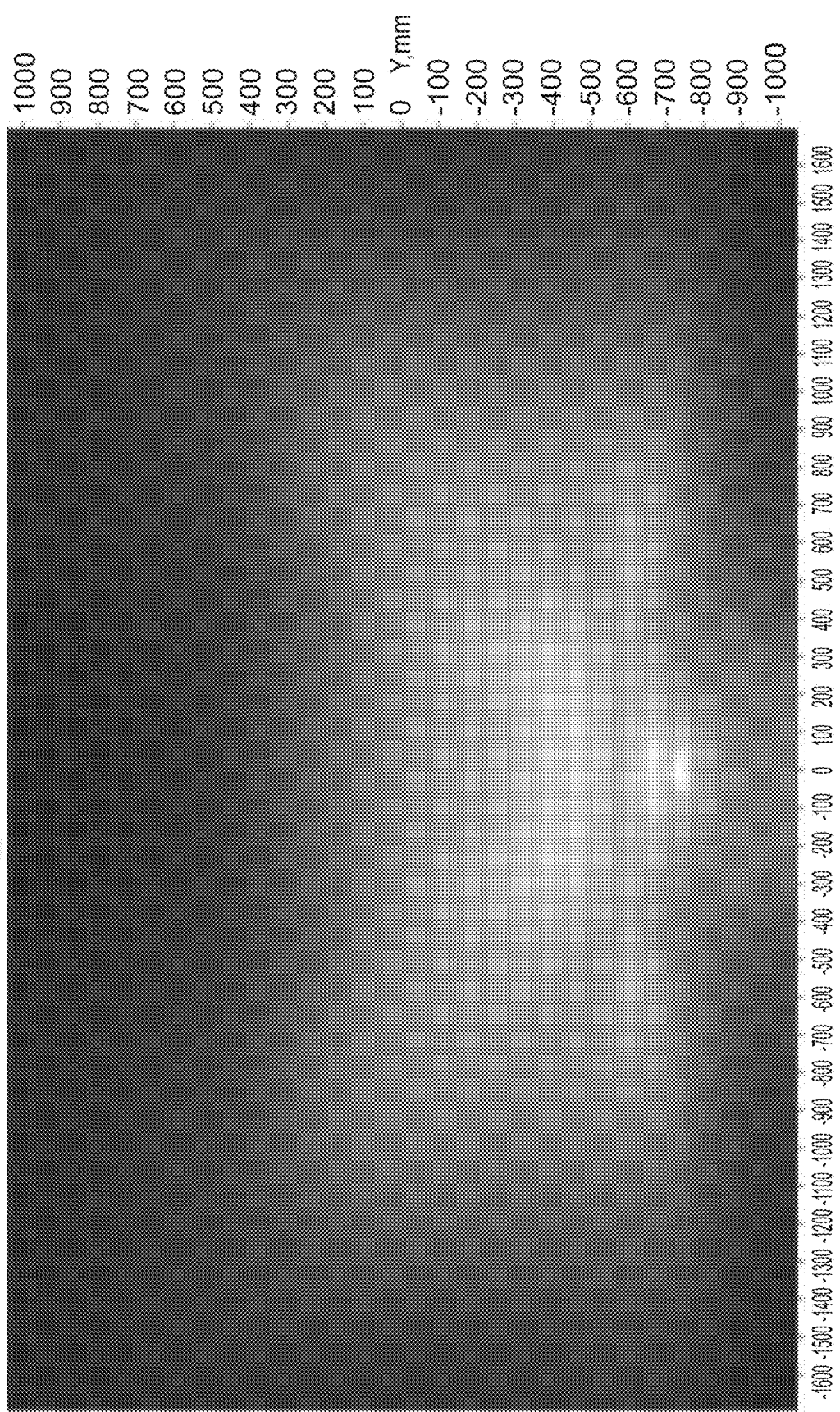
Figure 16:
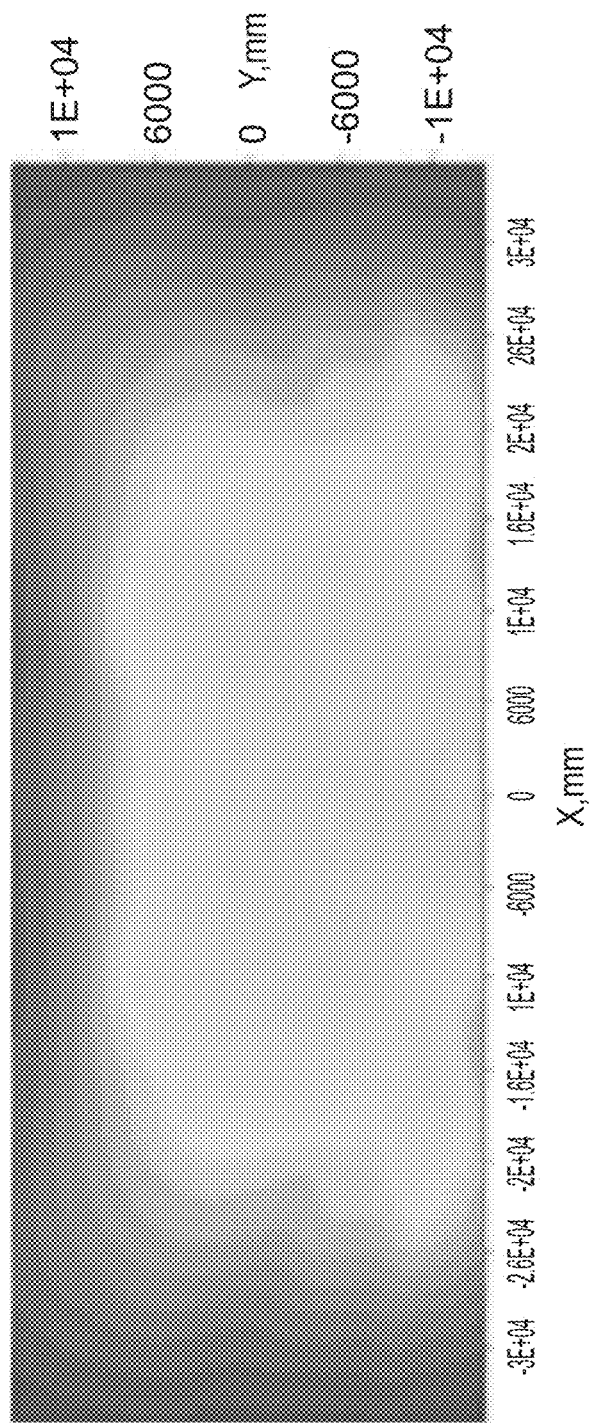
Figure 18:
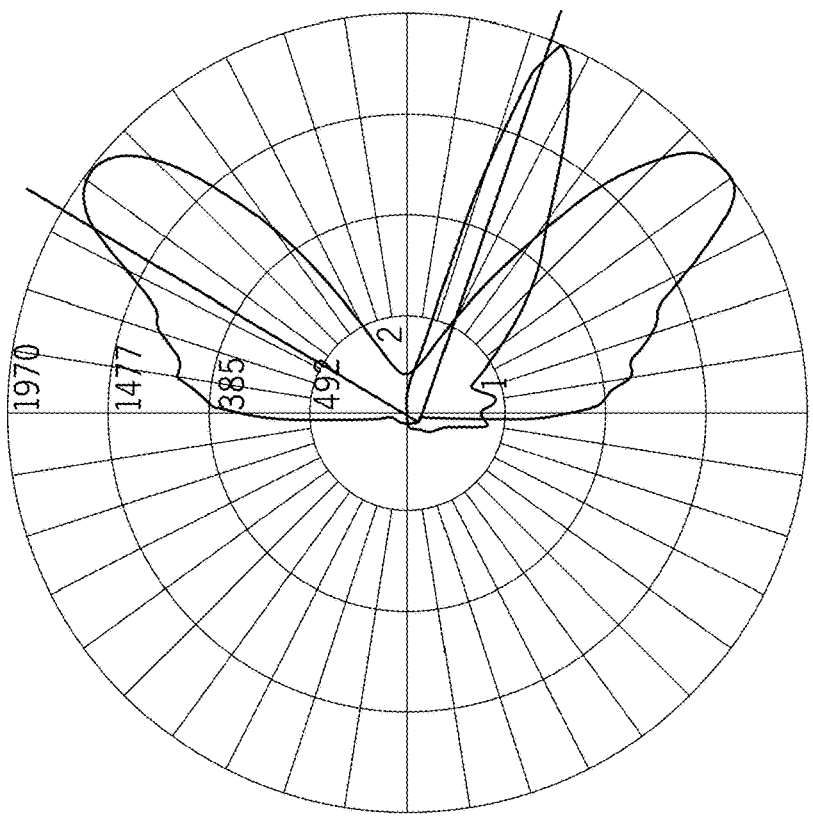
FIG. 18 is an exemplary representation of a simulated candela plot achieved with the lens of FIG. 1, graph 1 showing a vertical plane such as a plane including or substantially parallel to the emitter axis, graph 2 showing a horizontal cone.
Figure 17:
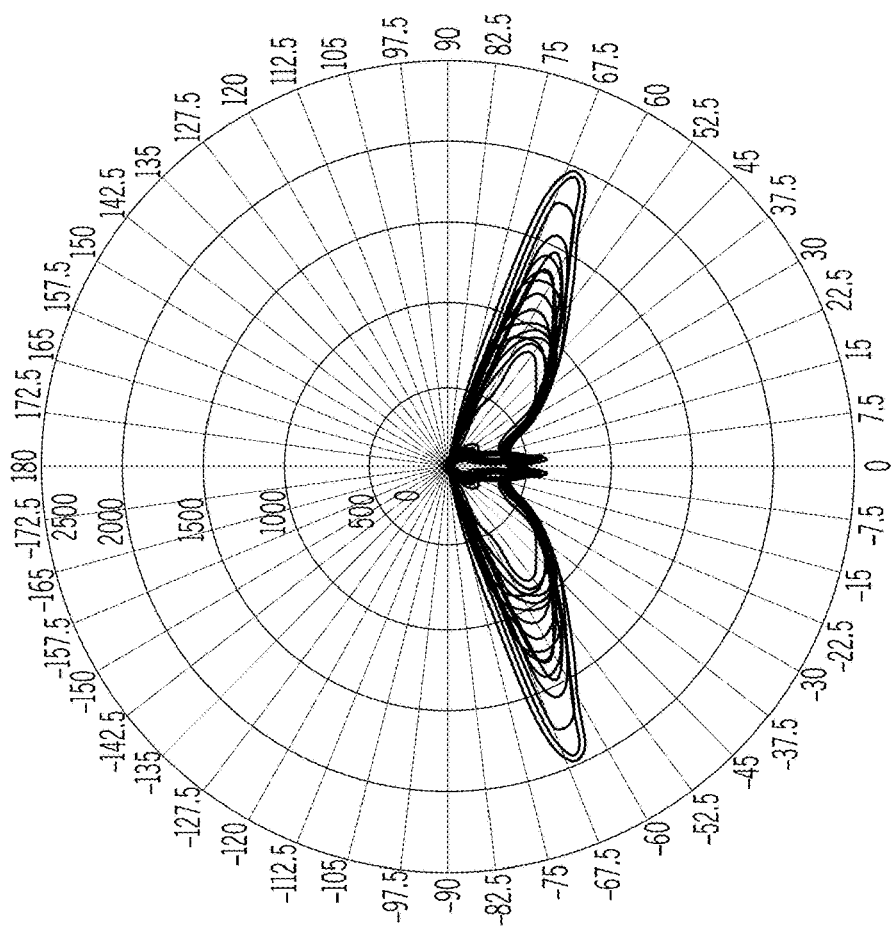
FIG. 17 is an exemplary representation of a simulated intensity distribution achieved with the lens of FIG. 1.
Figure 20:
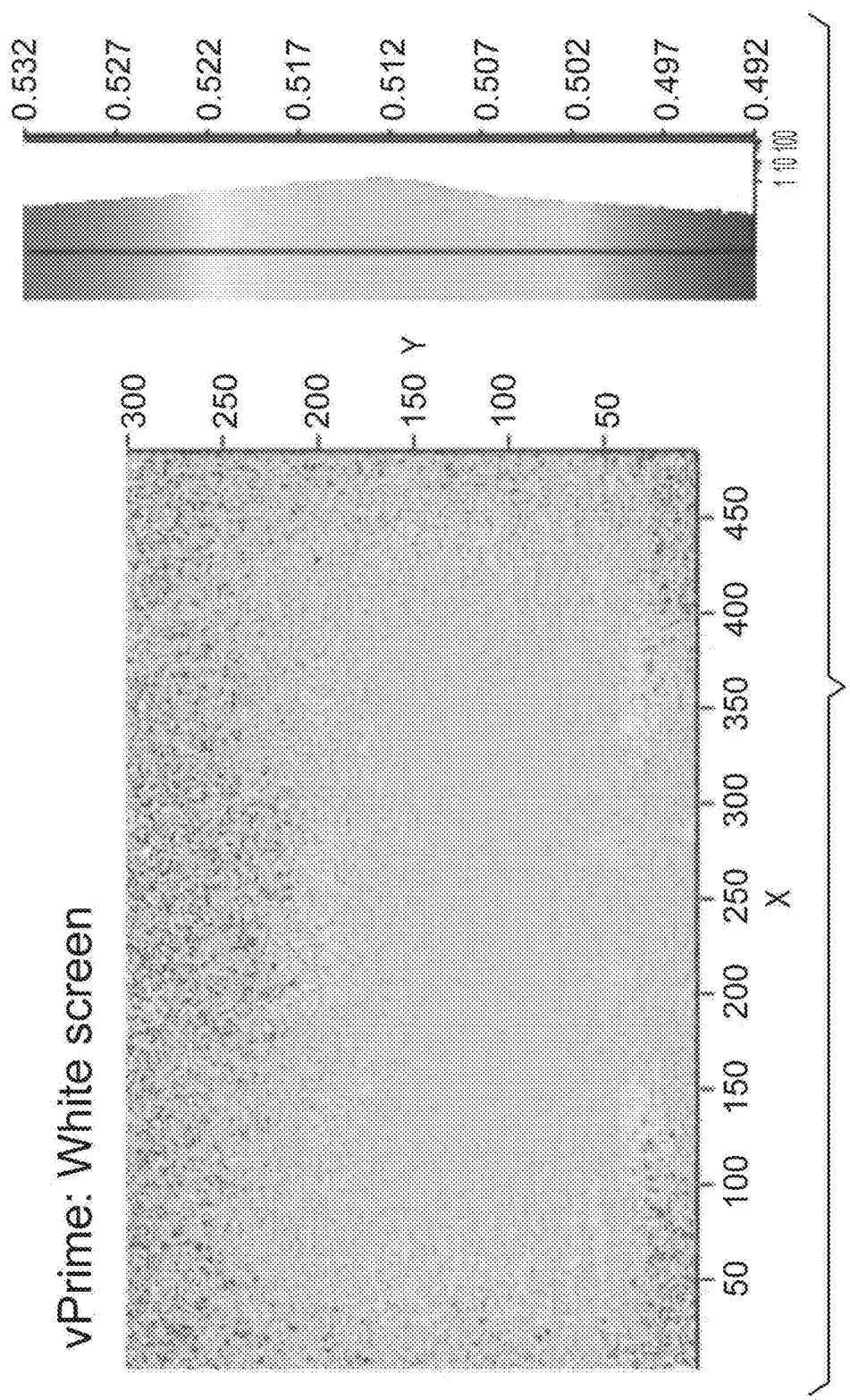
FIG. 20 is an exemplary representation of simulated chromaticity showing a color uniformity achieved with the lens of FIG. 1.
Figure 21:
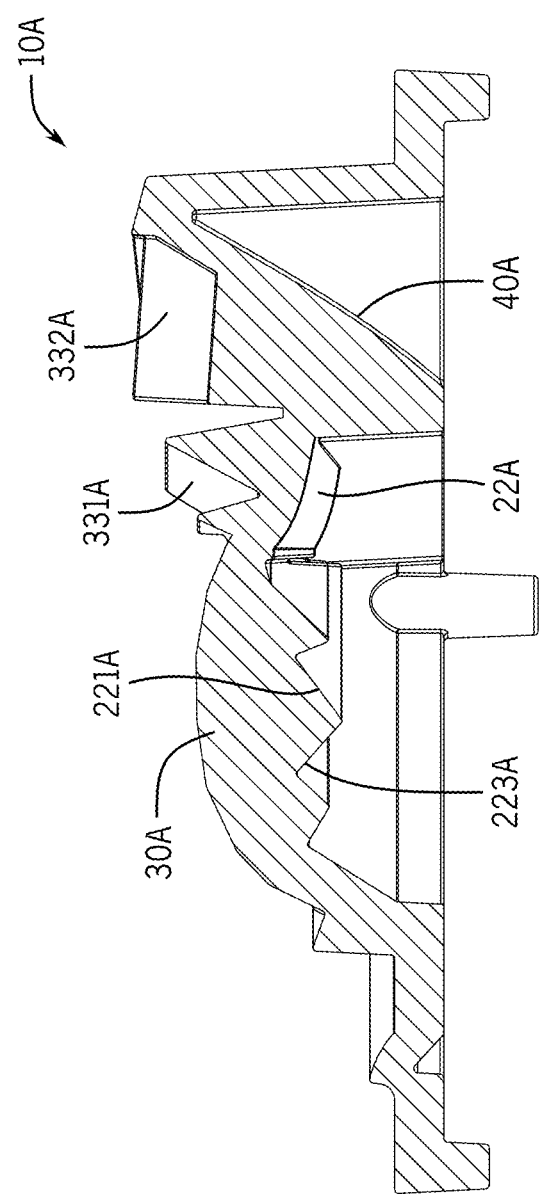
FIG. 21 is another enlarged opaque cross-sectional view of the lens of FIG. 1, shown from an opposite side of the view in FIG. 7.

FIGS. 1, 3, 5-9, 47, 49, 51-54, 66, 68 and 70-74 show outer surface 30A, 30C, 30D including a smooth outer region 35A, 35C, 35D. FIG. 12 shows that, in lens 10A, distinct set 231A of inner stepwise discontinuities 23A redirects emitter light toward smooth outer region 35A.

Figure 90:
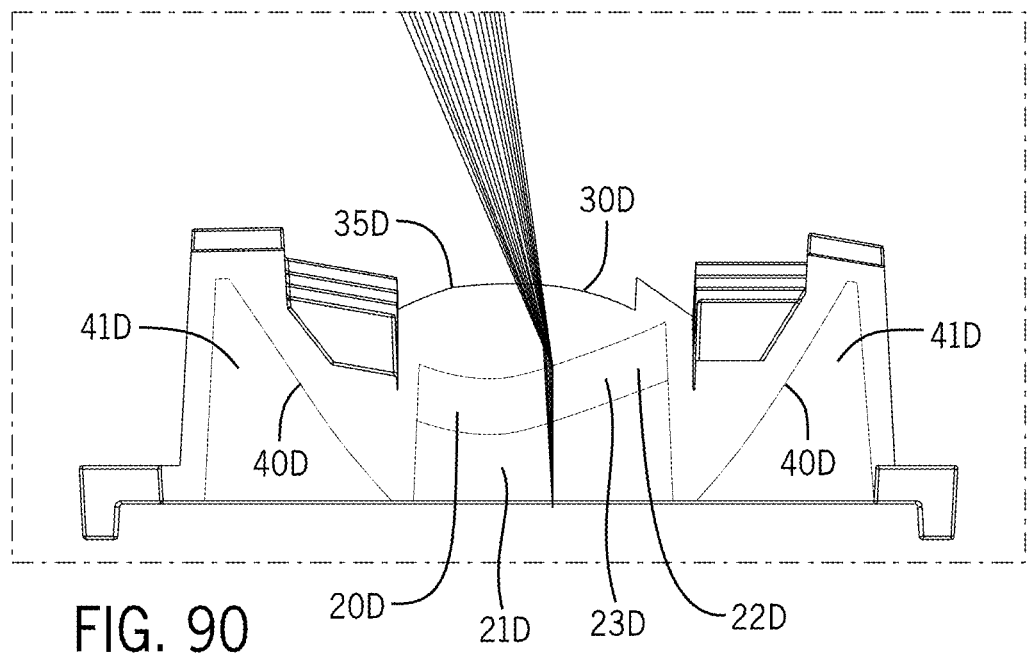
FIG. 90 is an enlarged simplified representation with ray-fan simulation showing light distribution achieved with the lens of FIGS. 66 and 82 in planes substantially parallel to the plane of bilateral symmetry, showing light output at smooth outer region 35D of outer surface 30D.
Figure 91:
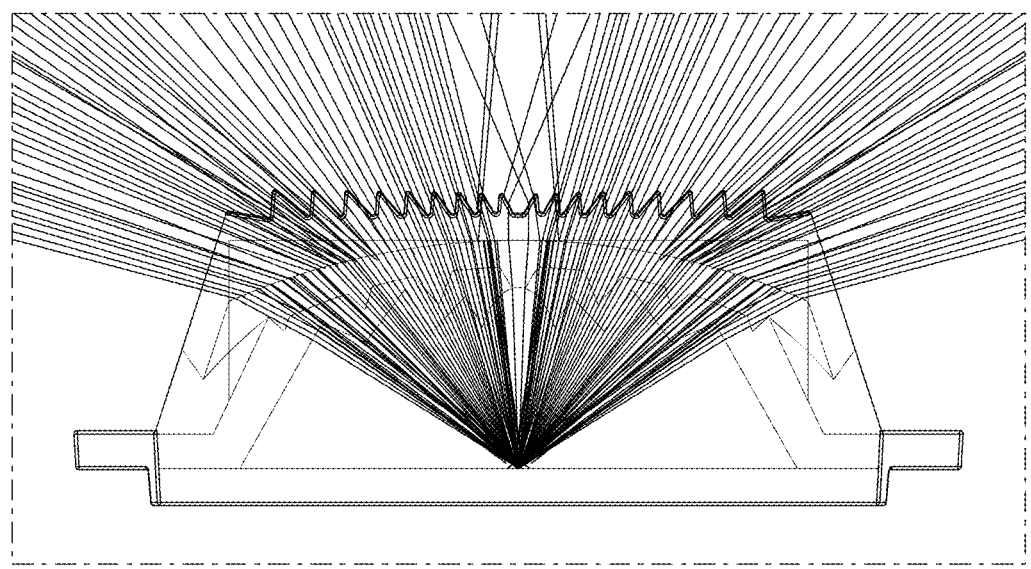
FIG. 91 is an enlarged simplified representation with ray-fan simulation showing light distribution achieved with the lens of FIGS. 66 and 82 in planes substantially orthogonal to the plane of bilateral symmetry, showing light output at smooth outer region 35D of outer surface 30D.
Figure 92:
FIGS. 92-94 are exemplary representations of simulated illuminance achieved with the lens of FIGS. 66 and 82.
Figure 93:
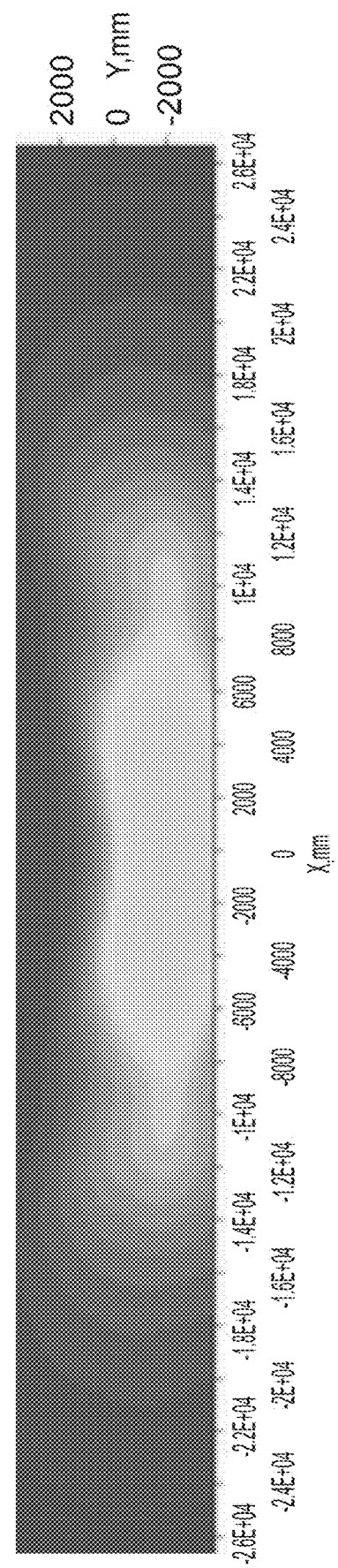
Figure 94:
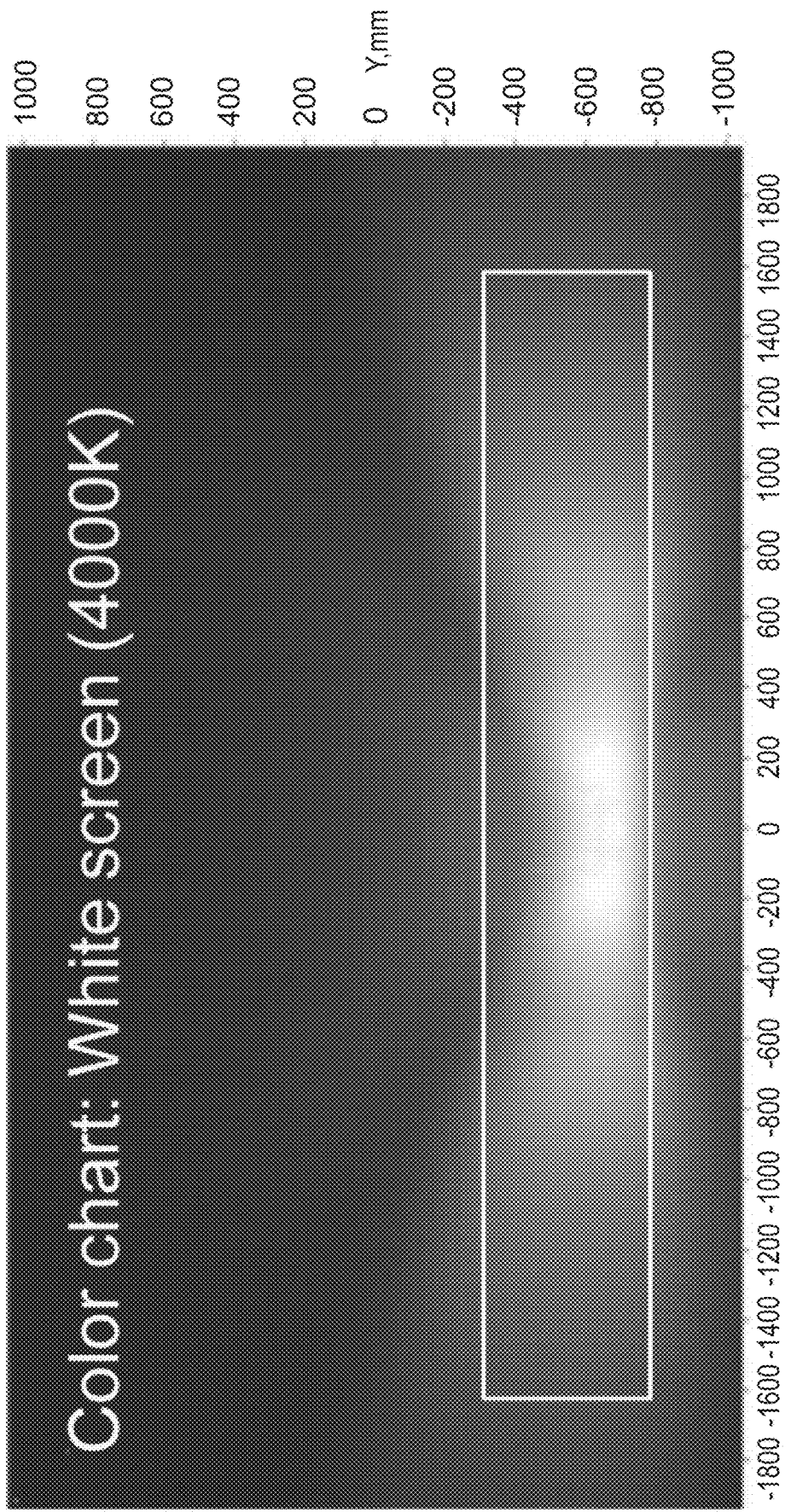
Figure 96:
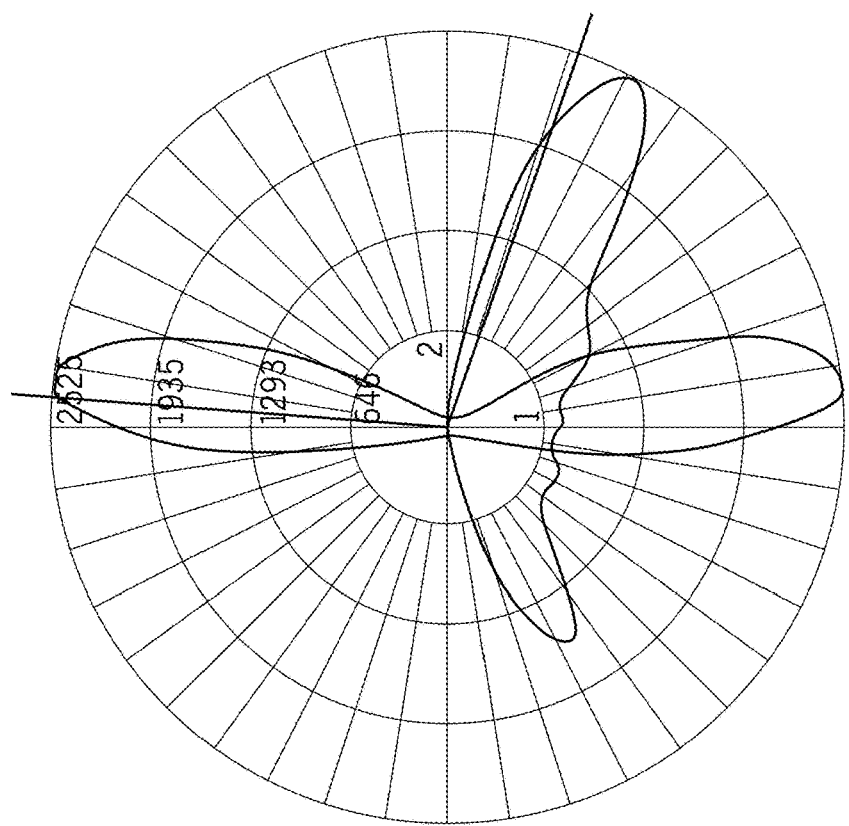
FIG. 96 is an exemplary representation of a simulated candela plot achieved with the lens of FIGS. 66 and 82, graph 1 showing a vertical plane such as a plane including or substantially parallel to the emitter axis, graph 2 showing a horizontal cone.
Figure 95:
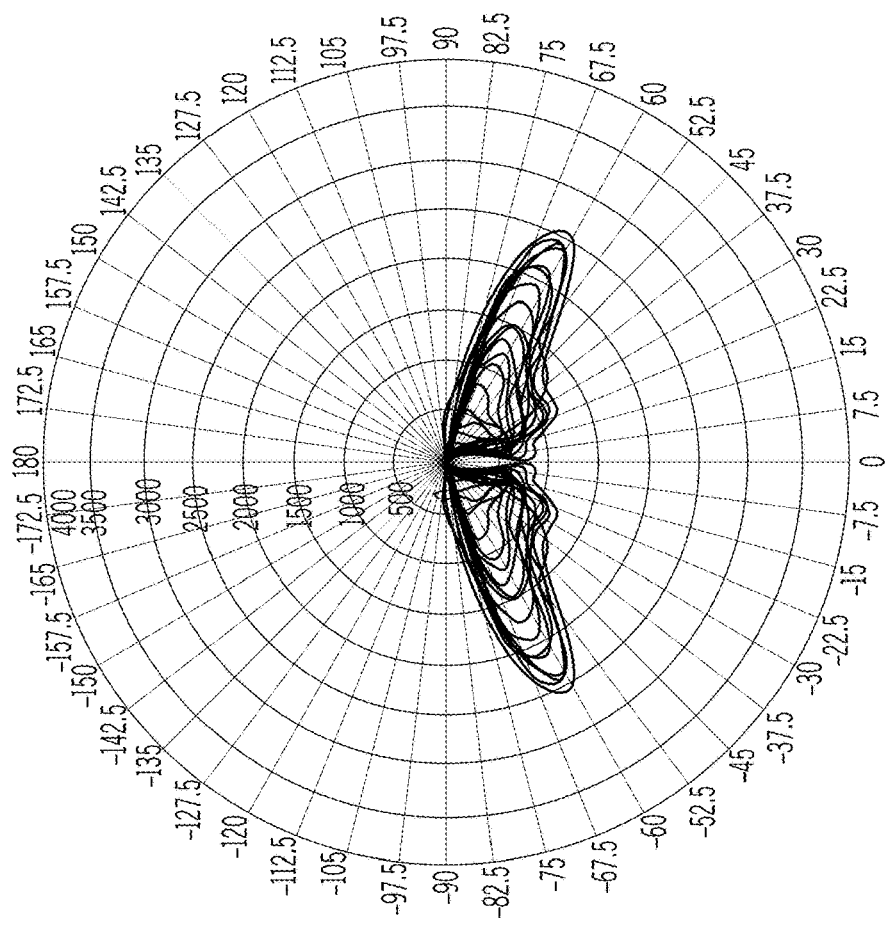
FIG. 95 is an exemplary representation of a simulated intensity distribution achieved with the lens of FIGS. 66 and 82.
Figure 97:
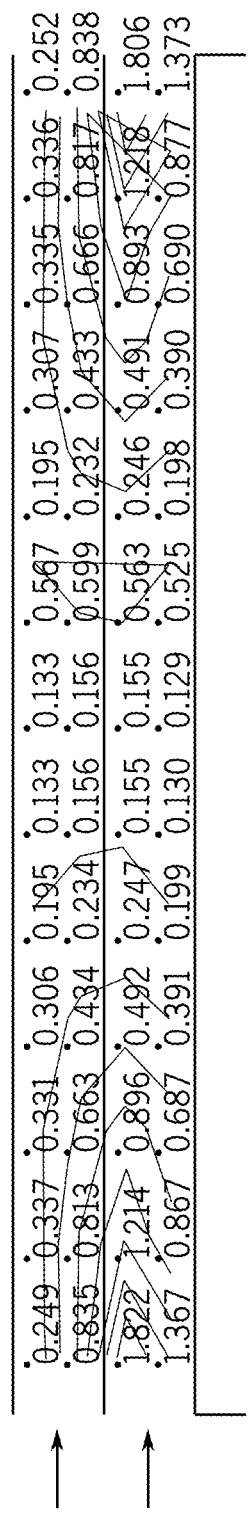
FIG. 97 is an exemplary representation of a simulated light distribution pattern achieved on an exemplary working plane with luminaries utilizing the lens of FIGS. 66 and 82.
Figure 98:
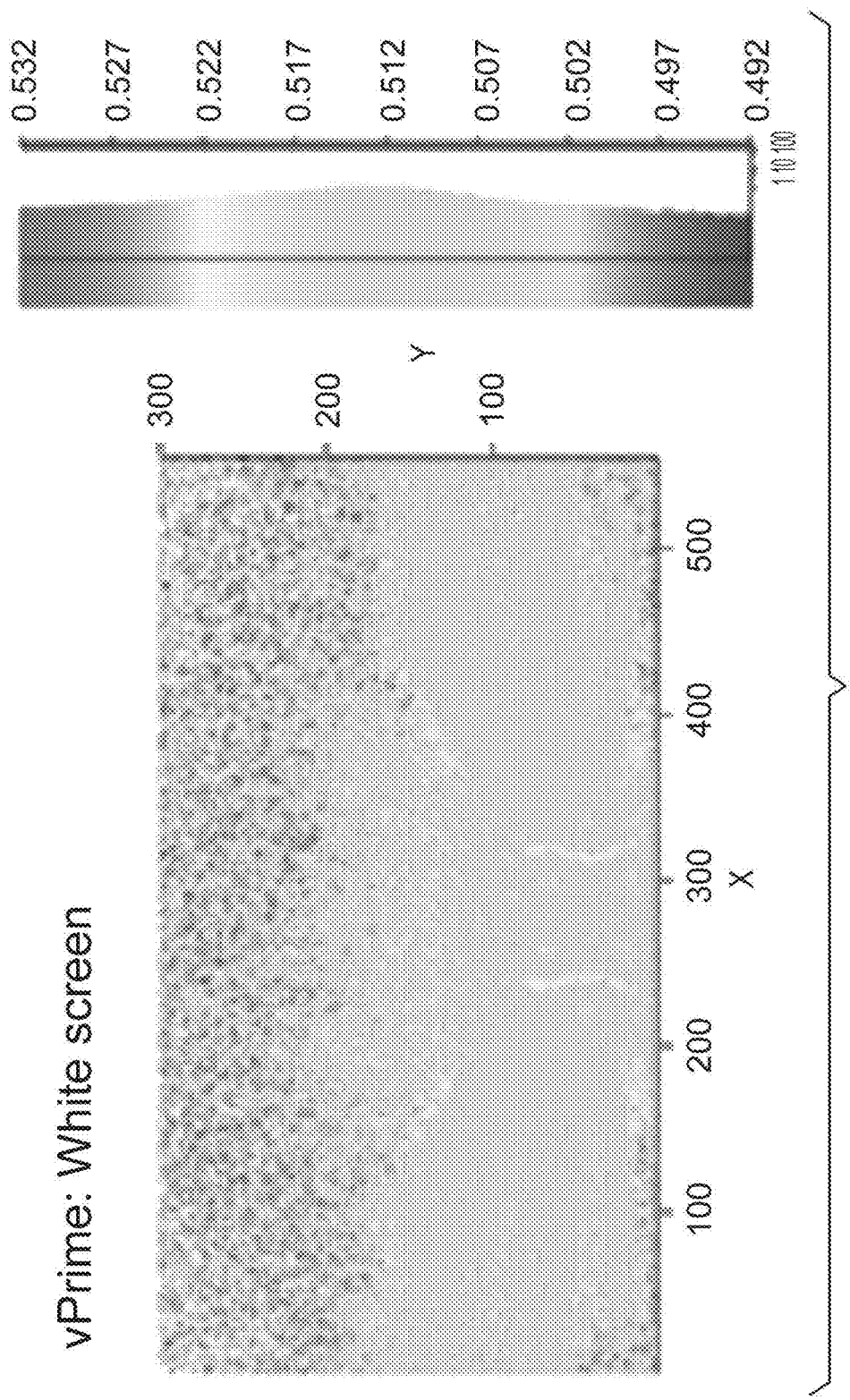
FIG. 98 is an exemplary representation of simulated chromaticity showing a color uniformity achieved with the lens of FIGS. 66 and 82.
Figure 99:
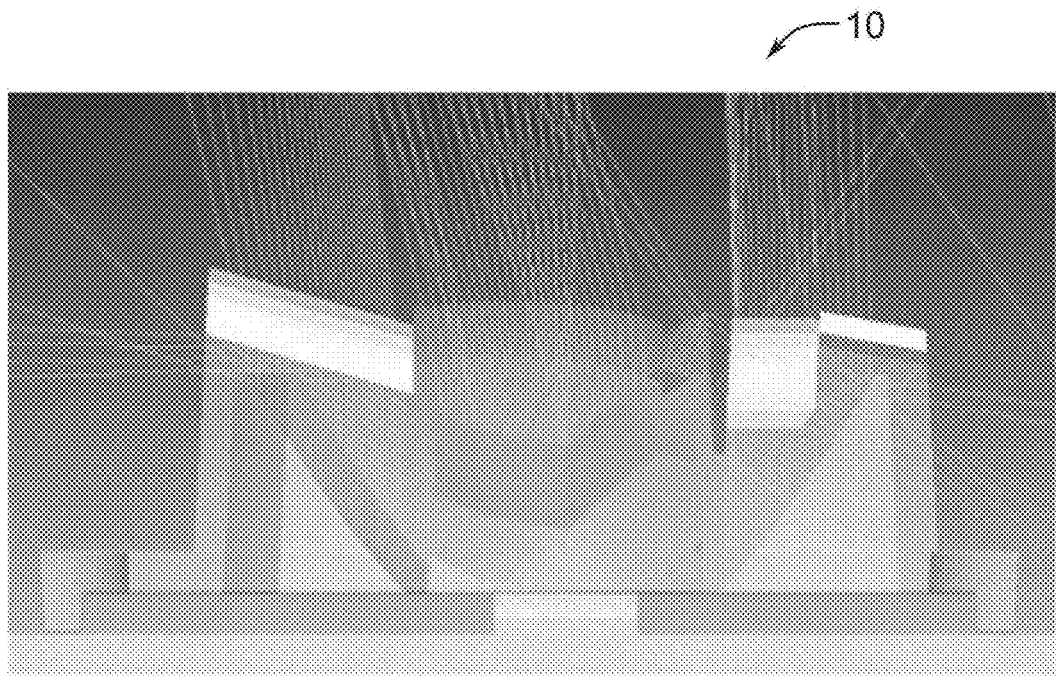
FIG. 99 is an enlarged simplified representation with ray-fan simulation showing light distribution achieved with another exemplary embodiment of a lens according to the present invention in planes substantially parallel to the plane of bilateral symmetry of such lens.
Figure 100:
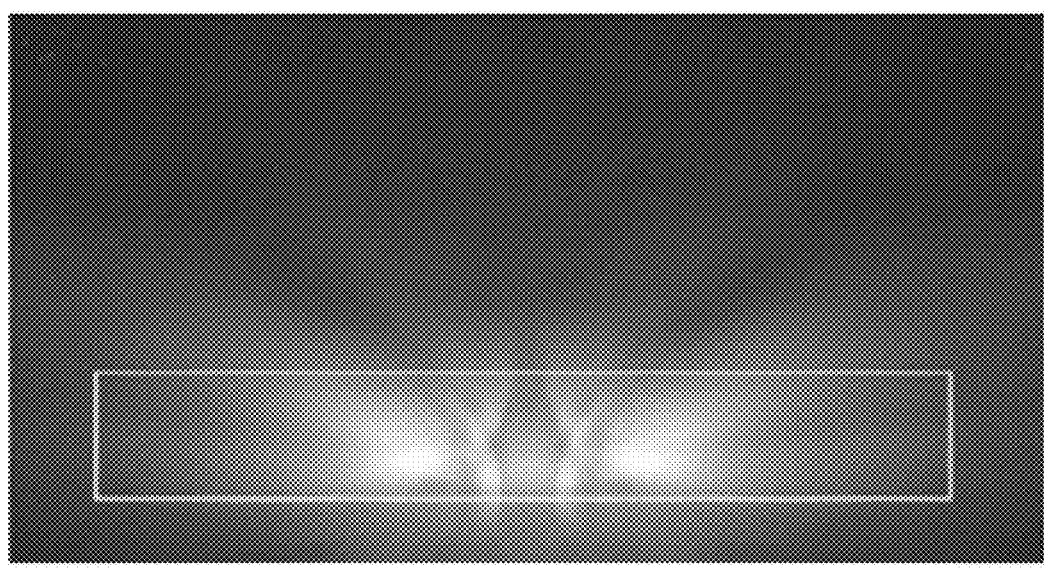
FIG. 100 is an exemplary representation of a simulated illuminance achieved with the lens of FIG. 99.
Figure 101:
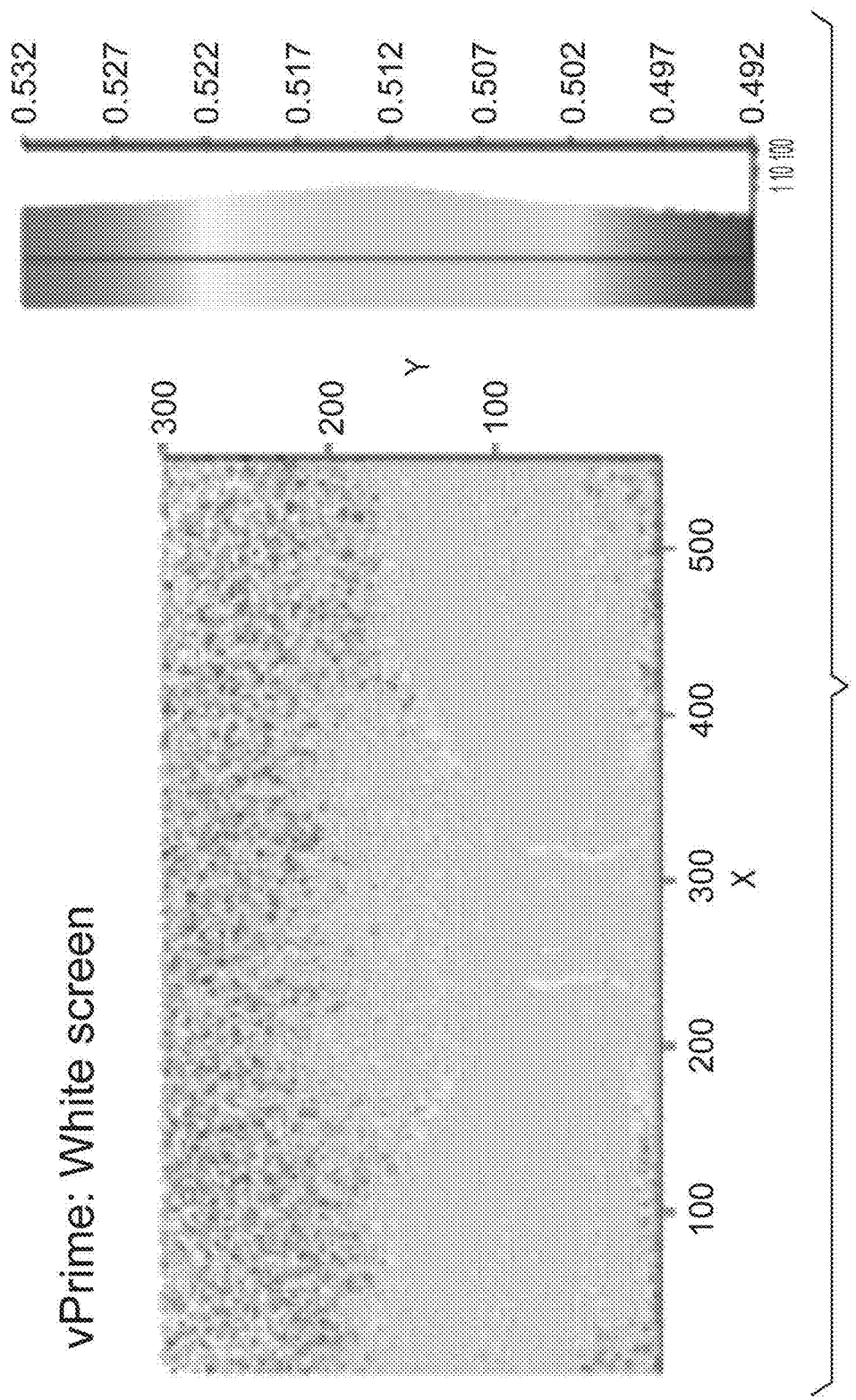
FIG. 101 is an exemplary representation of simulated chromaticity showing a color uniformity achieved with the lens of FIG. 99.

The use of input coupling facets (transverse inner regions 22) combined with an output free-form surface (smooth outer region 35) facilitates direction of the light into a desired illuminance pattern. FIGS. 90 and 91 show the simulated rayfan illustrating the combined effect of the input facets and output free-form surface to spread the light. Both the input facets (transverse inner regions 22D) and the output free-form surface (smooth outer region 35D) utilize primarily refraction to redirect the light into the desired pattern. Alternately or additionally, some or all of the input facets may utilize TIR to redirect light. The free-form surface (smooth outer region 35) could also comprise a geometric surface such as an ellipse, a cylinder, etc. depending on the desired output illuminance profile.

Figure 77:
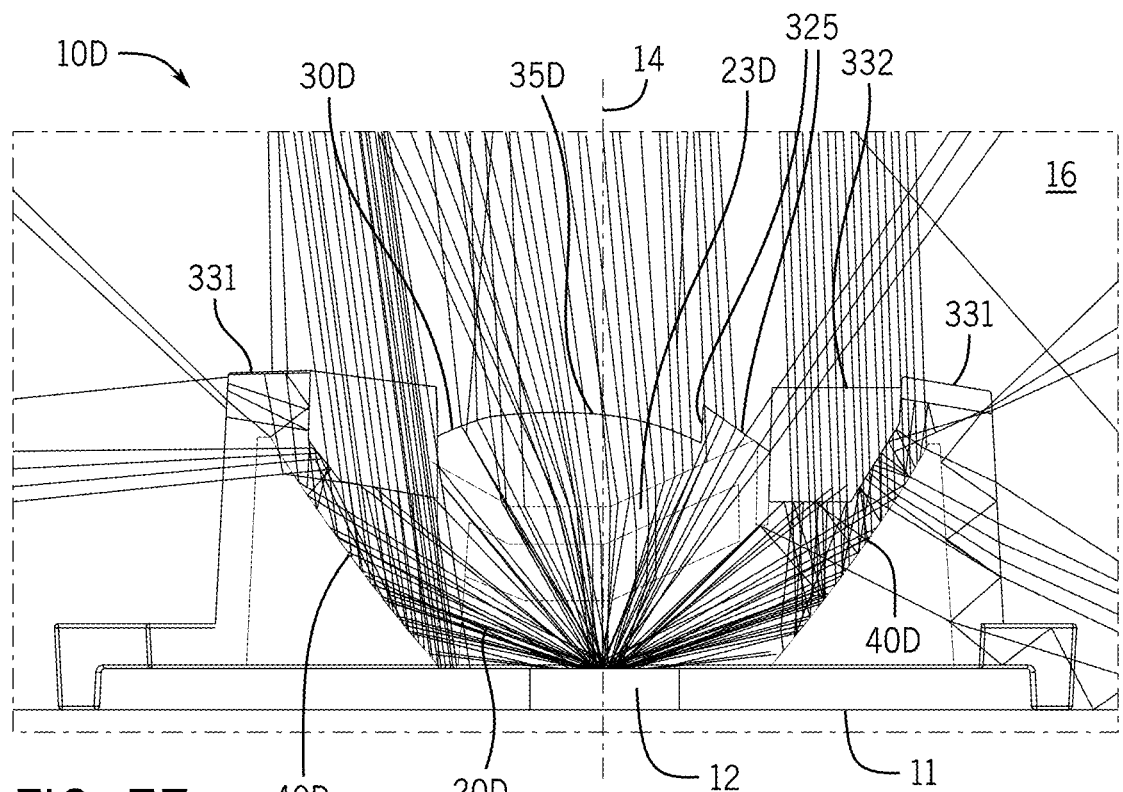
FIG. 77 is an enlarged simplified representation with ray-fan simulation showing light distribution achieved with one example of a lens similar to that of FIG. 66 and having substantially planar transverse inner regions.

FIGS. 67, 69, 70-74 and 77 illustrate lens 10D which includes two secondary surface portions 40D which are separate surfaces substantially opposite each other and each outwardly offset from inner surface 20D. FIG. 77 best illustrates secondary surface portions 40D being configured for total internal reflection (TIR) of light received from inner surface 20D.

The use of opposing TIR reflectors (secondary surfaces 40) is beneficial in achieving a narrow light distribution, as in the case of a Type II roadway optic. This feature has distinct advantages over typical optics for this application that utilize a single TIR reflector (secondary surface 40) in combination with a free-form surface (smooth outer region 35) in that the opposing TIR reflectors 40D serve to effectively limit the light to the desired narrow band, with little light "overflow" or loss. An example of this feature in lens 10D (shown in FIGS. 66-74) can be compared to the single-sided TIR feature 40A of lens 10A (shown in FIGS. 1-9). Some embodiments of this inventive feature may have three or more TIR reflectors arranged in a triangular, square, rectangular, hexagonal or other arrangement. Such arrangements would be useful for creating symmetric or asymmetric distributions where it is important to limit the "overflow" of light beyond specific boundaries such as roadway curbs or to reduce glare due to high-angle light. Correspondingly, a single TIR surface elongated into a circular, elliptical, semi-circular, semi-elliptical, parabolic, etc. profile may be desired to create more rounded illuminance distributions. Certain exemplary embodiments may use four linear or curved TIR surfaces arranged in a square pattern (connected at the corners or separate at the corners), or a circular TIR ring to create a Type V symmetric illuminance distribution for roadways or area lighting.

FIGS. 66-74 show outer surface 30D including outer stepwise discontinuities 33D corresponding to each of secondary surface portions 40D for receiving and further redirecting light received from the corresponding secondary surface portion, as illustrated in FIGS. 77, 84, 87 and 89.

FIGS. 66, 68 and 71-74 show outer surface 30D having two sets of transverse outer regions 323 and 324 forming a corresponding number of distinct outer stepwise discontinuities 331 and 332. Outer stepwise discontinuity 331 is outward of outer stepwise discontinuity 332. Each of outer stepwise discontinuities 331 and 332 are optically aligned over each of secondary surface portions 40D for receiving light reflected or otherwise redirected by corresponding regions of corresponding secondary surface 40D, as shown in FIGS. 77, 84, 87 and 89.

FIGS. 84-89 illustrate how the present invention utilizes sets 323 and 324 of facets positioned directly above a TIR reflector formed by secondary surface 40D which serve to expand light laterally along the roadway parallel to the curb. In this arrangement, the TIR reflector redirects the light "upward" toward the facets as shown in FIGS. 86-89. Each facet has two sides (also referred to as transverse outer regions 32D) sloped at different angles for spreading the light laterally along the roadway.

In traditional Fresnel facets, one side of the facet is usually intended to not interact strongly with the light (typically oriented nearly parallel to the incident rays so as to minimize light loss in unintended directions). Due to fabrication limitations such as the need to avoid "undercuts," this "invisible" facet generally interacts with some light rays and has a negative impact on performance.

In the inventive lens, with the described inventive facet orientation also shown in FIGS. 66, 71, 85, 86 and 88, both sides (transverse outer regions 32D) of each facet redirect light onto the roadway and thus may be optically active with minimal loss. The use of two separate sets of facets at different positions with respect to emitter axis 14, as further shown in FIGS. 66, 68, 71 and 86-89, may ensure that the maximum local thickness of lens 10D above TIR reflector 40D does not exceed the thickness desired for a single-shot molding as mentioned above.

Individual facets (transverse regions 32D) may have a linear profile, or a curved profile to improve illuminance uniformity and color mixing. Additionally or alternatively, the facets may comprise a linear or "straight" extruded element-transverse outer regions 323, or they may comprise a "swept" element where the path of extrusion is curved (as is the case for the input facets-transverse inner regions 22D, seen in FIGS. 70-72) or segmented (e.g., each segment having a differing angular path) to provide additional light control or mixing.

FIGS. 86-89 illustrate simulated ray paths showing lateral light spreading with minimal loss by a set of major facets (stepwise discontinuity 331) and minor facets (outermost outer stepwise discontinuity 332) positioned above the TIR reflector (secondary surface 40D) and oriented such that the ridges (intersecting regions 34D) are perpendicular to the "curb" of the roadway.

FIGS. 66, 68, 71, 86 and 88, show sets 331 and 332 of outer stepwise discontinuities 33D as substantially planar surfaces which extend to straight intersection regions 34D parallel to each other and extending in planes substantially parallel to plane 16 of bilateral symmetry of lens 10D.

Figure 66:
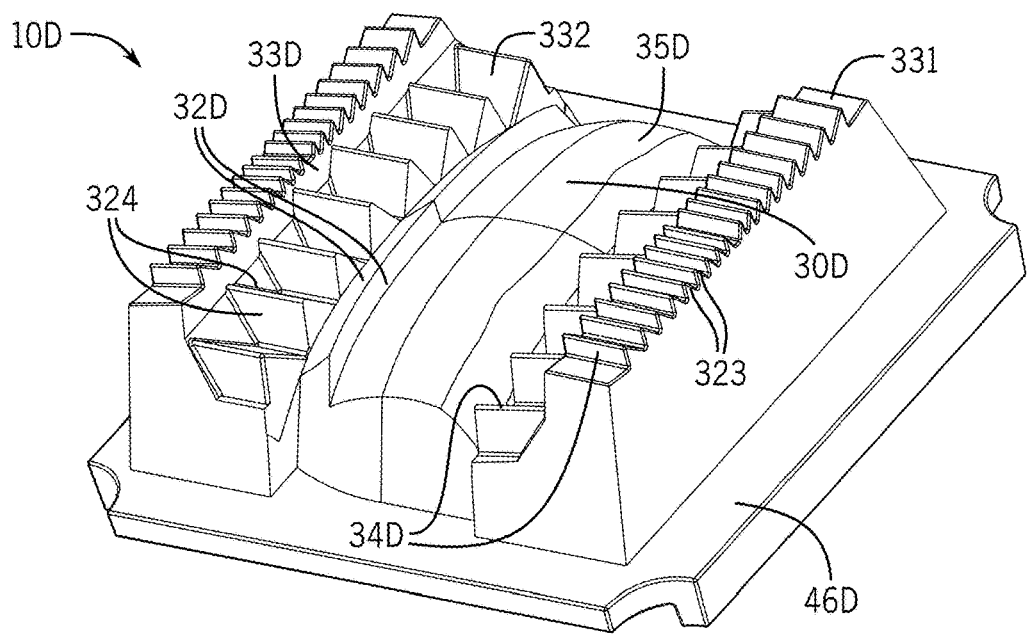
FIG. 66 is an enlarged opaque perspective view from a light-output side of yet another embodiment of the inventive lens.
Figure 67:
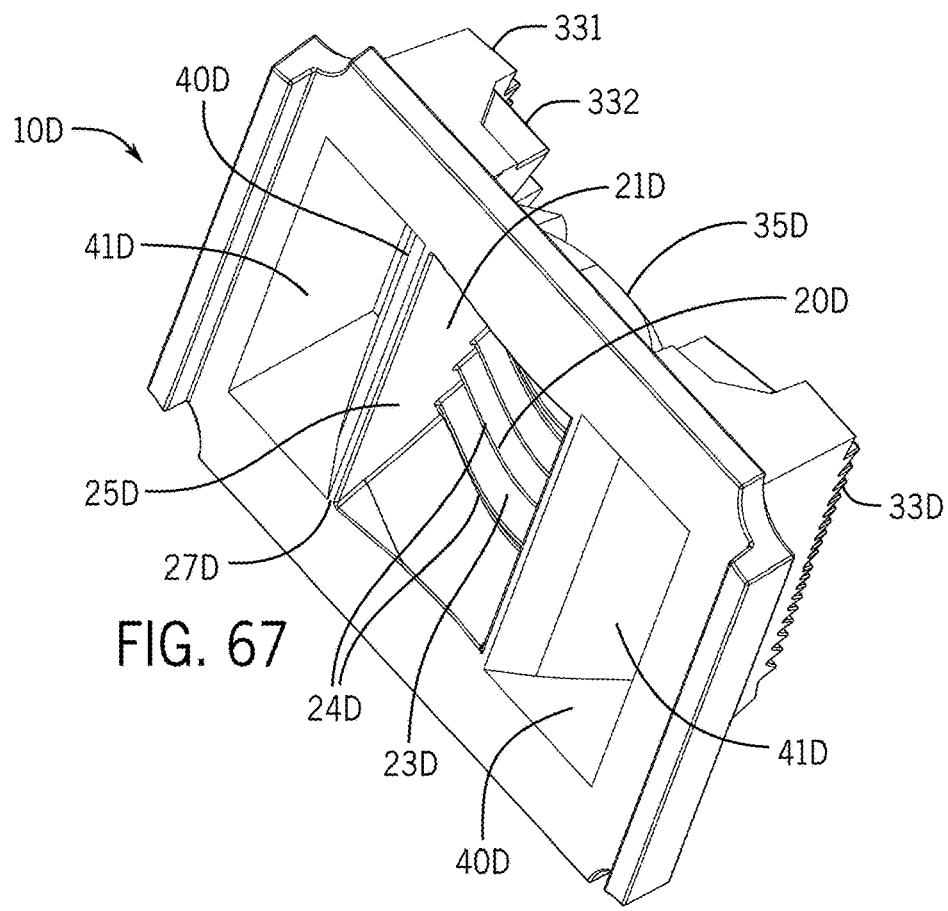
FIG. 67 is an enlarged opaque perspective view from a light-input side of the lens of FIG. 66.
Figure 68:
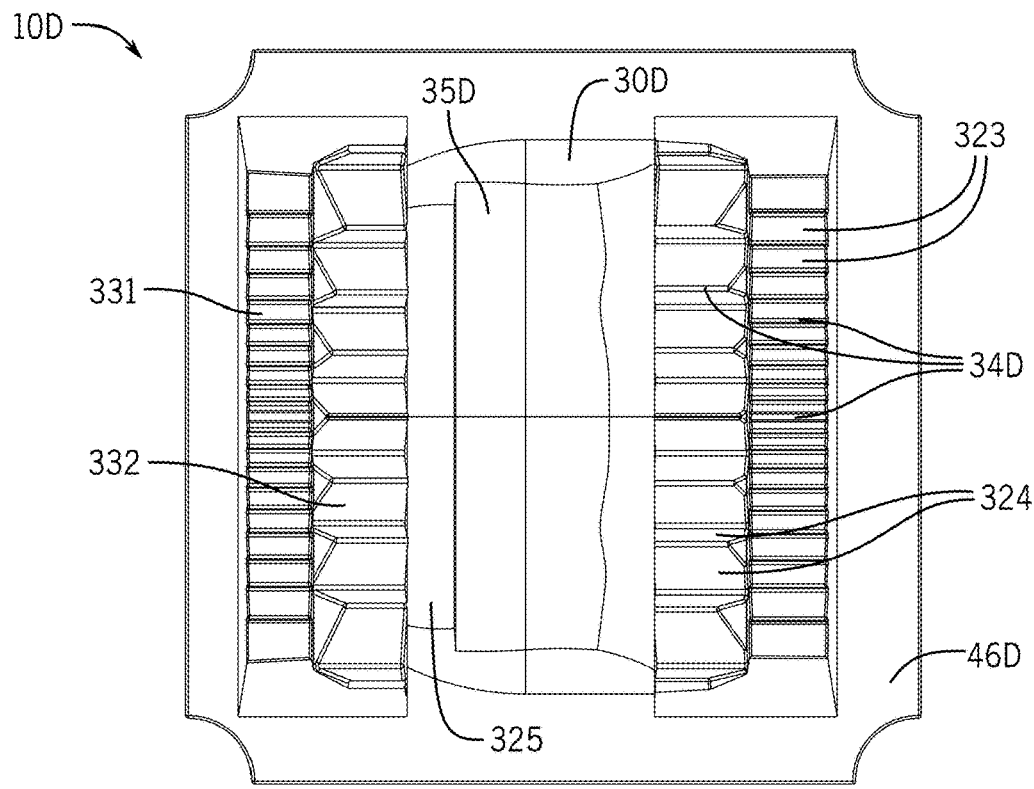
FIG. 68 is an enlarged opaque light-output plan view of the lens of FIG. 66.
Figure 69:
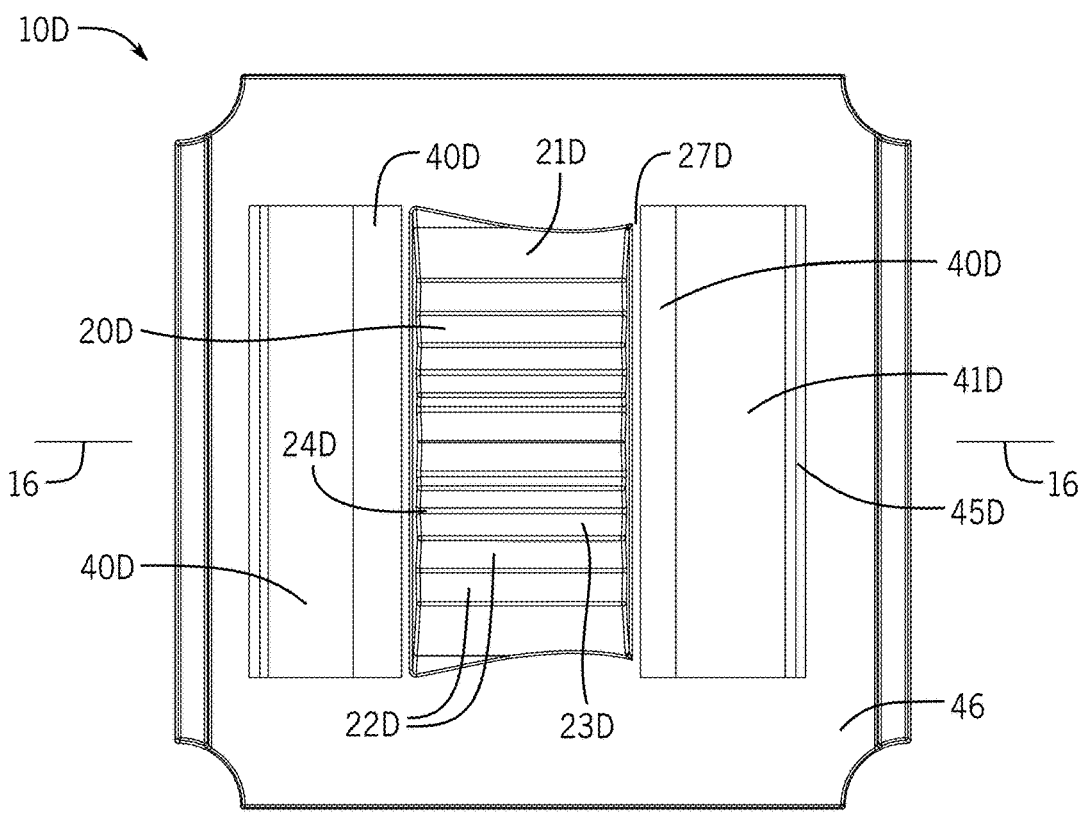
FIG. 69 is an enlarged opaque light-input plan view of the lens of FIG. 66.
Figure 70:
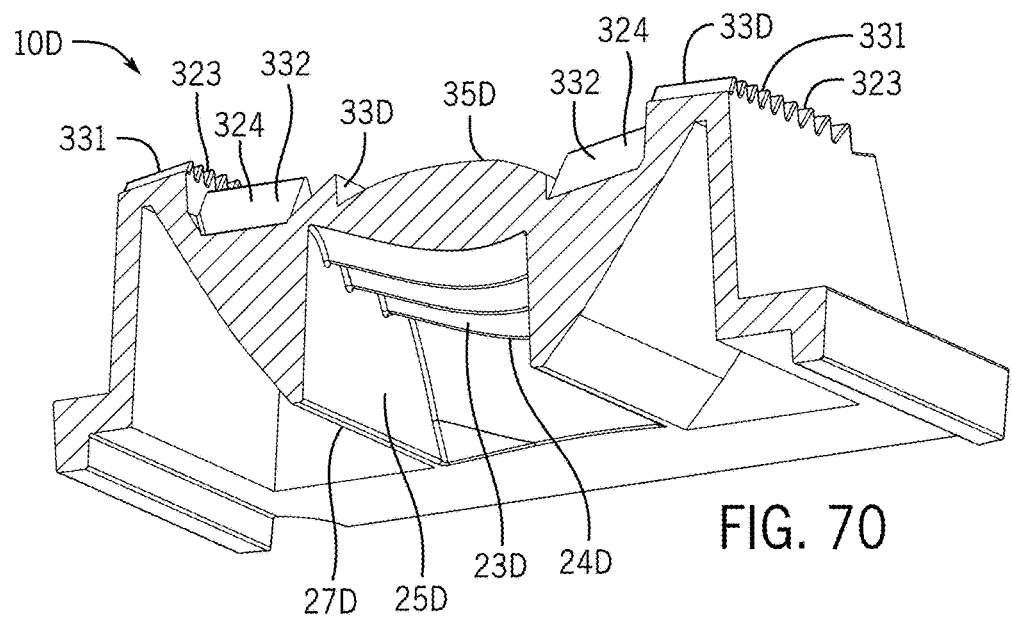
FIG. 70 is an enlarged opaque perspective cross-sectional view from a light-input side of the lens of FIG. 66, taken along a plane of bilateral symmetry of the lens.
Figure 71:
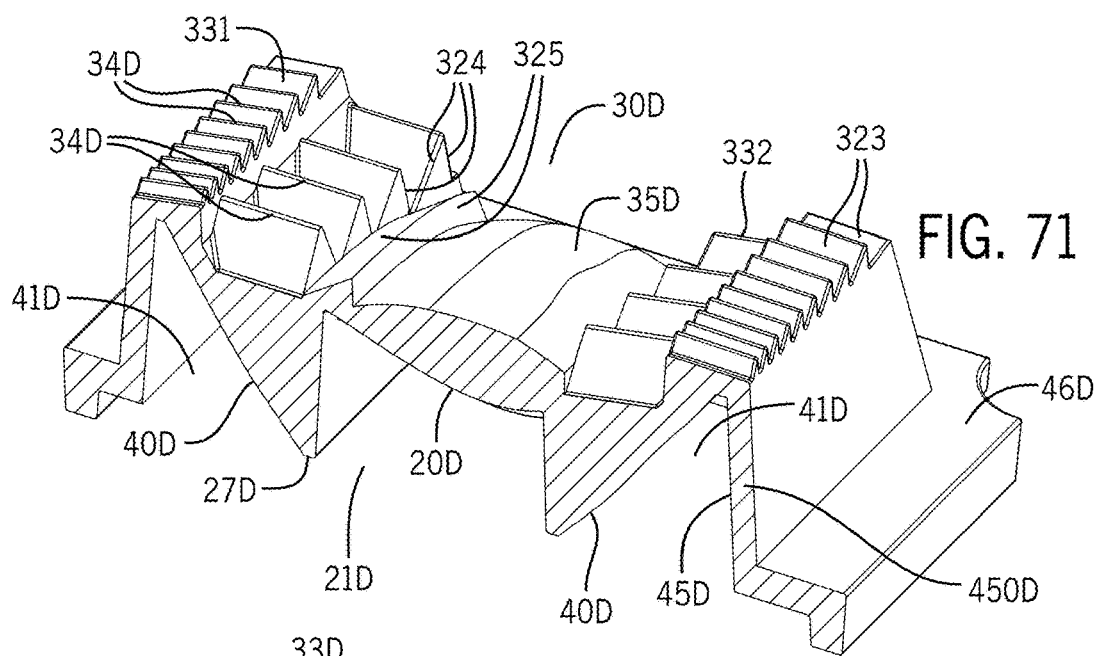
FIG. 71 is an enlarged opaque perspective cross-sectional view from a light-output side of the lens of FIG. 66, taken along a plane of bilateral symmetry of the lens.
Figure 72:
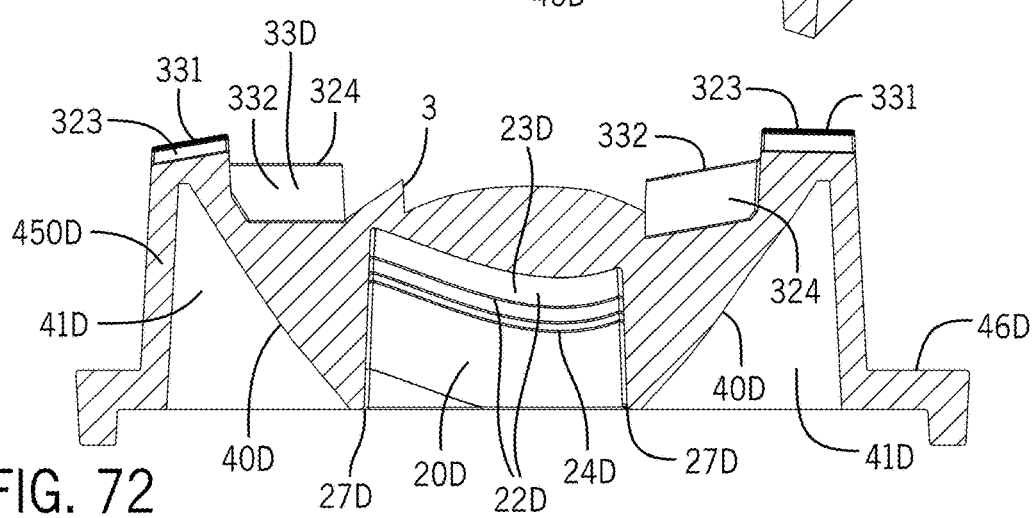
FIG. 72 is an enlarged opaque cross-sectional view of the lens of FIG. 66, shown in the plane of bilateral symmetry of the lens.
Figure 73:
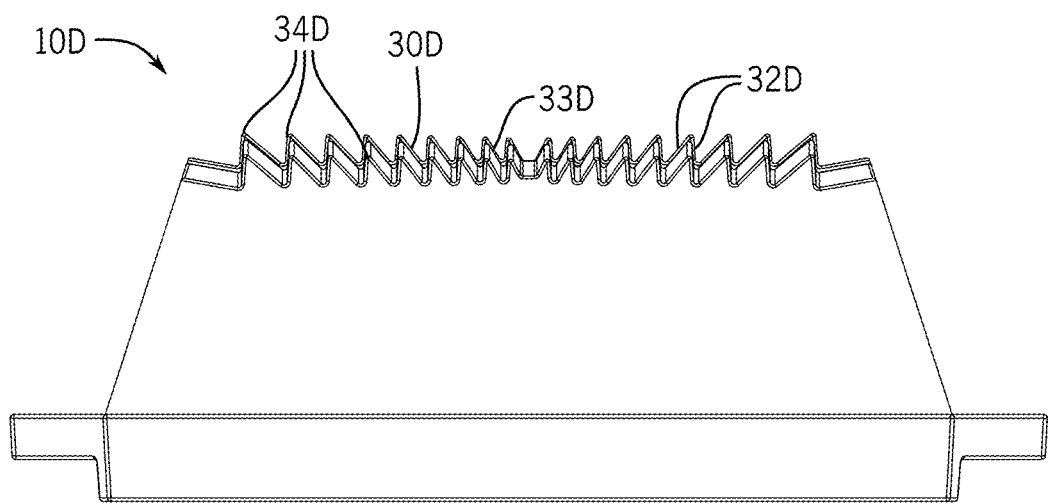
FIGS. 73 and 74 are enlarged opaque views of opposite sides along the plane of bilateral symmetry of the lens of FIG. 66.
Figure 74:
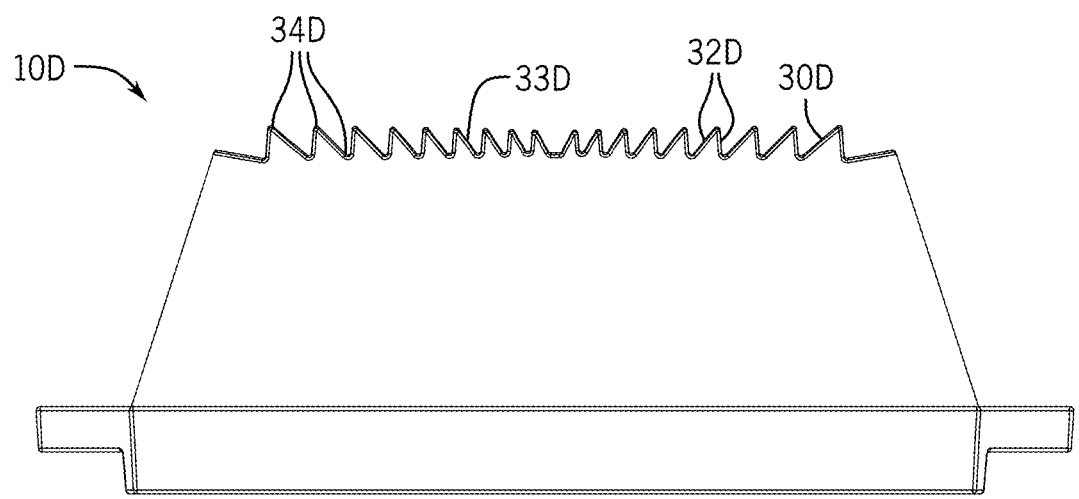
Figure 75:
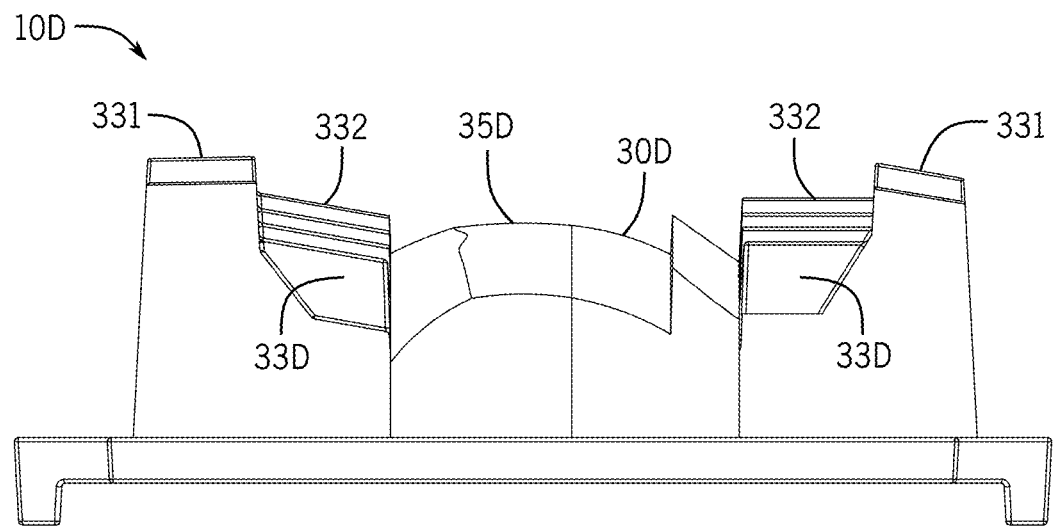
FIGS. 75 and 76 are enlarged opaque views of opposite sides substantially orthogonal to the plane of bilateral symmetry of the lens of FIG. 66.
Figure 76:
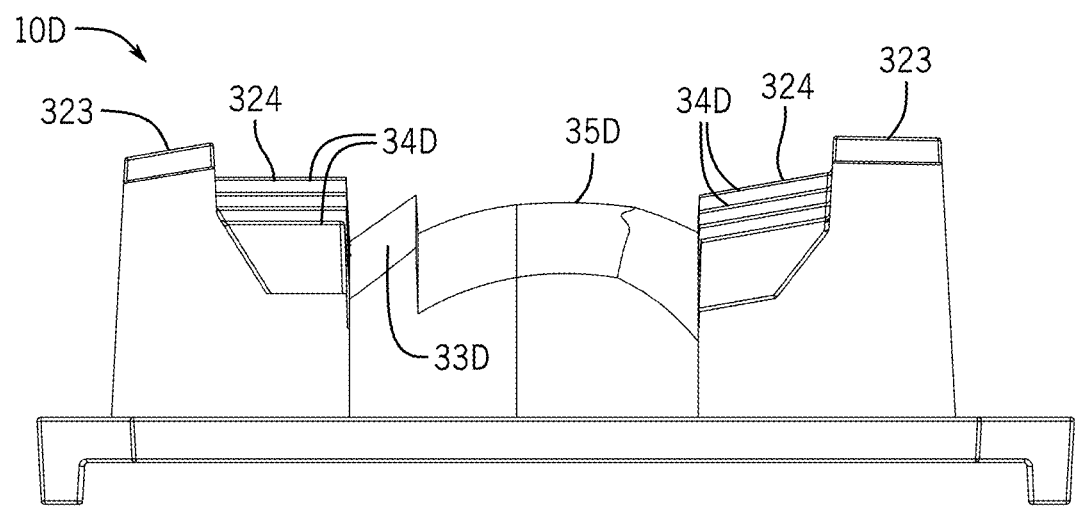

As best seen in FIGS. 66 and 68, outermost set 331 of outer stepwise discontinuities 331D is shown to be formed by transverse outer regions 323 which in axially-parallel planes orthogonal to plane 16 has cross-sectional dimensions smaller than cross-sectional dimensions of transverse outer regions 323 of set 324 of the outer stepwise discontinuities 332D which is closer to emitter axis 12 than outwardmost set 331 of the outer stepwise discontinuities 331D. Outwardmost set 331 of outer stepwise discontinuities 331D is also shown to be formed by a greater number of transverse outer regions 324.

In summary, the present invention utilizes a "hybrid" combination of faceted Fresnel-like surfaces, surfaces configured for total-internal-reflection (TIR), and smooth surfaces (e.g., parabolic, elliptical, free-form, etc.) to create complex illuminance distributions such as those required for streetlight illumination.

The term "smooth," as used herein with respect to lens surfaces, means having an even and regular surface or consistency free from facets, discontinuities and perceptible projections, lumps or indentations. Smooth surfaces can be, e.g., parabolic, elliptical, cylindrical, free-form, etc.

Potential advantages of the present invention include a low profile and more compact lens geometry for applications with space constraints.

Figure 25:
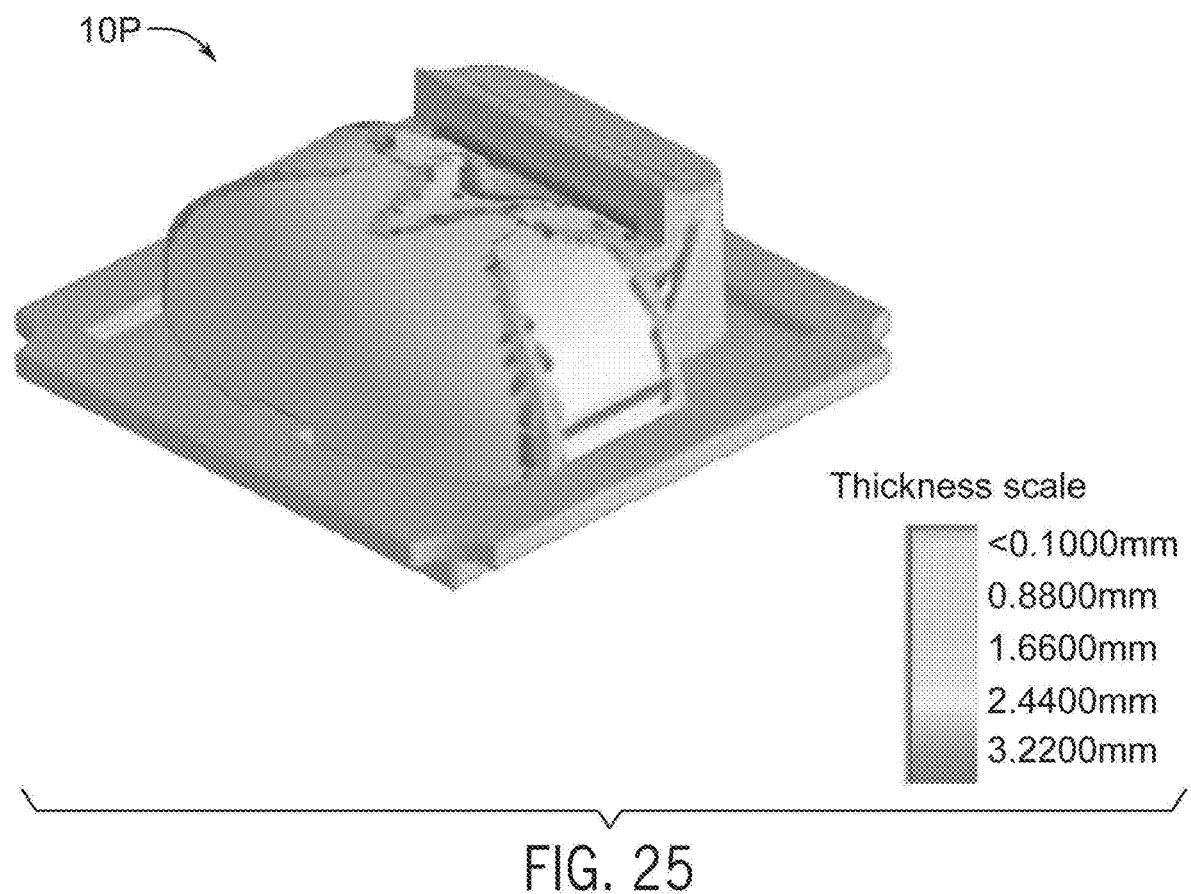
FIG. 25 is a light-output side perspective view illustrating thickness analysis of the lens of FIG. 24, for comparison with FIG. 23, lightest areas represent local thickness in excess of 4 mm.
Figure 26:
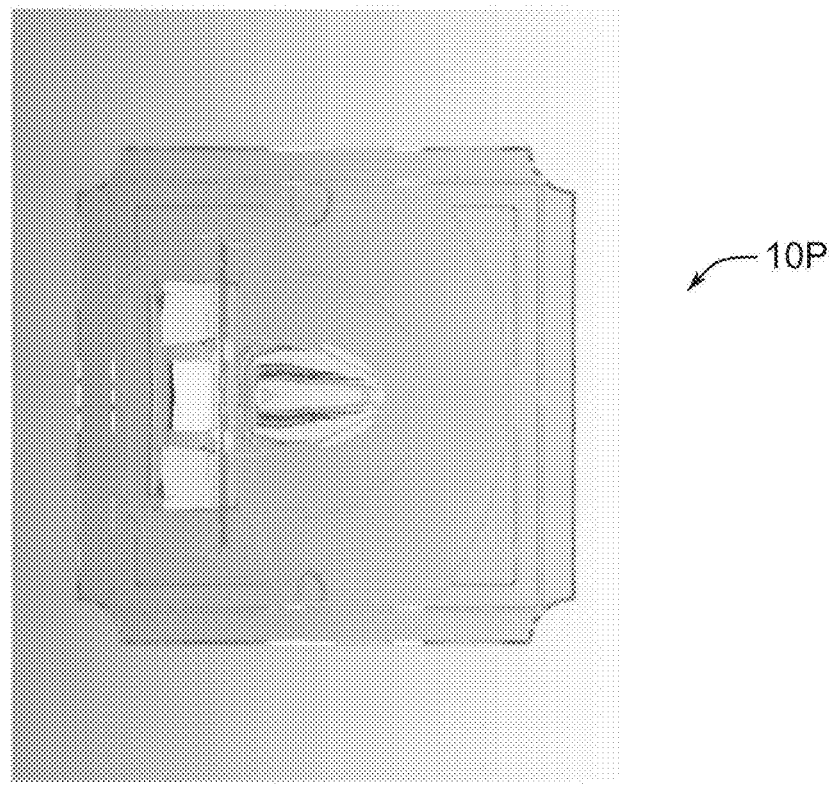
FIG. 26 is a simulated lit rendering or an illuminated near-field appearance of the lens shown in FIGS. 24 and 25, representing areas that would appear lit or bright when viewing the lens directly, to show comparison with the inventive lens illustrated in FIG. 23.
Figure 27:
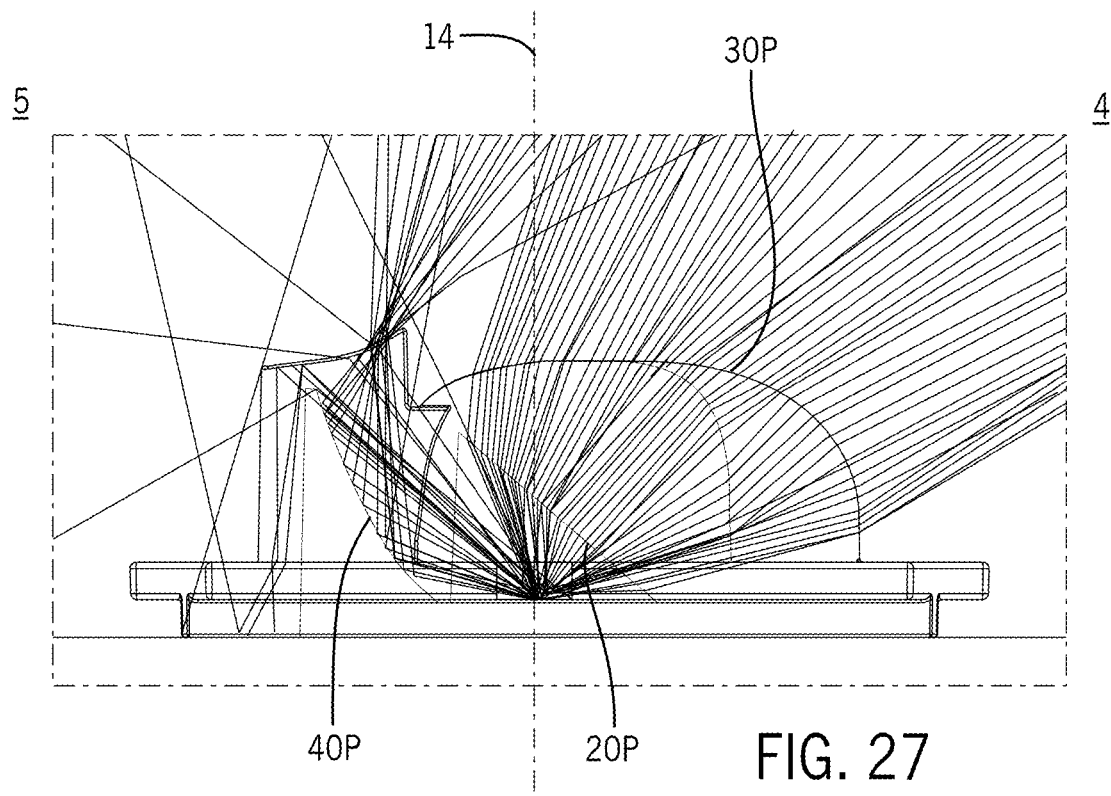
FIG. 27 is an enlarged simplified representation with ray-fan simulation showing light distribution achieved with the lens of FIGS. 24-26 primarily in the plane of bilateral symmetry of the lens.
Figure 28:
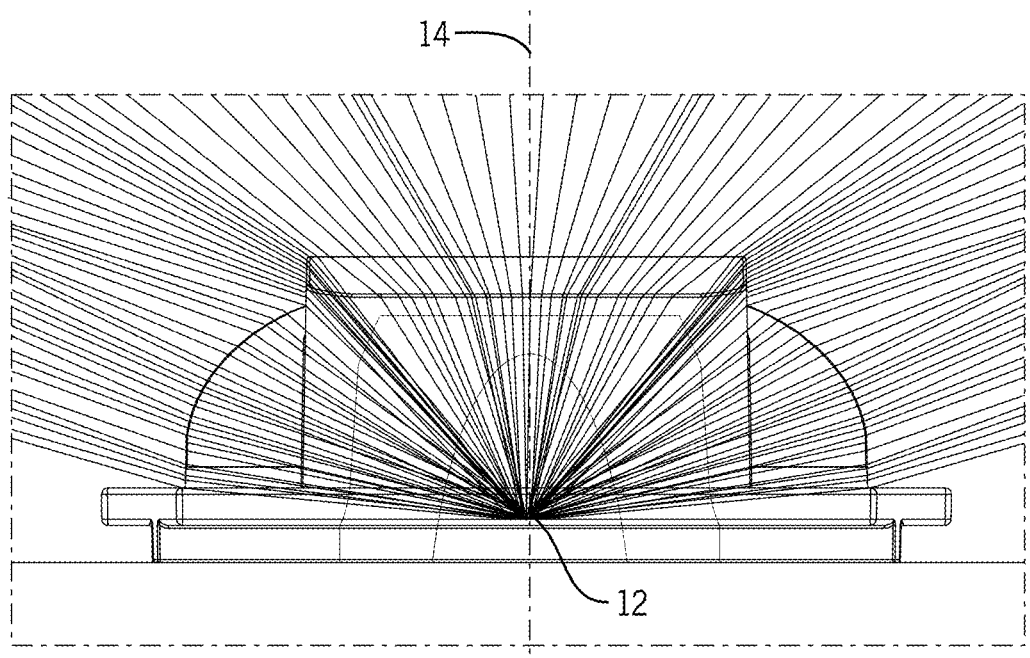
FIG. 28 is an enlarged simplified representation with ray-fan simulation showing light distribution achieved with the lens of FIG. 24-27 in planes orthogonal to the plane of bilateral symmetry of the lens.
Figure 29:
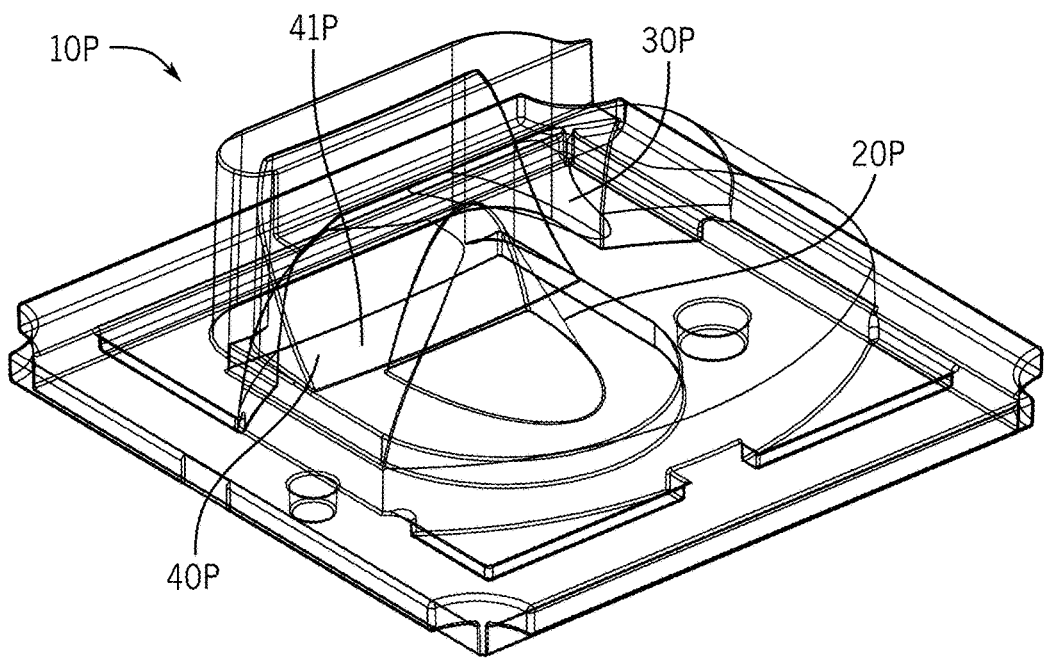
FIG. 29 is an enlarged transparent perspective view from a light-output side of the lens of FIG. 25.
Figure 30:
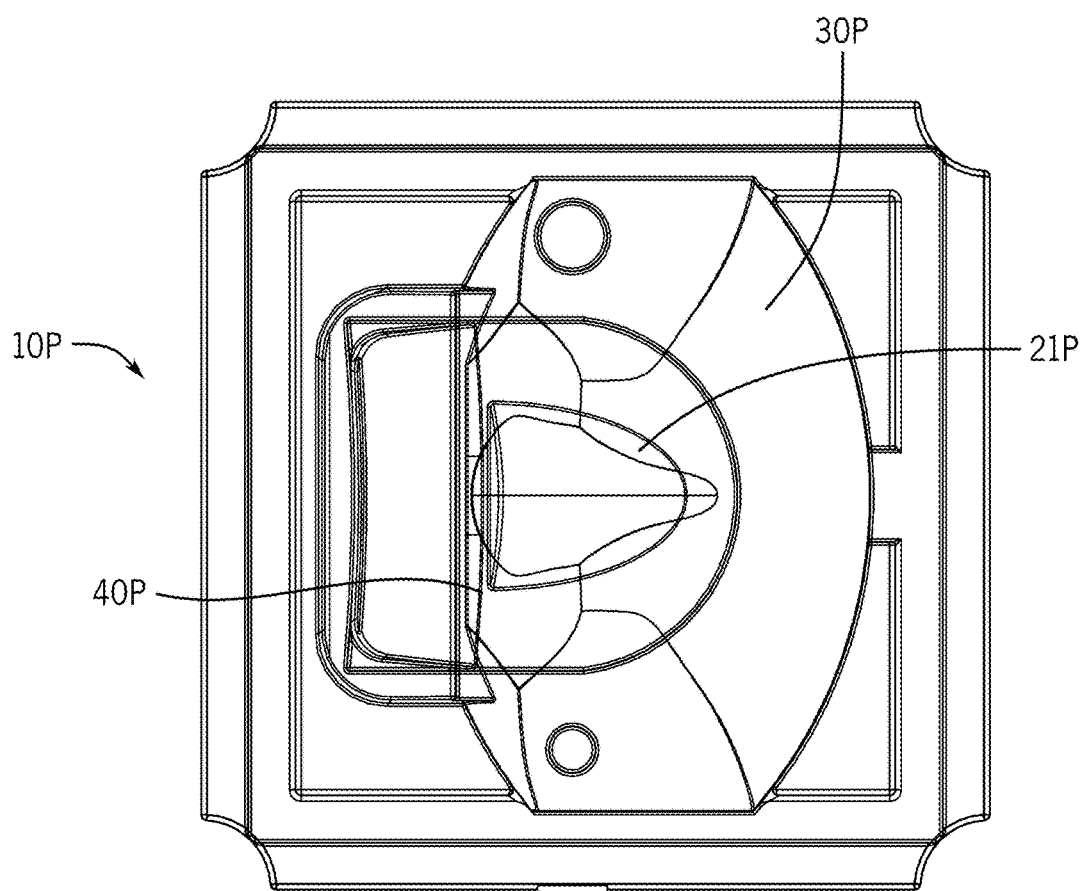
FIG. 30 is an enlarged transparent plan view of the lens of FIG. 29.
Figure 31:
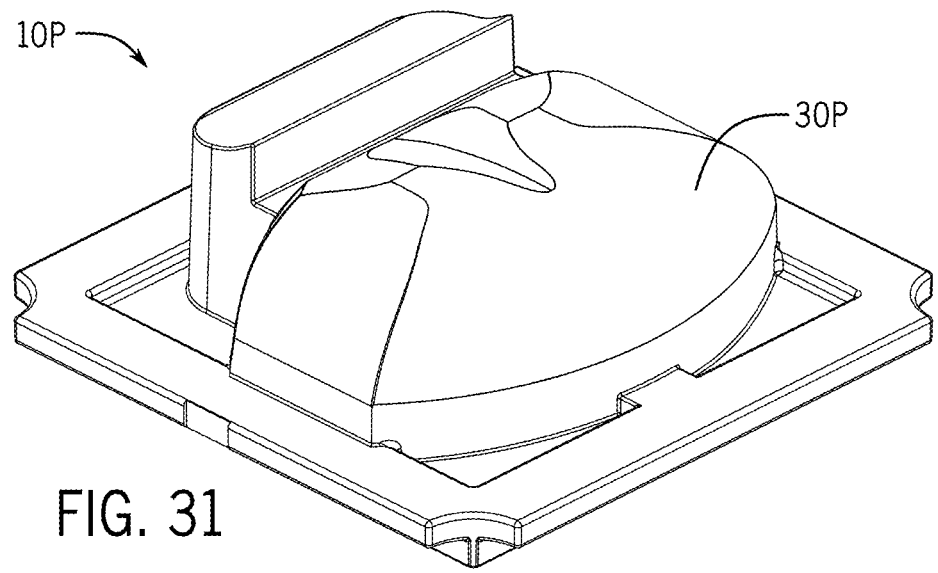
FIG. 31 is an enlarged opaque perspective view from a light-output side of the lens of FIG. 29.
Figure 32:
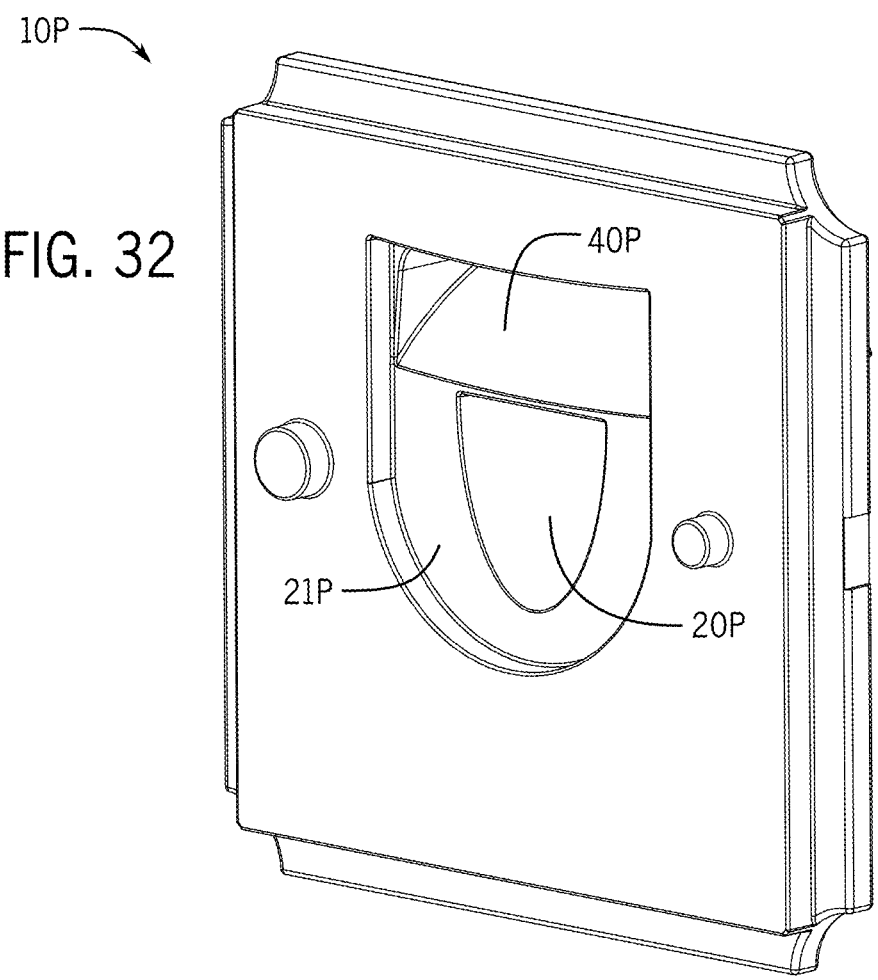
FIG. 32 is an enlarged opaque perspective view from a light-input side of the lens of FIG. 29.
Figure 33:
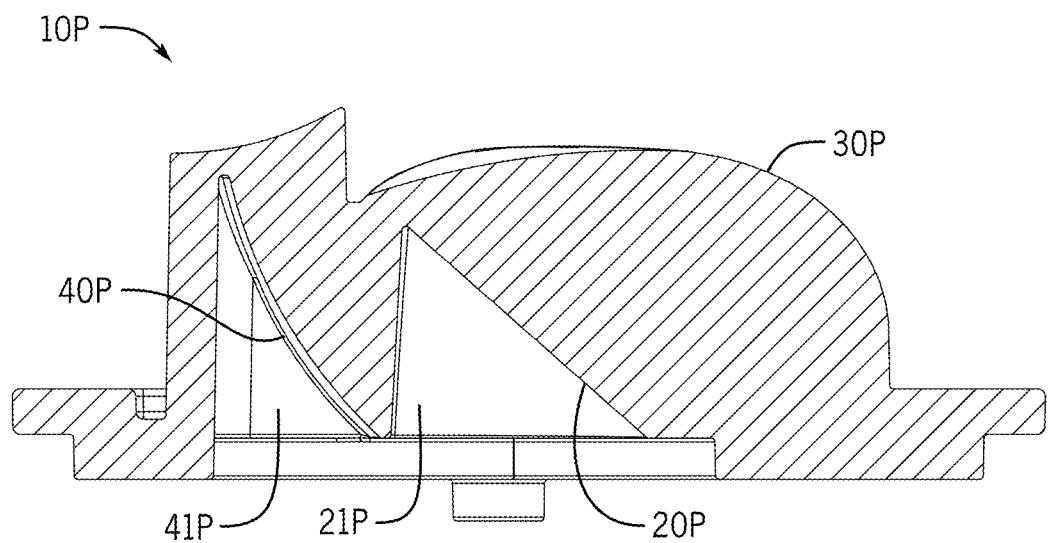
FIG. 33 is another enlarged opaque cross-sectional view of the lens of FIGS. 25-32, shown from an opposite side of the view in FIG. 24.
Figure 34:
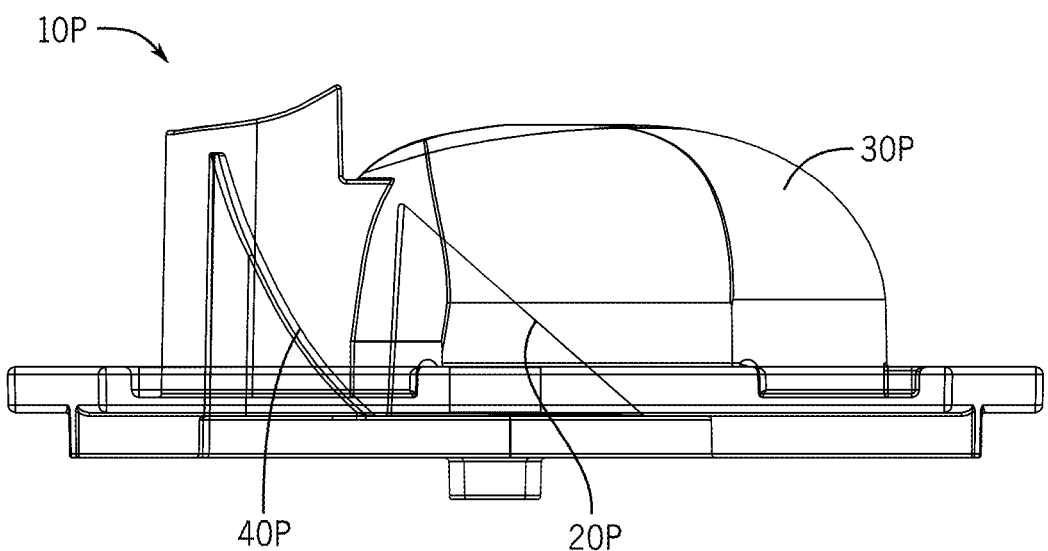
FIG. 34 is an enlarged transparent lateral side view of the lens of FIGS. 24-33.
Figure 35:
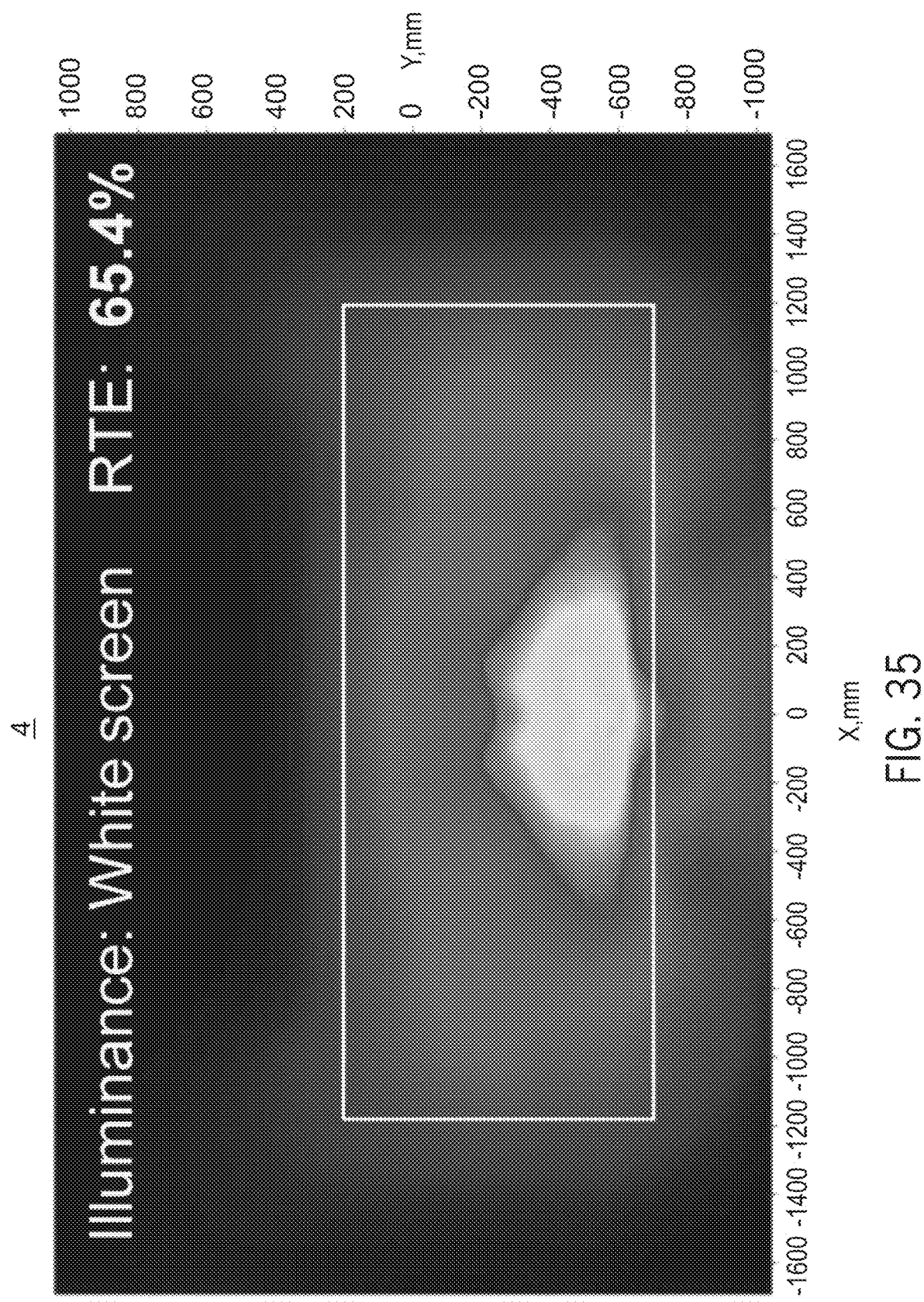
FIGS. 35-37 are exemplary representations of simulated illuminance achieved with the lens of FIG. 31.
Figure 36:
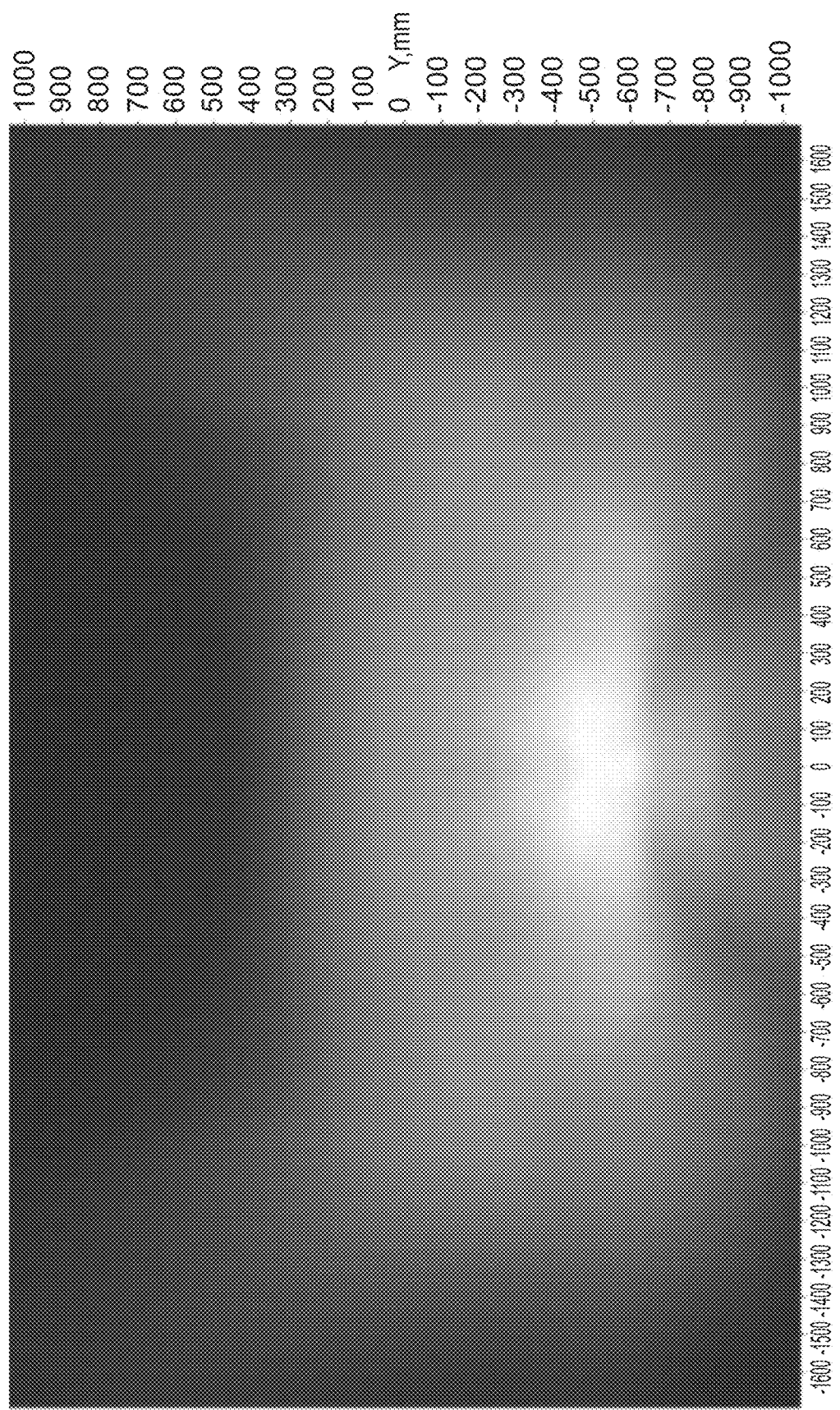
Figure 37:
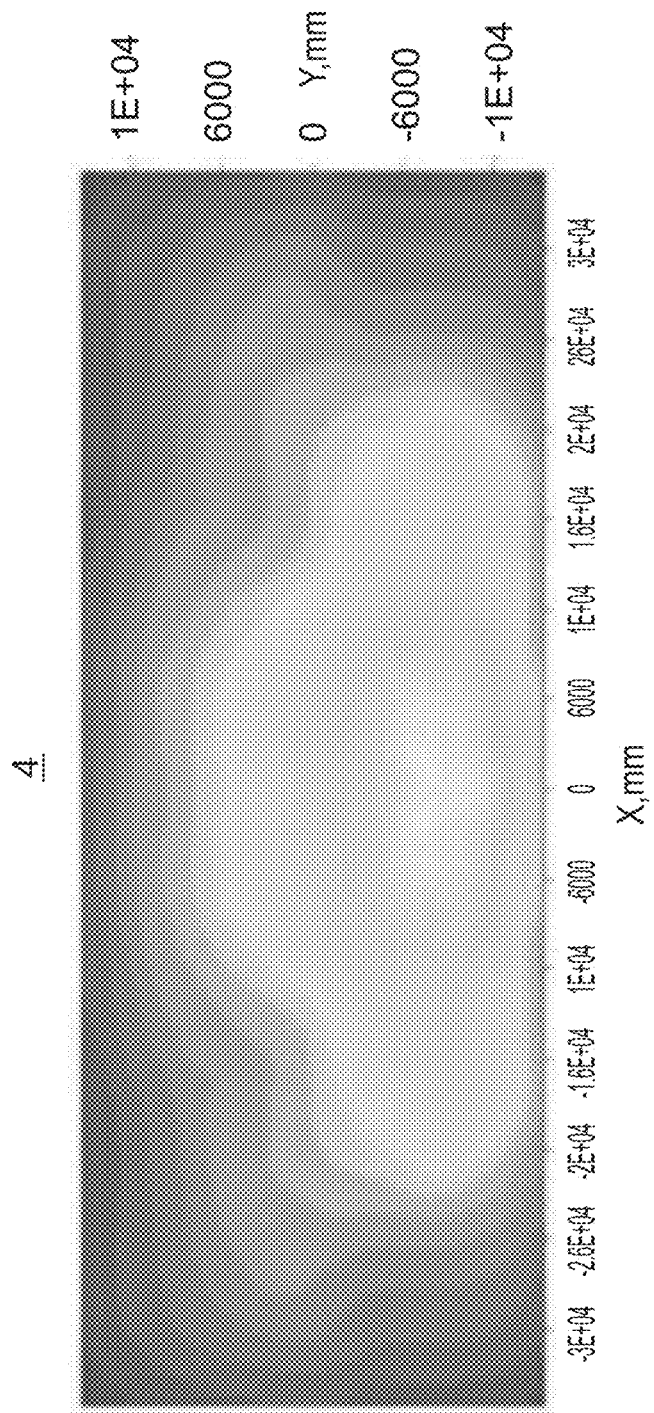
Figure 39:
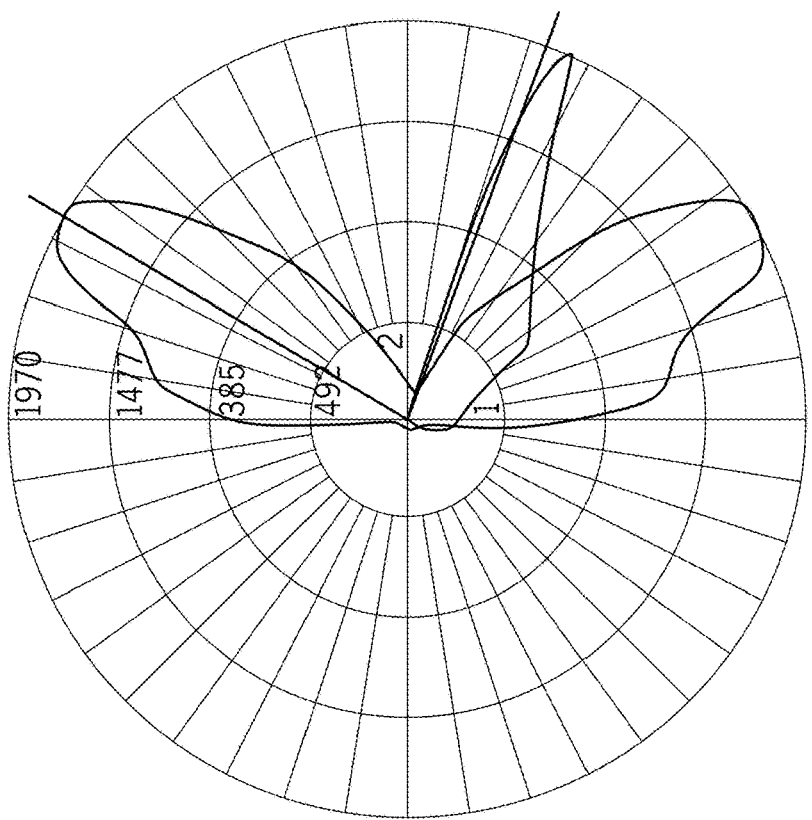
FIG. 39 is an exemplary representation of a simulated candela plot achieved with the lens of FIG. 31, graph 1 showing a vertical plane such as a plane including or substantially parallel to the emitter axis, graph 2 showing a horizontal cone.
Figure 38:
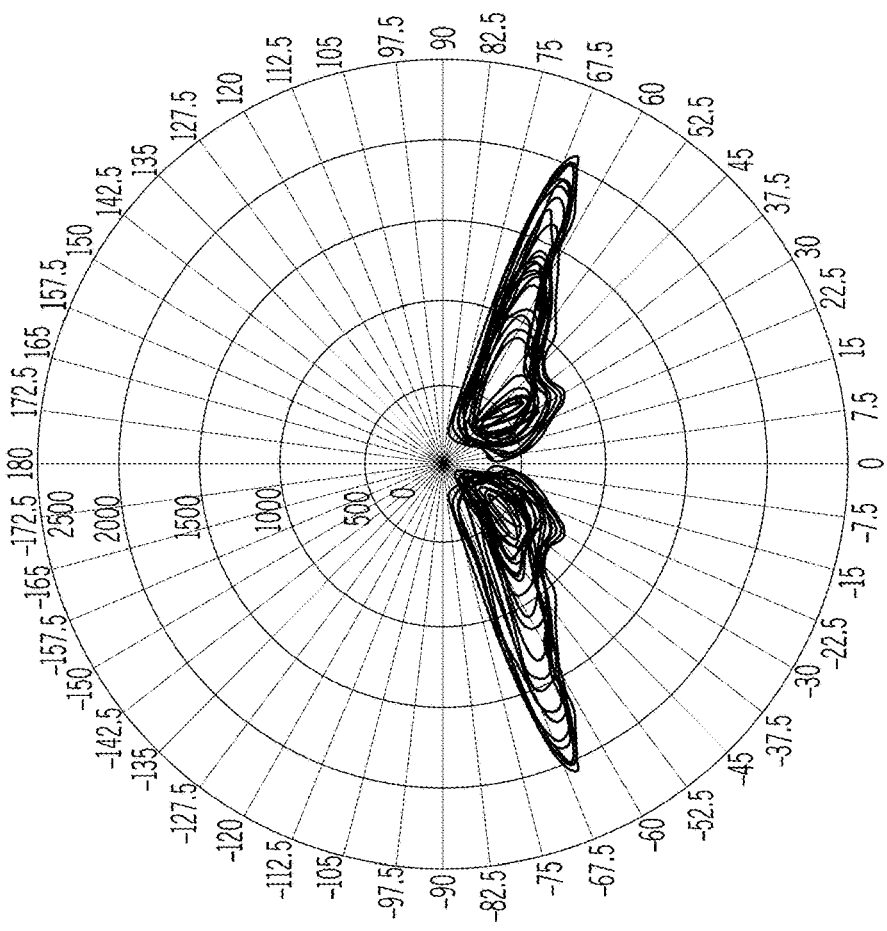
FIG. 38 is an exemplary representation of a simulated intensity distribution achieved with the lens of FIG. 31.
Figure 40:
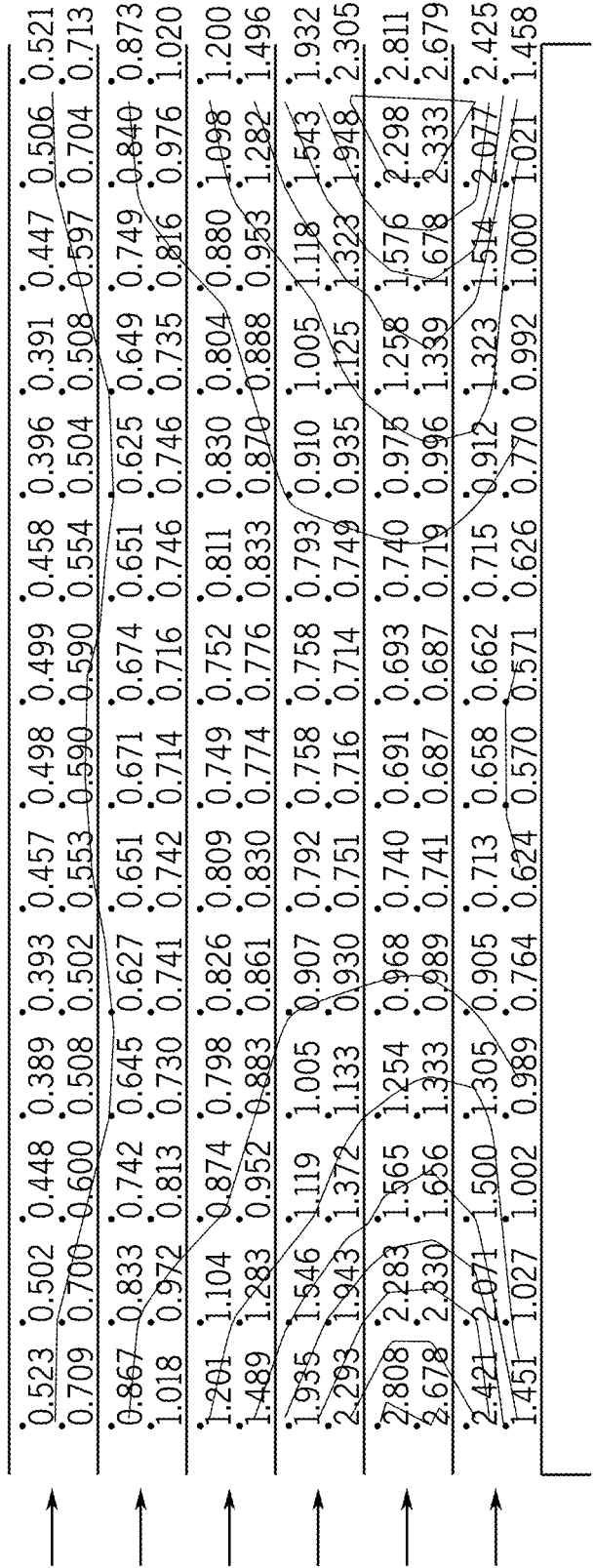
FIG. 40 is an exemplary representation of a simulated light distribution pattern achieved on an exemplary working plane with luminaries utilizing the lens of FIG. 31.
Figure 41:
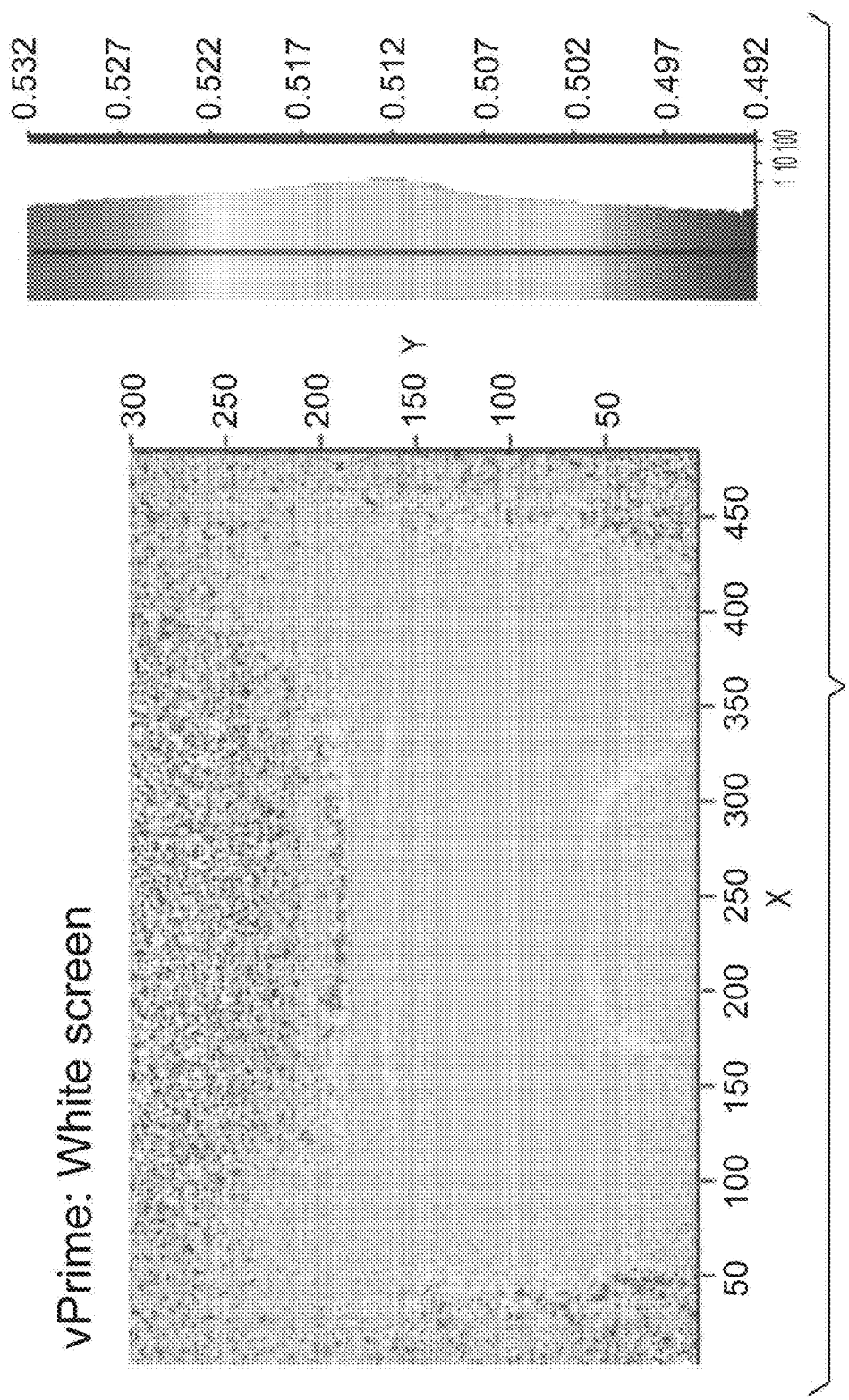
FIG. 41 is an exemplary representation of simulated chromaticity showing a color uniformity achieved with the lens of FIG. 31.
Figure 42:
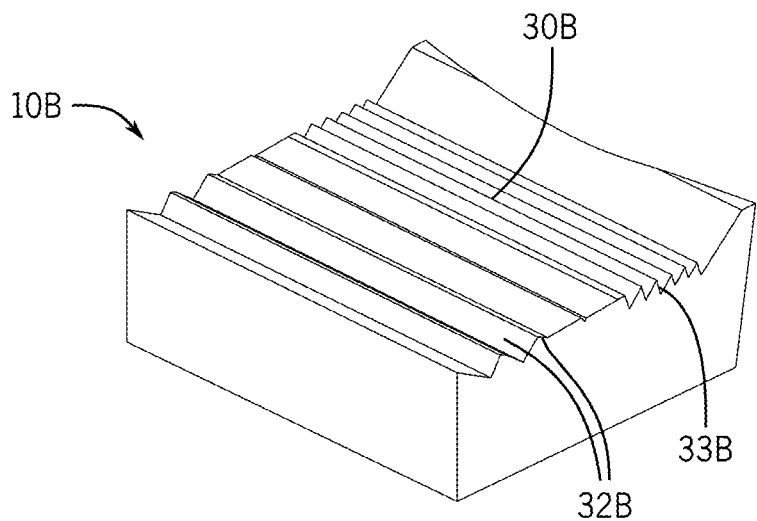
FIG. 42 is an enlarged opaque perspective view from a light-output side of another embodiment of the inventive lens.
Figure 43:
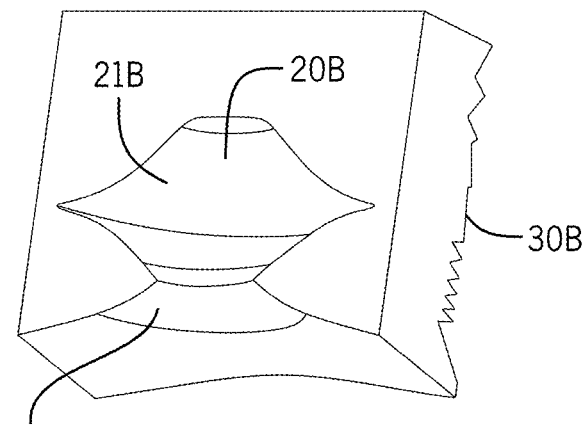
FIG. 43 is an enlarged opaque perspective view from a light-input side of the lens of FIG. 42.
Figure 44:
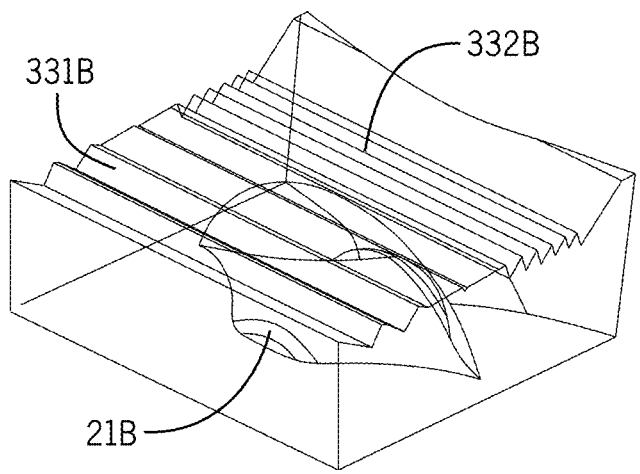
FIG. 44 is an enlarged transparent perspective view from a light-output side of the lens of FIG. 42.
Figure 45:
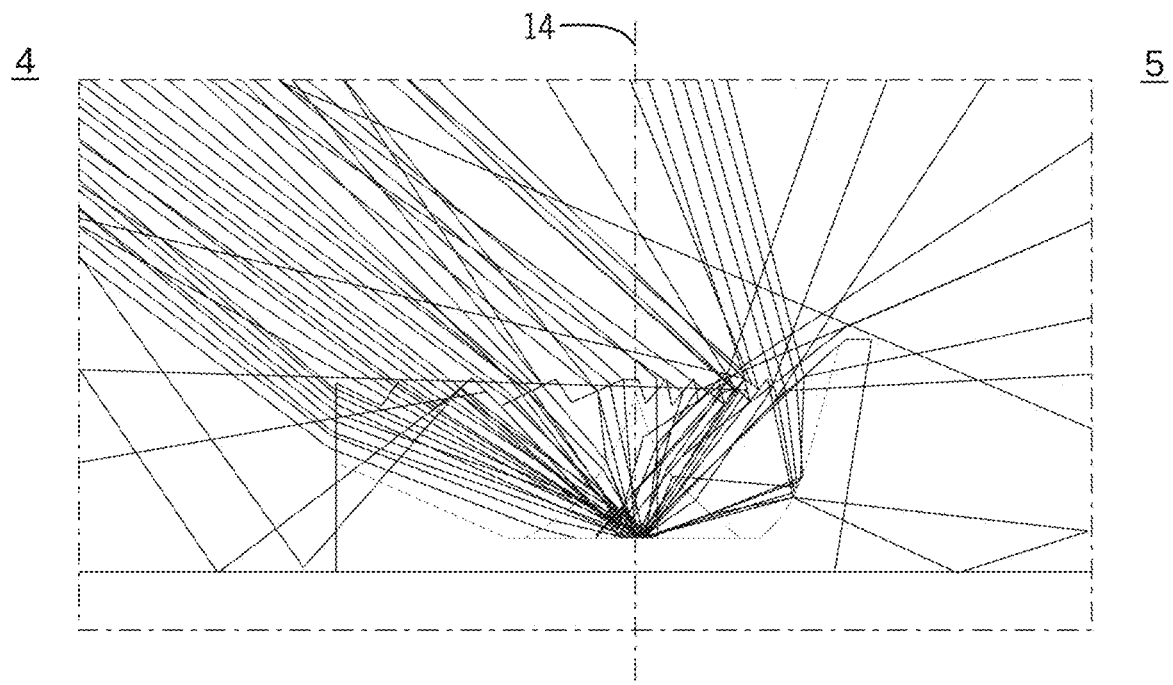
FIG. 45 is an enlarged simplified representation with ray-fan simulation showing light distribution achieved with the lens of FIG. 42 primarily in the plane of bilateral symmetry of the lens.
Figure 46:
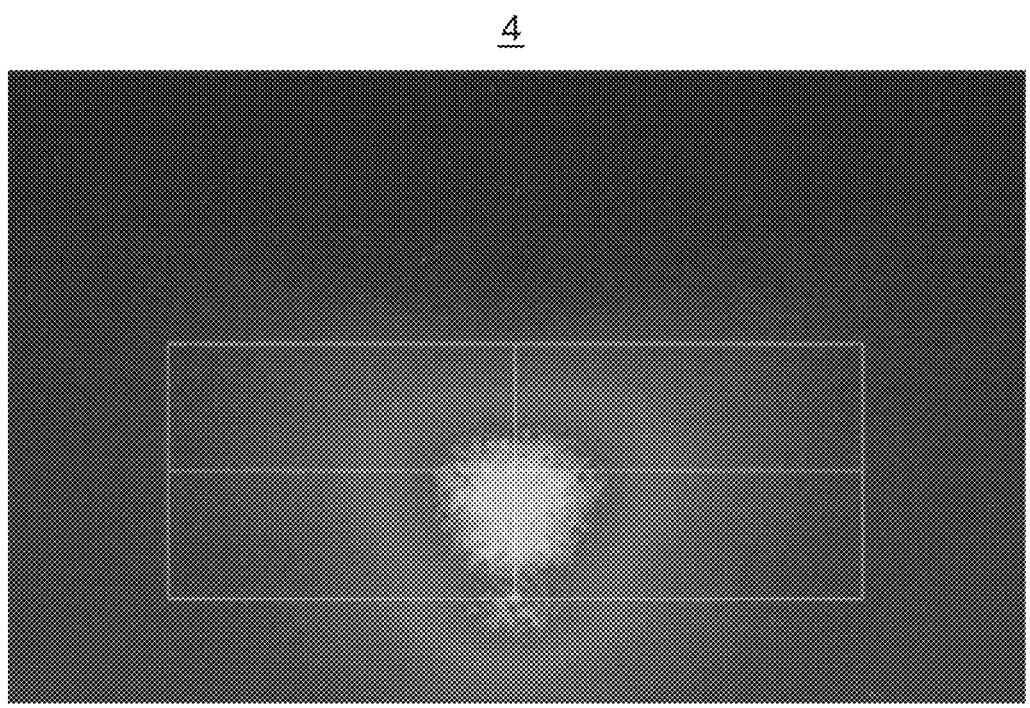
FIG. 46 is an exemplary representation of simulated illuminance achieved with the lens of FIG. 42.
Figure 47:
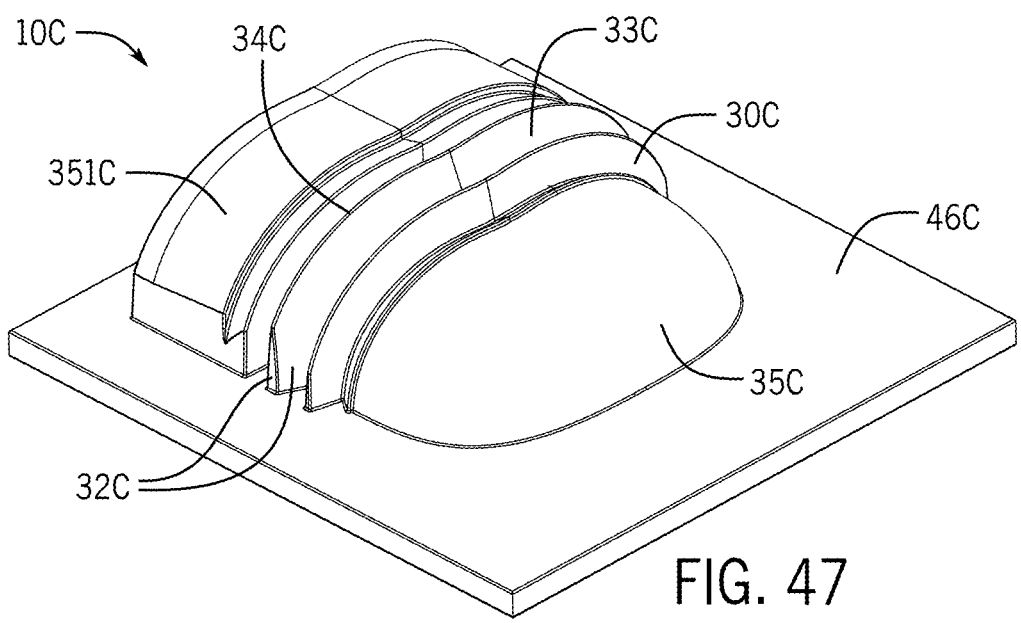
FIG. 47 is an enlarged opaque perspective view from a light-output side of another embodiment of the inventive lens.

FIGS. 42-45 show lens 10B which can be viewed in comparison of the Fresnel-like surfaces in some aspects of the inventive lens with more traditional geometric surfaces (such as parabolas) of lens 10P shown in FIGS. 24-28. Lens 10B has been "collapsed" down to more 2-dimensional structures which occupy less volume. FIGS. 27, 28 and 45 present a simplified representation with ray-fan simulations showing similar light distributions achieved with a conventional geometric lens 10P and a thinner, low profile "collapsed" Hybrid lens 10B.

Another advantage of the present invention is simplified, reduced cost of fabrication. The incorporation of Fresnel-like surfaces can enable lenses with a maximum local thickness of less than 4 mm, and preferably less than 3 mm. This allows for simplified, less costly single-shot molding processes compared to lenses with thicker regions that are subject to slumping and shrinkage, thus requiring multiple molding steps or shots to build up the structure to the final desired dimensions while maintaining surface fidelity and tolerance. This is particularly beneficial in cases where larger LED components (~>3 mm) are used, as overall lens dimensions typically scale with source size.

Figure 22:
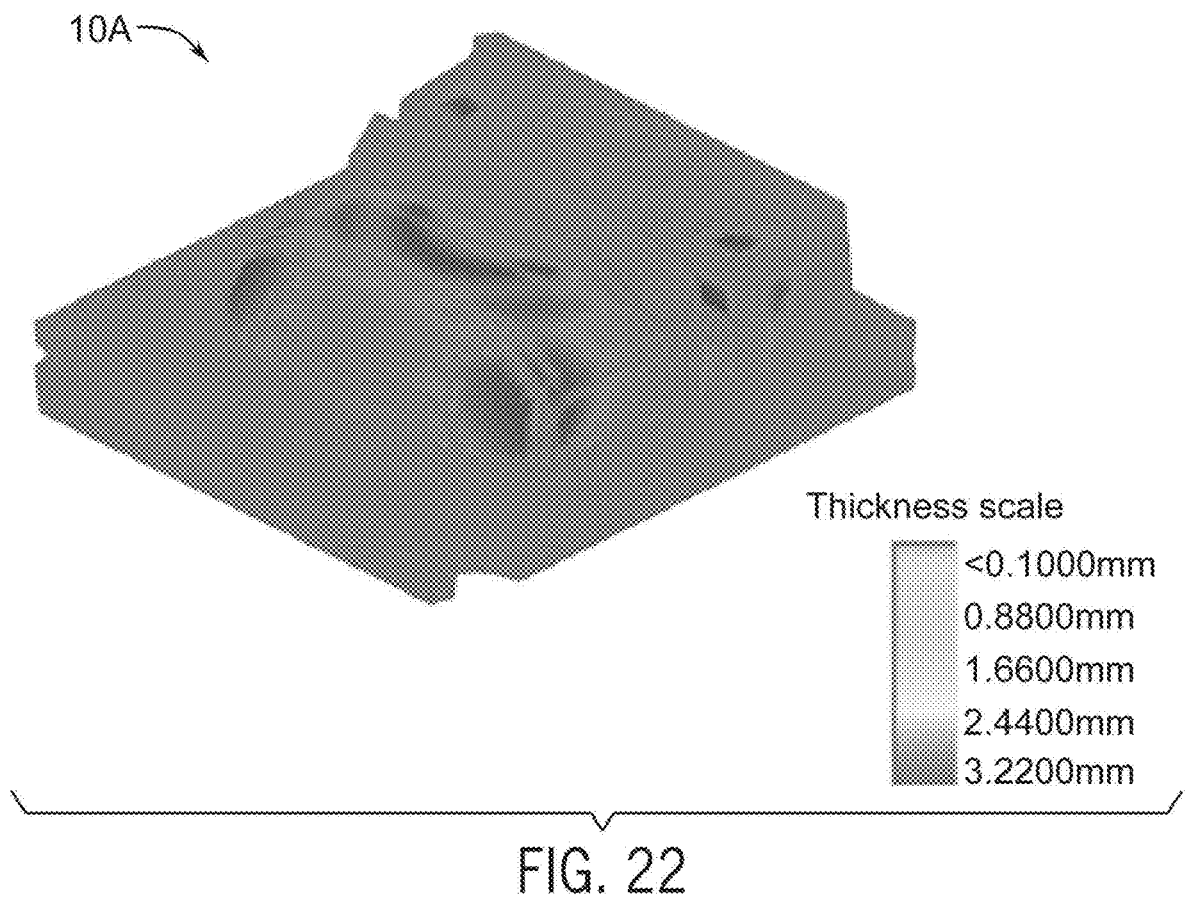
FIG. 22 is a light-output side perspective view illustrating thickness analysis of the lens of FIG. 1.

FIGS. 21, 22, 24 and 25 illustrate a comparison between a conventional geometric streetlight lens 10P (shown in FIGS. 24-37) and the inventive lens 10A incorporating the invention, with associated thickness analysis seen in FIGS. 22 and 25 with the lightest regions being higher thickness. White regions in FIG. 25 represent local thickness in excess of 4 mm.

Another advantage of the present invention is an improved optical performance. The incorporation of additional, simplified control surfaces (e.g., collapsing a parabolic surface into a series of linear facets-transverse regions forming stepwise discontinuities) facilitates simplifying of the lens-design process by allowing optimization of each sequential and separate lens surface. This leads to improved lens designs with better optical efficiency and more control over illuminance distributions resulting in improved performance in the final application.

Still another advantage of the present invention is an improved color uniformity. Many LED light sources/components do not have uniform color emission over all angles. For example, many LED components emit significantly yellower light at high angles. This can cause undesirable color artifacts (e.g., yellowish streaks or striations visible on illuminated surfaces such as roadways). The combination of faceted surfaces with smooth surfaces facilitates improved control and mixing of light emitted at various angles (with corresponding color variances).

Yet another advantage of the present invention is a near-field glare reduction. Faceted Fresnel-like surfaces of the stepwise discontinuities facilitate the effect of spreading out light emitted from a small source such as an LED component so as to make it appear that the light is coming from a larger area, leading to reduced near-field glare.

Figure 23:
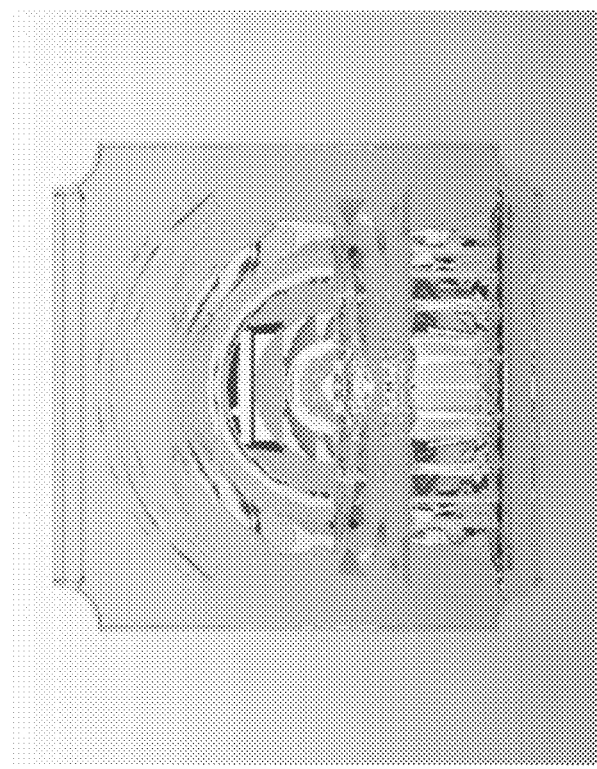
FIG. 23 is a simulated lit rendering or an illuminated near-field appearance of the lens shown in FIG. 1, representing areas that would appear lit or bright when viewing the lens directly to illustrate the lens spreading the light over a larger area, leading to reduced near-field glare.
Figure 24:
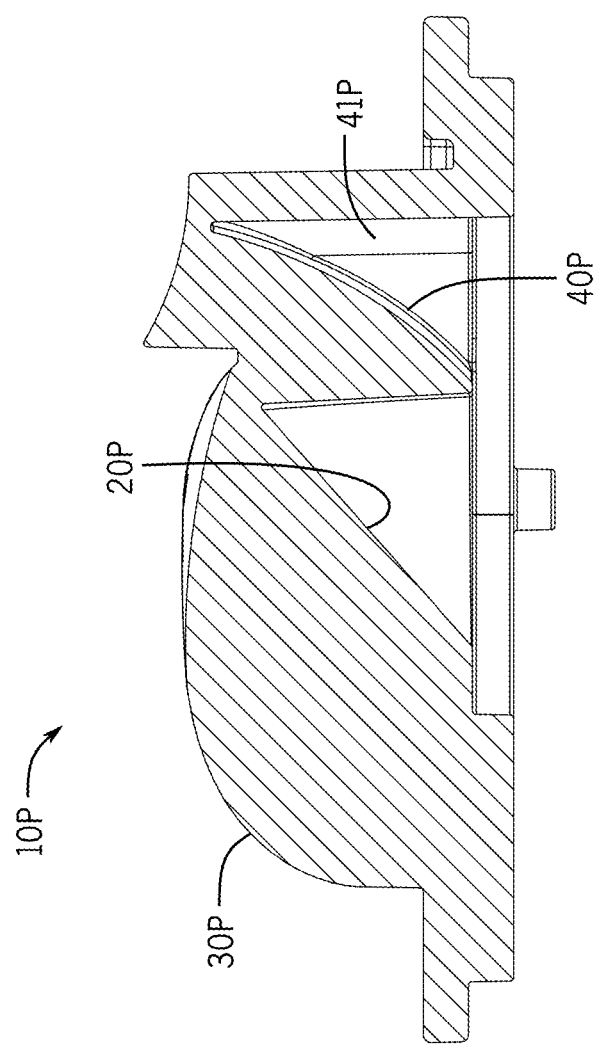
FIG. 24 is an enlarged opaque cross-sectional lateral side view of a prior lens not utilizing stepwise discontinuities of the surfaces of the inventive lens.

FIGS. 23 and 26 illustrate simulated renderings of inventive lens 10A (shown in FIG. 23) and prior lens 10P (shown in FIG. 26) comparing the lit or illuminated near-field appearance of prior lens 10P and inventive hybrid lens 10A described earlier in this disclosure. The lighter regions represent areas that would appear lit or bright when viewing the lens directly. The inventive hybrid lens 10A spreads the light over a larger area, leading to reduced near-field glare.

In certain instances of the present invention, the faceted surface may be a unique addition of one or more facets to an existing smooth surface with the intent of, for example, directing light to a specific direction, improving illuminance uniformity, or mixing light rays emitted by the LED source at different angles to reduce color artifacts due to inherent color-angle-non-uniformity of some sources. Each individual facet (also referred herein as a surface of one of a plurality of transverse regions) may serve to redirect light using primarily TIR or refraction. In some cases, the facet may be designed to intentionally utilize both TIR and refraction, depending on the angle of incidence of the incoming light rays.

FIG. 77 illustrates an example of an addition of a single facet of outer surface 30D formed by two transverse outer regions 325 extending at smooth outer region 35D substantially orthogonally to plane 16 of bilateral symmetry of lens 10D. FIG. 77 also shows that optical coupling of lens 10D is such that one of two TIR surfaces 40D is disposed closer to emitter axis 14 than the opposite TIR surface 40. The single facet 325 is proximal to that TIR surface 40 which is farther from emitter axis 14.

Figure 103:
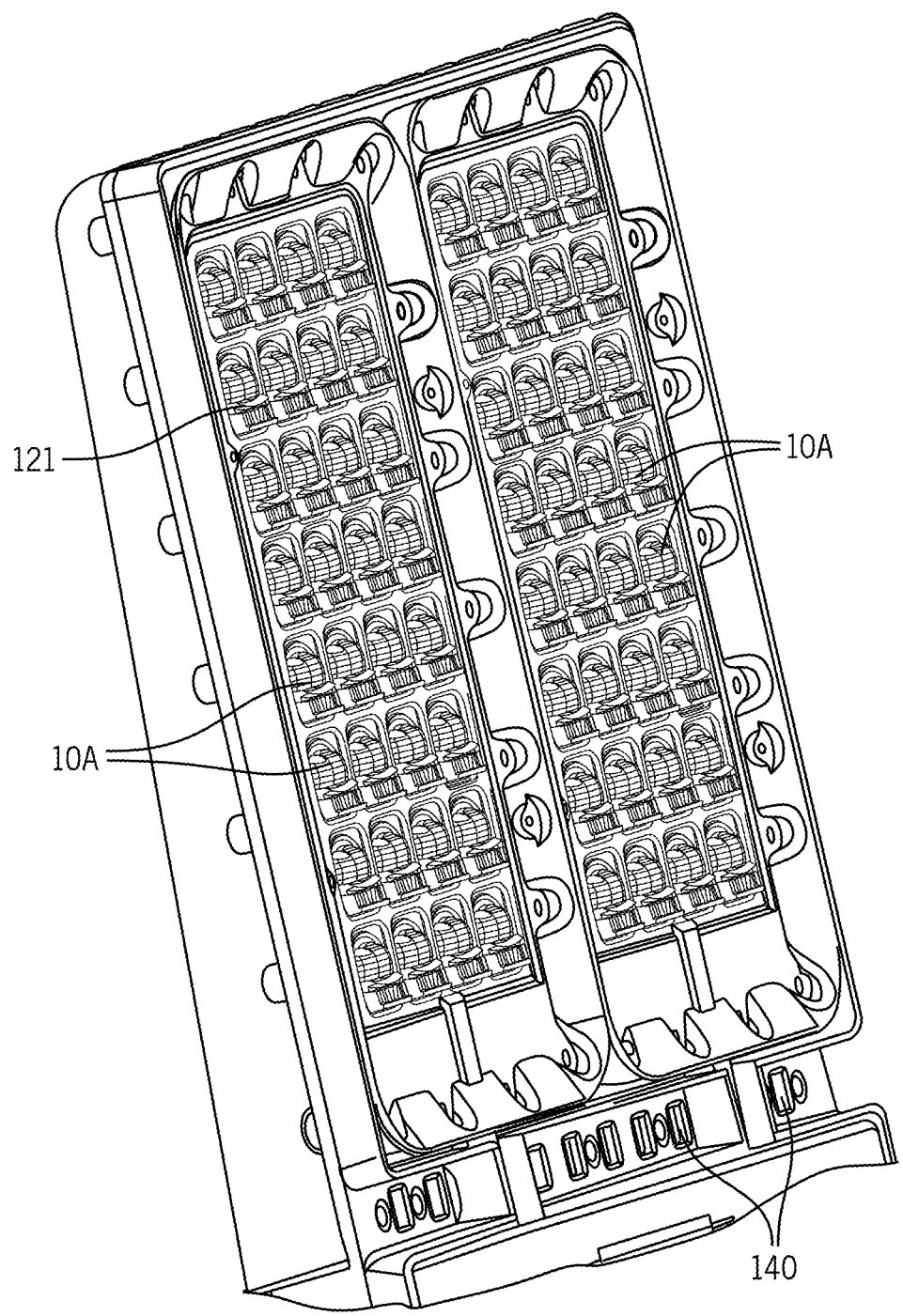
FIG. 103 is a fragment of FIG. 102 showing an LED arrangement at a greater scale.
Figure 104:
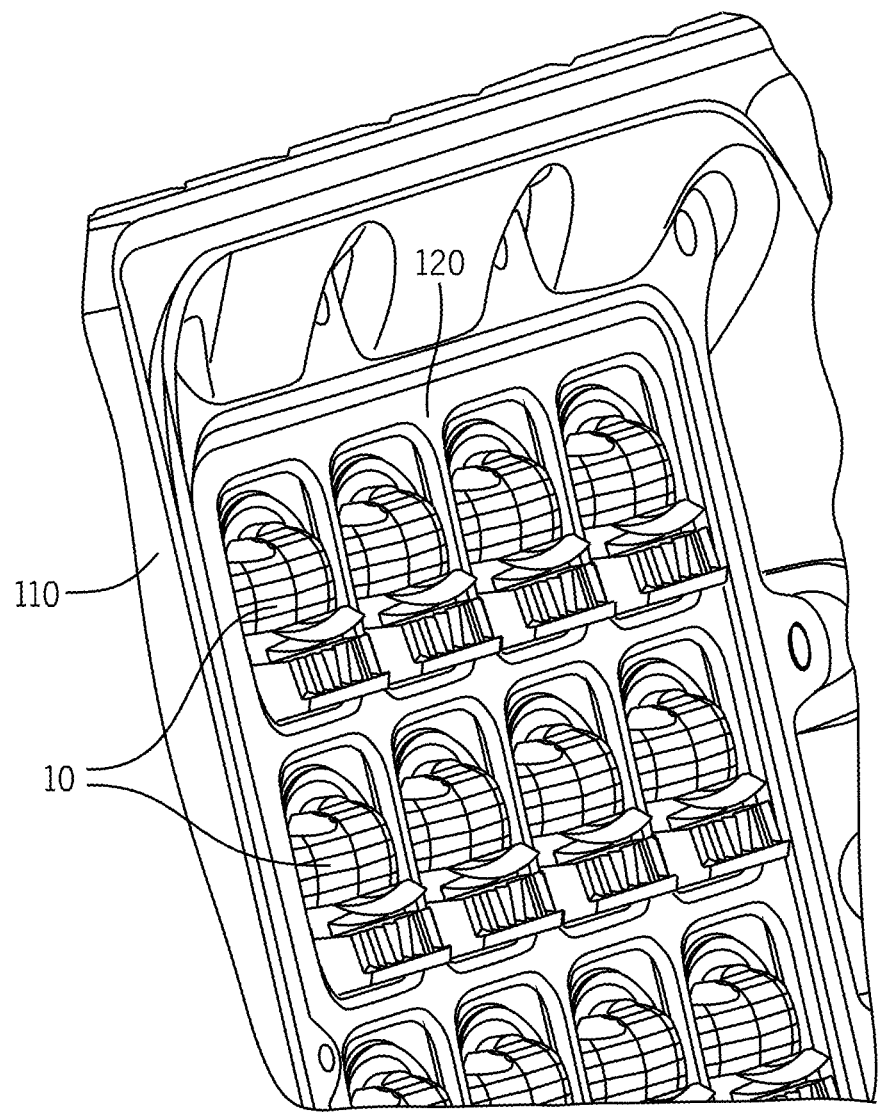
FIG. 104 is a fragment of the LED arrangement of FIG. 103 at a greater scale.
Figure 105:
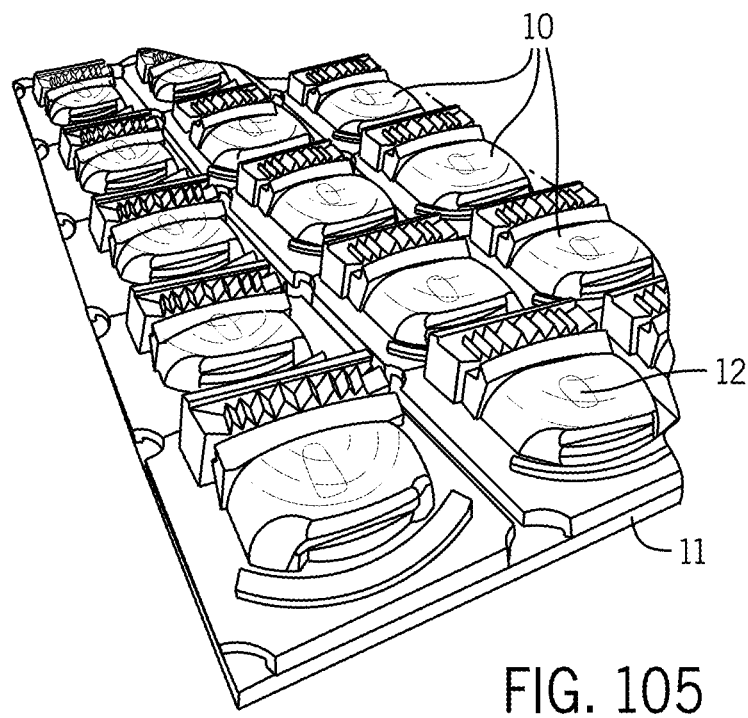
FIG. 105 is a fragmentary perspective view showing a plurality of inventive lenses each optically coupled with a corresponding one of LED light sources supported on a circuit board.
Figure 106:
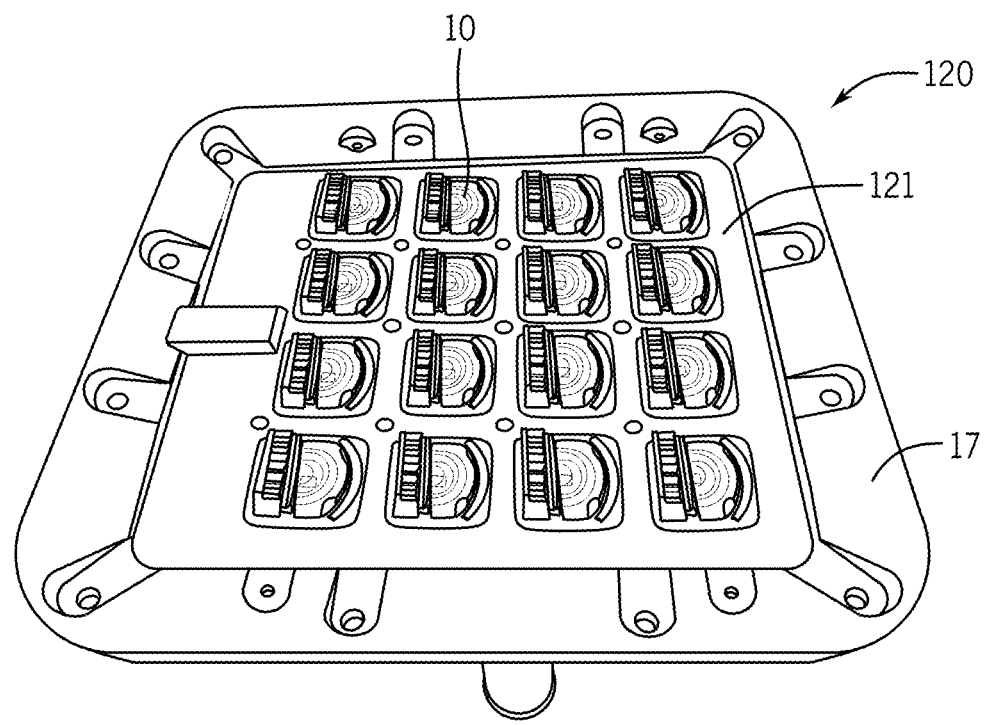
FIG. 106 is a perspective view from a light-output side of an exemplary LED-array module.

FIGS. 102-108 show examples of LED light fixtures 100A and 100B, each of which has a heat-sink structure 110 having a mounting surface 111 supporting an LED arrangement 120. FIGS. 105 and 106 best illustrate an exemplary LED arrangement 120 having an LED-array module 121 which has a plurality of lenses 10 each optically coupled to an LED light source 12 supported on a circuit board 11. In the illustrated embodiments, LED arrangement 120 also has a frame member 17 securing lenses 10 according to the present invention with respect to circuit board 11 and the corresponding light emitters 12.

Figure 102:
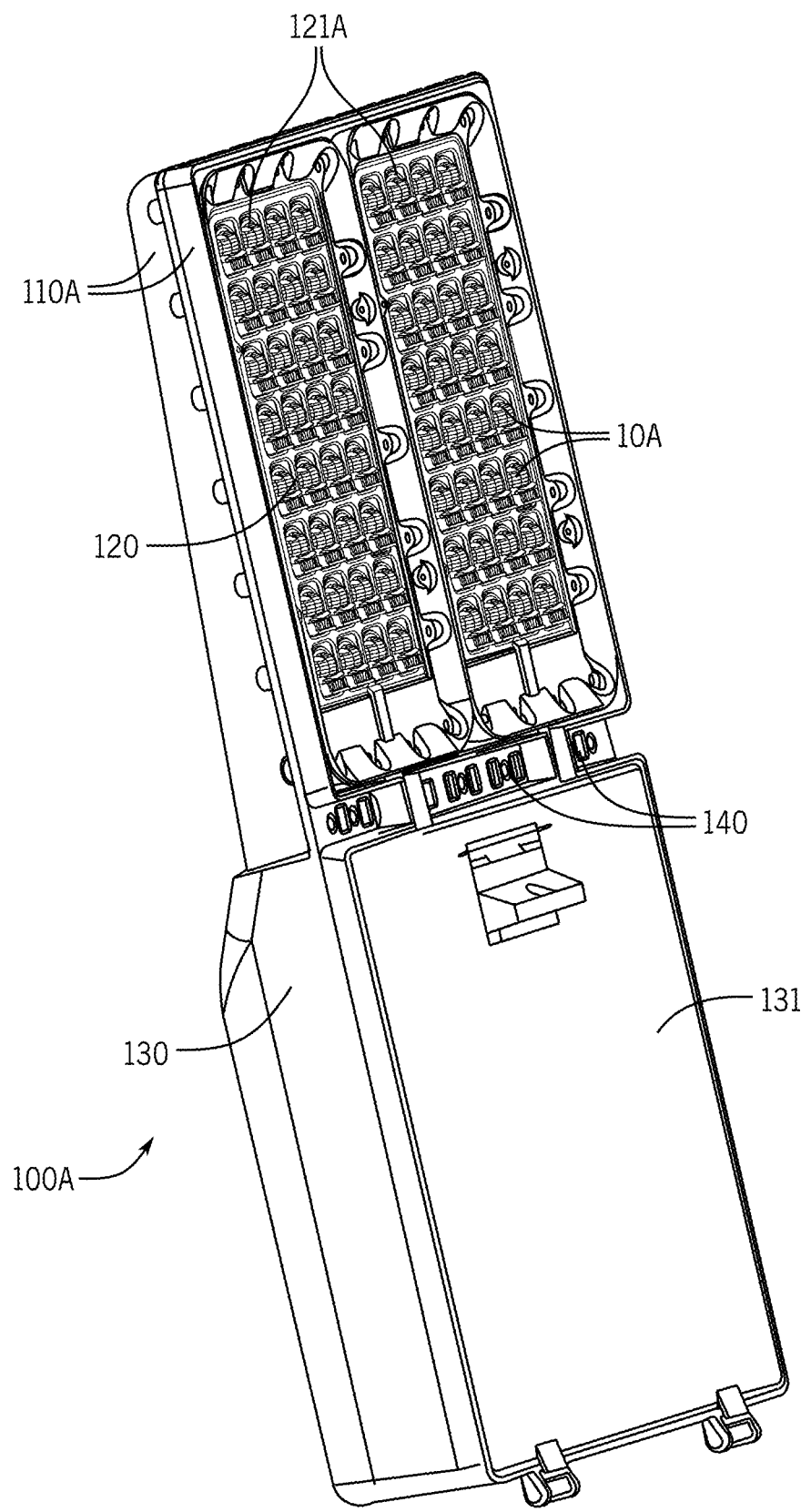
FIG. 102 is a perspective view from a light-output side of an example of a light fixture utilizing a pair of LED-array modules each having a plurality of lenses of the type shown in FIG. 1.
Figure 107:
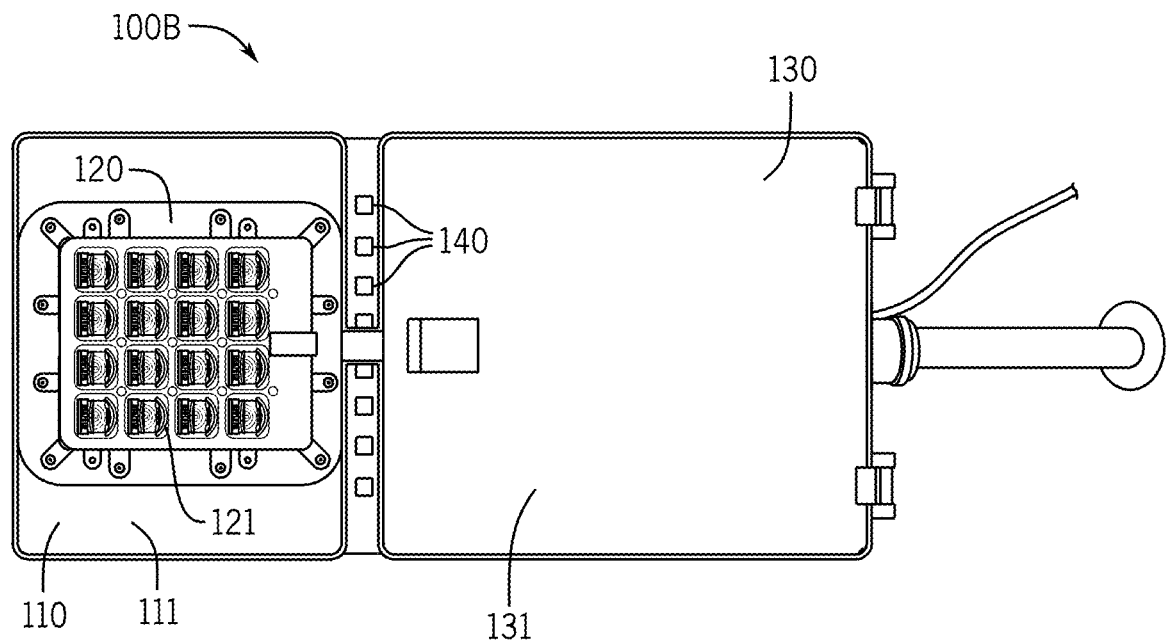
FIG. 107 is a plan view from a light-output side of an example of a light fixture utilizing the LED-array module of the type shown in FIG. 106.
Figure 108:
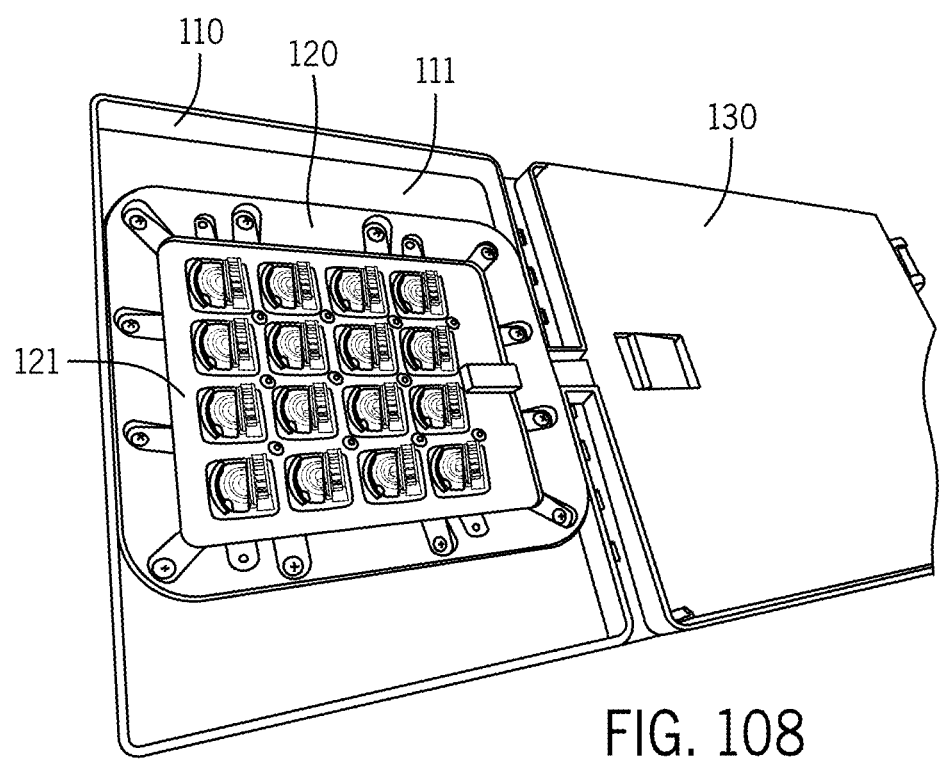
FIG. 108 is a fragmentary perspective view from a light-output side of the light fixture of FIG. 107.

FIGS. 102-104 show an exemplary light fixture 100A utilizing two LED-array modules 121A supported on heat sink 110A. FIGS. 107 and 108 show an exemplary light fixture 100B utilizing one LED-array module 121B supported on heat sink 110A. Heat sink 110 is shown extending from a housing portion 130 which forms a closed chamber 131. Fixture 100 is shown to have venting apertures 140 permitting air and water flow through the fixture for convection cooling of heat-dissipating regions of heat-sink 110 which conducts heat away from mounting surface 111 receiving heat from circuit board 11 during operation of LED arrangement 120.

FIGS. 112-117 show the light emitter in the form of an LED package 230 which has a primary lens 240 over the at least one LED 220. In such embodiments, the inventive lens is a secondary lens placed over primary lens 240. The light emitter may be of the type illustrated in FIGS. 114-116 which show LED package 230D with single LED 220 on a submount 260 and hemispheric primary lens 240D coaxially overmolded on submount 260 over LED 220.

Figure 112:
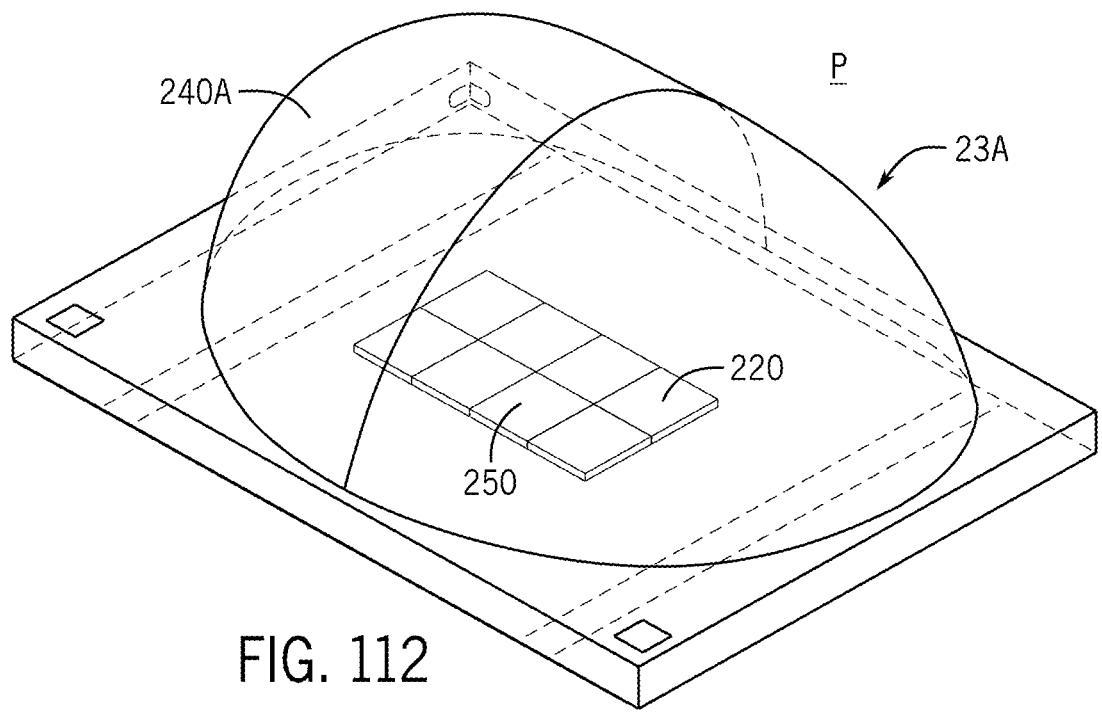
FIG. 112 is an enlarged perspective view of one example of an LED package and including an array of eight LEDs on a submount and an asymmetric primary lens overmolded over the LED array.
Figure 113:
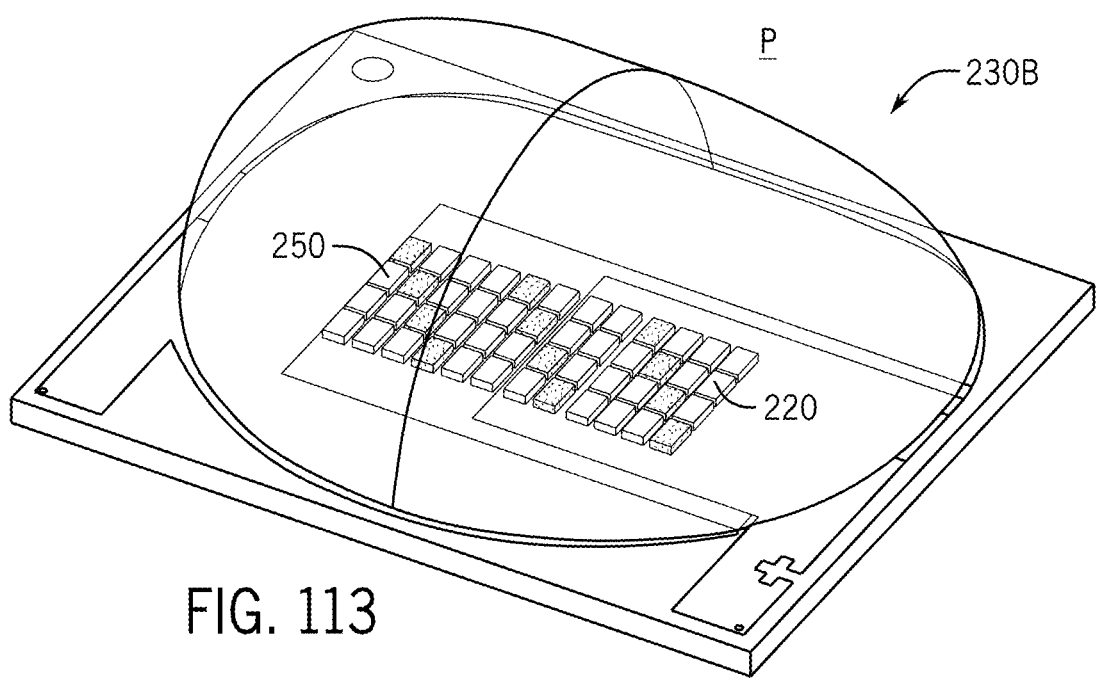
FIG. 113 is an enlarged perspective view of another example of an LED package and including an array of forty-eight LEDs on a submount and an asymmetric primary lens overmolded over the LED array.
Figure 114:
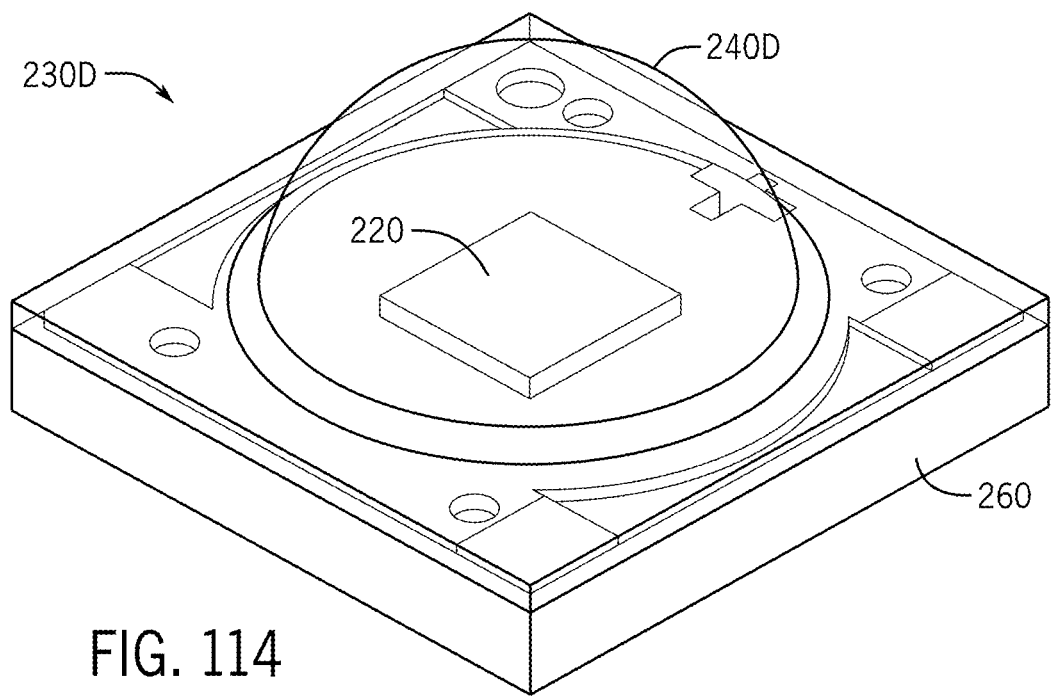
FIG. 114 is an enlarged perspective view of yet another example of an LED package which has a single LED on a submount with a hemispheric primary lens overmolded over the LED.
Figure 115:
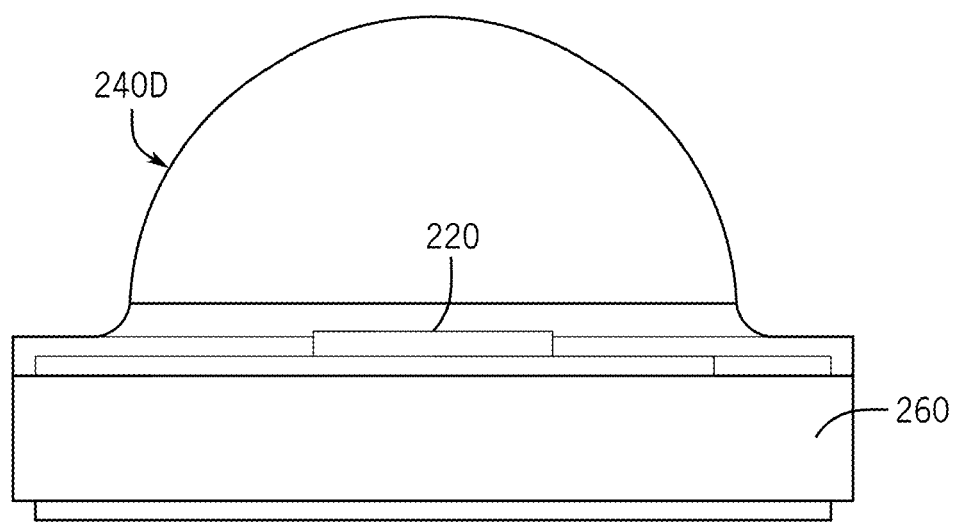
FIG. 115 is an enlarged side view of the LED package of FIG. 114.
Figure 116:
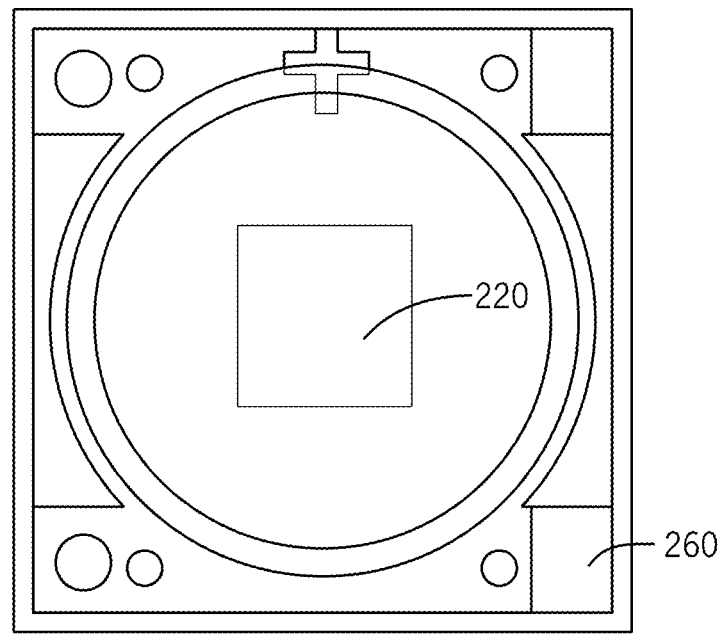
FIG. 116 is an enlarged top view of the LED package of FIG. 114.

FIGS. 112 and 113 illustrate exemplary LED packages 230A and 230B each including an array of LEDs 220 on an LED-populated area 250 which has an aspect ratio greater than 1, and primary lens 240 being overmolded on a submount 260 over LED-populated area 250. It is seen in FIG. 113 that the array may include LEDs 220 emitting different-wavelength light of different colors such as including red LEDs along with light green or other colors to achieve natural white light. Light emitters of the type as LED packages 230A and 230B are described in detail in application Ser. No. 13/441,558, filed on Apr. 6, 2012, and in application Ser. No. 13/441,620, filed on Apr. 6, 2012. The contents of both applications are incorporated herein by reference in their entirety.

Figure 117:
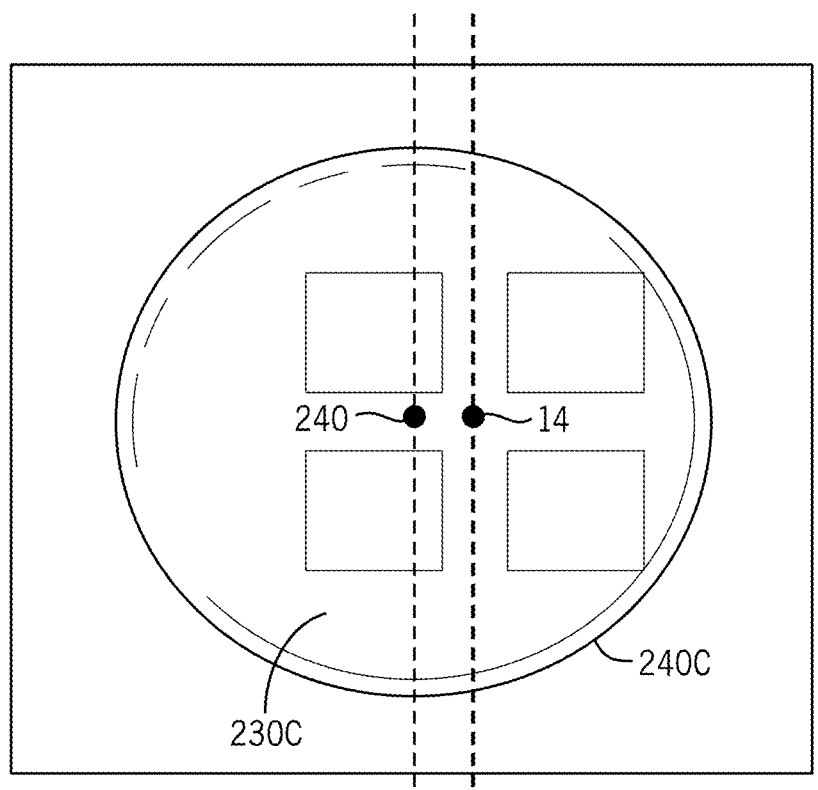
FIG. 117 is an enlarged top view of another exemplary LED package including an array of four LEDs on a submount and a hemispheric primary lens overmolded over the LED array such that the axis of the primary lens is offset from the axis of the LED array.

FIGS. 112, 113 and 117 illustrate versions of the LED light emitter configured to refract LED-emitted light in a forward direction (i.e., toward preferential side P). In each LED package 230A, 230B and 230C, each LED array defines an emitter axis. FIGS. 112 and 113 illustrate primary lens 240A configured to refract LED-emitted light forward. FIG. 117 shows hemispheric primary lens 240C having a centerline 240 offset from the emitter axis 14. It should be understood that for higher efficiency, the LED emitter may have a primary lens having both its centerline offset from the emitter axis and also being shaped for refraction of LED-emitted light toward preferential side P. In FIGS. 112 and 113, primary lens 240A is shown as asymmetric.

Lenses described herein can assist in providing Type II, Type III or Type V lighting distributions from luminaires. Accordingly, luminaires comprising lenses according to the present invention can be used in a variety of outdoor lighting applications including, but not limited to, sidewalk lighting as well as roadway and parking lot lighting. Luminaires comprising lenses according to the present invention described herein can also be employed in several indoor lighting applications. For example, luminaires can provide illumination to narrow spaces, such as aisles, hallways and/or corners of a building or house. Indoor applications also include wall washing. An asymmetric lighting distribution provided by a luminaire can illuminate surfaces of one or more walls. In some embodiments, for example, multiple walls illuminated by the luminaire intersect to form a corner. In other embodiments, multiple walls face one another such as in a hallway or corridor. In some embodiments, light fixtures are mounted on the ceiling or recessed into the ceiling for wall illumination. Alternatively, the light fixtures can be mounted on the floor or recessed into the floor for wall illumination according to methods described herein.

As described herein, high angle or lateral lighting distributions can be provided by luminaires comprising lenses described herein. The lighting distributions can be asymmetric or symmetric in nature. In some embodiments, lighting distributions provided by luminaires comprising optic assemblies have peak intensity at angles greater than 30 degrees relative to the nadir. Peak intensity of a lighting distribution provided by light fixtures described herein can also have one or more values selected from Table II.

TABLE II

Peak Intensity of Lateral Lighting Distribution Relative to Nadir

≥40
≥50
≥60
≥70
≥80
30-85
40-85
50-70
50-85
60-85

Luminaires can also comprise light redirection optics in addition to or in place of optic assemblies. Luminaires, for example, can comprise light redirection optics comprising total internal reflection facets of Fresnel architecture as well as refractive surfaces, including those illustrated in the figures. Light redirection optics can also have any design to provide lighting distributions similar to or the same as lenses described herein.

LED light sources may comprise packaged LED chip(s) or unpackaged LED chip(s). LED elements or modules can use LEDs of the same or different types and/or configurations. The LEDs, for example, can be monochromatic or any desired color combination. The LEDs can comprise single or multiple phosphor-converted white and/or color LEDs, and/or bare LED chip(s) mounted separately or together on a single substrate or package that comprises, for example, at least one phosphor-coated LED chip either alone or in combination with at least one color LED chip, such as a green LED, a yellow LED, a red LED, etc. The LED module can comprise phosphor-converted white or color LED chips and/or bare LED chips of the same or different colors mounted directly on a printed circuit board (e.g., chip on board) and/or packaged phosphor-converted white or color LEDs mounted on the printed circuit board, such as a metal core printed circuit board or FR4 board.

In some embodiments, the LEDs can be mounted directly to a heat sink or another type of board or substrate. Depending on the embodiment, LED arrangements or lighting arrangements using remote phosphor technology can be employed as would be understood by one of ordinary skill in the art, and examples of remote phosphor technology are described in U.S. Pat. No. 7,614,759, assigned to the assignee of the present invention and hereby incorporated by reference.

In those cases where a soft white illumination with improved color rendering is to be produced, each LED element or module or a plurality of such elements or modules may include one or more blue shifted yellow LEDs and one or more red or red/orange LEDs as described in U.S. Pat. No. 7,213,940, assigned to the assignee of the present invention and hereby incorporated by reference. The LEDs may be disposed in different configurations and/or layouts along one or more edges of the waveguide body, as desired. Different color temperatures and appearances could be produced using other LED combinations of single and/or multiple LED chips packaged into discrete packages and/or directly mounted to a printed circuit board as a chip-on board arrangement.

In one embodiment, the light sources can comprise any LED, for example, an XP-Q LED incorporating TrueWhite® LED technology or as disclosed in U.S. patent application Ser. No. 13/649,067, filed Oct. 10, 2012, now U.S. Pat. No. 9,818,919, issued Nov. 14, 2017, entitled "LED Package with Multiple Element Light Source and Encapsulant Having Planar Surfaces" by Lowes et al., the disclosure of which is hereby incorporated by reference herein, as developed and manufactured by Cree, Inc., the assignee of the present application. In another embodiment, the light sources can comprise XQ-E LEDs developed by Cree, Inc.

Any of the embodiments disclosed herein incorporating LED light sources may include power or driver circuitry having a buck regulator, a boost regulator, a buck-boost regulator, a fly-back converter, a SEPIC power supply or the like and/or multiple stage power converter employing the like, and may comprise a driver circuit as disclosed in U.S. patent application Ser. No. 14/291,829, filed May 30, 2014, entitled "High Efficiency Driver Circuit with Fast Response" by Hu et al., now U.S. Pat. No. 9,791,110, issued Oct. 17, 2017, or U.S. patent application Ser. No. 14/292,001, filed May 30, 2014, now U.S. Pat. No. 9,303,823, issued Apr. 5, 2016, entitled "SEPIC Driver Circuit with Low Input Current Ripple" by Hu et al. The circuit may further be used with light control circuitry that controls color temperature of any of the embodiments disclosed herein, such as disclosed in U.S. patent application Ser. No. 14/292,286, filed May 30, 2014, now U.S. Pat. No. 10,278,250, issued Apr. 30, 2019, entitled "Lighting Fixture Providing Variable CCT" by Pope et al. The contents of each of application Ser. Nos. 13/649,067, 14/291,829, 14/292,286 and 14/292,001 are incorporated herein by reference in their entirety.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

While the principles of the invention have been shown and described in connection with specific embodiments, it is to be understood that such embodiments are by way of example and are not limiting.

The invention claimed is:

1. A lens for distribution of light from a light emitter having an emitter axis, the lens comprising an output surface, the output surface comprising:
   a faceted output region offset from the emitter axis and intersecting a plane of bilateral symmetry of the lens, the faceted output region comprising a plurality of pairs of substantially planar outer surface regions extending away from the light emitter along intersecting planes toward a line of intersection that is substantially parallel to the plane of bilateral symmetry; and
   a smooth region intersecting the emitter axis.

2. The lens of claim 1, further comprising another faceted output region that:
   is more outwardly offset from the emitter axis than the faceted output region;
   intersects the plane of bilateral symmetry of the lens; and
   comprises a plurality of smaller pairs of substantially planar outer surface regions relative to the pairs of outer surface regions of the faceted output region, the outer surface regions of the smaller pairs extending away from the light emitter along intersecting planes toward a line of intersection substantially parallel to the plane of bilateral symmetry.

3. The lens of claim 1, wherein the outer surfaces of each pair extend to substantially parallel intersection regions therebetween, at least some of the intersection regions being substantially parallel to the plane of bilateral symmetry of the lens.

4. The lens of claim 1 further comprising an inner surface defining an inner cavity about the emitter axis, the inner surface comprising inner-surface stepwise discontinuities formed by a plurality of pairs of transverse inner regions with intersection regions therebetween.

5. The lens of claim 4 wherein at least some of the transverse inner regions are configured for total internal reflection (TIR) of the light received from the emitter.

6. The lens of claim 4 wherein the inner stepwise discontinuities comprise:
   longitudinally substantially straight intersection regions each adjoining a pair of the substantially planar inner regions; and
   intersection regions extending along a curve between adjacent transverse curved inner regions.

7. The lens of claim 4 wherein the transverse inner regions proximal the emitter axis have smaller cross-sectional dimensions than the transverse inner regions distal from the light emitter.

8. The lens of claim 4, further comprising a secondary surface offset from the inner surface, the secondary surface being configured for total internal reflection (TIR) of light received from the inner surface.

9. The lens of claim 8, wherein at least some of the pairs of outer surface regions are optically aligned over the secondary surface.

10. The lens of claim 8 wherein the at least one secondary surface at least partially bounds a secondary cavity offset from the inner cavity.

11. A lens for distribution of light from a light emitter having an emitter axis, the lens comprising:
    an inner surface defining an inner cavity about the emitter axis, the inner surface comprising inner-surface stepwise discontinuities formed by a plurality of pairs of transverse inner regions with intersection regions therebetween; and
    at least two secondary surface portions spaced apart and extending along two sides of the inner surface, the secondary surface portions being configured for total internal reflection (TIR) of light received from the inner surface.

12. The lens of claim 11 wherein the secondary surface portions are separate surfaces substantially opposite each other.

13. The lens of claim 11 further comprising an outer surface including:
    outer stepwise discontinuities formed by a plurality of transverse outer regions; and
    at least one smooth output region.

14. The lens of claim 13 wherein at least one of the outer stepwise discontinuities is formed by a plurality of pairs of transverse outer regions extending in direction of a plane of bilateral symmetry of the lens.

15. The lens of claim 13 wherein the at least one smooth outer region is between a pair of outer-surface stepwise discontinuities.

16. The lens of claim 13 wherein at least two of the distinct outer stepwise discontinuities are optically aligned over each of the at least two of the secondary surface portions.

17. A light emitting diode (LED) light fixture comprising:
    an LED arrangement comprising a plurality of spaced apart light sources and a plurality of lenses optically coupled with corresponding light sources, each of the lenses comprising an output surface comprising:
  a faceted output region offset from an emitter axis of the corresponding light source and intersecting a plane of bilateral symmetry of the lens, the faceted output region comprising a plurality of pairs of substantially planar outer surface regions extending away from the corresponding light source along intersecting planes toward a line of intersection that is substantially parallel to the plane of bilateral symmetry; and
  a smooth region intersecting the emitter axis.

18. The LED light fixture of claim 17, wherein the pairs of outer surface regions extend to substantially straight intersection regions substantially parallel to each other.

19. The LED light fixture of claim 17, wherein each lens further comprises an inner light-input surface defining an inner cavity about the emitter axis of the corresponding light source, the inner surface comprising at least two distinct inner-surface stepwise discontinuities, one formed by a plurality of pairs of transverse inner regions having substantially curved projections on planes orthogonal to the emitter axis and the other formed by a substantially linear row of plurality of pairs of transverse inner regions having substantially straight projections on planes orthogonal to the emitter axis of the corresponding light source.

20. The LED light fixture of claim 19, wherein each lens further comprises at least one secondary surface offset from the inner surface, the at least one secondary surface being configured for total internal reflection (TIR) of light received from the inner surface and comprising a plurality of transverse reflecting regions forming reflecting stepwise discontinuities.

* * * * *